(12) United States Patent
Tsuruma et al.

(10) Patent No.: US 11,018,238 B2
(45) Date of Patent: May 25, 2021

(54) STRUCTURE, METHOD FOR MANUFACTURING SAME, SEMICONDUCTOR ELEMENT, AND ELECTRONIC CIRCUIT

(71) Applicant: Idemitsu Kosan Co., Ltd., Tokyo (JP)

(72) Inventors: Yuki Tsuruma, Sodegaura (JP); Emi Kawashima, Sodegaura (JP); Yoshikazu Nagasaki, Sodegaura (JP); Takashi Sekiya, Sodegaura (JP); Yoshihiro Ueoka, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 16/341,055

(22) PCT Filed: Oct. 11, 2017

(86) PCT No.: PCT/JP2017/036802
§ 371 (c)(1),
(2) Date: Apr. 10, 2019

(87) PCT Pub. No.: WO2018/070417
PCT Pub. Date: Apr. 19, 2018

(65) Prior Publication Data
US 2019/0237556 A1     Aug. 1, 2019

(30) Foreign Application Priority Data

Oct. 11, 2016    (JP) .............................. JP2016-200448

(51) Int. Cl.
   *H01L 29/47*      (2006.01)
   *H01L 29/78*      (2006.01)
   (Continued)

(52) U.S. Cl.
CPC ............ *H01L 29/47* (2013.01); *H01L 27/146* (2013.01); *H01L 29/24* (2013.01); *H01L 29/247* (2013.01);
(Continued)

(58) Field of Classification Search
CPC ....... H01L 29/47; H01L 27/148; H01L 29/78; H01L 31/108; H01L 29/872; H01L 29/24; H01L 31/07; H01L 29/786; H01L 29/247
(Continued)

(56) References Cited

U.S. PATENT DOCUMENTS

2010/0127255 A1*   5/2010   Allen et al. ............. H01L 29/22
                                                                                                                                            257/43
2015/0028282 A1*   1/2015   Hirose et al. ........... H01L 45/08
                                                                                                                                            257/4
(Continued)

FOREIGN PATENT DOCUMENTS

JP        2010-527512 A     8/2010
WO    WO-2008/143526 A1   11/2008
(Continued)

OTHER PUBLICATIONS

Chasin et al., "High-performance a-In—Ga—Zn—O Schottky diode with oxygen-treated metal contacts", Applied Physics Letters, vol. 101 No. 11, published Sep. 10, 2012, pp. 113505-1-113505-5.
(Continued)

*Primary Examiner* — Thinh T Nguyen
(74) *Attorney, Agent, or Firm* — Foley & Lardner LLP

(57) ABSTRACT

A structure including a metal oxide semiconductor layer and a noble metal oxide layer, wherein the metal oxide semiconductor layer and the noble metal oxide layer are adjacent to each other, and a film thickness of the noble metal oxide layer is more than 10 nm.

31 Claims, 20 Drawing Sheets

(51) Int. Cl.
| | |
|---|---|
| H01L 27/146 | (2006.01) |
| H01L 31/108 | (2006.01) |
| H01L 29/872 | (2006.01) |
| H01L 31/07 | (2012.01) |
| H01L 29/812 | (2006.01) |
| H01L 31/10 | (2006.01) |
| H01L 29/24 | (2006.01) |
| H01L 29/786 | (2006.01) |

(52) U.S. Cl.
CPC ............ *H01L 29/78* (2013.01); *H01L 29/786* (2013.01); *H01L 29/812* (2013.01); *H01L 29/872* (2013.01); *H01L 31/07* (2013.01); *H01L 31/10* (2013.01); *H01L 31/108* (2013.01); *Y02E 10/50* (2013.01)

(58) Field of Classification Search
USPC .............. 257/54, 73, 155; 438/48, 170, 570
See application file for complete search history.

(56) References Cited

U.S. PATENT DOCUMENTS

| | | |
|---|---|---|
| 2016/0197202 A1 | 7/2016 | Tomai et al. |
| 2016/0211386 A1* | 7/2016 | Tomai et al. ......... H01L 29/872 |
| 2017/0263786 A1 | 9/2017 | Tomai et al. |

FOREIGN PATENT DOCUMENTS

| | | |
|---|---|---|
| WO | WO-2013/125421 A1 | 8/2013 |
| WO | WO-2015/025499 A1 | 2/2015 |
| WO | WO-2015/025500 A1 | 2/2015 |

OTHER PUBLICATIONS

International Search Report issued in Appl. Ser. No. PCT/JP2017/036802, dated Dec. 8, 2017.

Lajn et al., "Comparative study of transparent rectifying contacts on semiconducting oxide single crystals and amorphous thin films", Journal of Applied Physics, vol. 113 No. 4, published Jan. 28, 2013, pp. 044511-1-044511-13.

Lee et al., "Diffusion-Limited a-IGZO/Pt Schottky Junction Fabricated at 200° C on a Flexible Substrate", IEEE Electron Device Letters, vol. 32 No. 12, published Dec. 2011, pp. 1695-1697.

Translation of Written Opinion of the International Searching Authority issued in Appl. Ser. No. PCT/JP2017/036802, dated Apr. 25, 2019.

Zhang et al., "High performance Schottky diodes based on indium-gallium-zinc-oxide", Journal of Vacuum Science & Technology A, vol. 34 No. 4, published Jul./Aug. 2016, pp. 04C101-1-04C101-4.

* cited by examiner

STRUCTURE, METHOD FOR MANUFACTURING SAME, SEMICONDUCTOR ELEMENT, AND ELECTRONIC CIRCUIT

CROSS-REFERENCE TO RELATED APPLICATIONS

The present application is a U.S. national stage application claiming the benefit of International Patent Application No. PCT/JP2017/036802, filed Oct. 11, 2017, which claims the benefit of priority to Japanese Patent Application No. 2016-200448, filed Oct. 11, 2016, the disclosures of which are hereby incorporated by reference.

TECHNICAL FIELD

The invention relates to a structure, a method for manufacturing the same, a semiconductor element, and an electronic circuit.

BACKGROUND ART

Schottky junction ordinarily means junction resulting from a metal-semiconductor interface exhibiting rectification. The rectification is an effect for easily flowing a current from the metal to the semiconductor or from the semiconductor to the metal, in one direction, and the present effect results from a change in a depletion layer extending from the metal-semiconductor interface to a side of the semiconductor in the Schottky junction. The metal and the semiconductor are generally categorized by presence or absence of spreading of the depletion layer in many cases, and therefore if contact between different materials is caused, in which the change in spreading of the depletion layer is observed in only a material on one side, such a phenomenon is generally understood that the Schottky junction occurs. Here, a device using practically applied Schottky junction has been limited to the material mainly using a single crystal semiconductor. Further, according to control of barrier (Schottky barrier) in the Schottky junction, it has been difficult to produce a uniform product even by using the single crystal semiconductor such as silicon in which establishment of technology has advanced. In addition thereto, it is also difficult to control device characteristics using the barrier, and therefore a significant amount of labor has been required every time when such a device is developed. Therefore, the device using the Schottky junction is limited to a Schottky barrier diode or the like, and a further easily controllable field-effect type device has developed, in which the device uses an insulating film-semiconductor interface formed by incorporating the insulating film of $SiO_2$ or the like between the metal and the semiconductor.

On the other hand, in addition to the single crystal semiconductor, a thin film semiconductor is cited, and amorphous silicon, polycrystalline silicon, a metal oxide semiconductor, or an organic thin film semiconductor attracts attention. Here, while a great number of reports are provided on a thin film transistor (TFT) using a field-effect phenomenon for the thin film semiconductor, the Schottky junction has less examples of reports, as compared with the TFT, and may be reasonably referred to as having poor understanding. In a silicon-based thin film semiconductor, a pinning level caused in a Schottky interface has been hindrance in practical application. The pinning level has a problem also in the Schottky junction in the single crystal silicon, resulting in reducing a barrier height, in comparison with an assumed Schottky barrier height (determined by a work function of the metal, a Fermi level difference of the semiconductor, and an energy level at a semiconductor band edge). On the organic semiconductor, practical application of TFT is also restricted from its stability and process adaptability, and it has been difficult to consider application to the Schottky device. The metal oxide semiconductor is recognized as a preferable semiconductor as TFT for a display application, and has been expected to be developed in a further application by taking advantage of its process adaptability, electric properties, and stability.

However, the Schottky junction of the metal oxide semiconductor has a large number of problems, and has not been practically applied. An example of a report on the Schottky barrier diode as a basic element, using the Schottky junction will be described below.

Patent Document 1 describes that a Schottky barrier can be formed using a Schottky electrode of metal oxide for single crystal ZnO.

In Non-Patent Document 1, diode characteristics are evaluated on InGaZnO thin film, which is an amorphous metal oxide semiconductor, by using electron-beam deposited Pt for a Schottky electrode, and selecting $SiO_2$, polyimide, and polyethylene terephthalate as a substrate.

Non-Patent Document 2 describes that Pt, Au, or Pd is used as a Schottky electrode, an InGaZnO thin film is used as a semiconductor, a surface of the Schottky electrode on a glass substrate is subjected to UV-ozone treatment, and then a semiconductor film is formed.

Non-Patent Document 3 describes 10 nm-thick silver oxide formed by reactive sputtering is used as a Schottky electrode, whereby a Schottky barrier can be formed on bulk single crystal ZnO, a heteroepitaxial ZnO thin film, and an amorphous GaInZnO thin film.

In Non-Patent Document 4, Pt, which is a Schottky electrode, is formed on a $SiO_2$ substrate, and an InGaZnO semiconductor thin film and further an Al ohmic electrode are laminated on an upper portion of the substrate.

Patent Document 2 describes that a Si substrate is used as a support substrate and ohmic junction, a noble metal electrode is used in an upper part of a metal oxide semiconductor including In, irrespective of polycrystalline or amorphous, to obtain Schottky performance.

RELATED ART DOCUMENT

Patent Document

Patent Document 1: JP-T-2010-527512
Patent Document 2: WO2015/025499

Non-Patent Document

Non-Patent Document 1: IEEE Electron Device Letters, 32, 1695, 2011
Non-Patent Document 2: APPLIED PHYSICS LETTERS, 101, 113505, 2012
Non-Patent Document 3: Journal of APPLIED PHYSICS, 113, 044511, 2013
Non-Patent Document 4: Journal of Vacuum Science & Technology A, 34, 04C101, 2016

SUMMARY OF INVENTION

An objective of the invention is to provide a structure in which a Schottky barrier functions, characterized by having capability of forming a film at low temperature, excellent process adaptability, capability of freely selecting a substrate, and low reverse current characteristics, a method for manufacturing the structure, a semiconductor element, and an electronic circuit.

It has been difficult so far to manufacture Schottky junction having capability of forming a film at low temperature, excellent process adaptability, capability of freely selecting a substrate, and low reverse current characteristics.

The present inventors of the invention have diligently conducted research on the metal oxide semiconductor thin film in which control of the Schottky junction has been difficult, and as results, have found the Schottky junction having features of low reverse current characteristics, in which the Schottky barrier functions.

The invention provides the following structure and the like.

1. A structure, including:
a metal oxide semiconductor layer; and
a noble metal oxide layer,
wherein the metal oxide semiconductor layer and the noble metal oxide layer are adjacent to each other; and
a film thickness of the noble metal oxide layer is more than 10 nm.

2. The structure according to 1, having a depletion region.

3. The structure according to 1 or 2, wherein the noble metal oxide layer includes a polycrystalline structure.

4. The structure according to any one of 1 to 3, further including a noble metal layer adjacent to the noble metal oxide layer and on a side opposite to the metal oxide semiconductor layer.

5. The structure according to 4, further including a low-resistance base metal layer adjacent to the noble metal layer and on a side opposite to the noble metal oxide layer.

6. The structure according to any one of 1 to 5, wherein noble metal oxide in the noble metal oxide layer is one or more selected from the group consisting of palladium oxide, ruthenium oxide, platinum oxide, iridium oxide, silver oxide, rhenium oxide, osmium oxide, rhodium oxide, nickel oxide, and gold oxide.

7. The structure according to any one of 1 to 6, wherein noble metal oxide in the noble metal oxide layer is one or more selected from the group consisting of PdO having a PdO structure, $RuO_2$ having a rutile structure, $PtO_2$ having an $\alpha$-$PtO_2$ structure, $IrO_2$ having a rutile structure, $Ag_2O$ having a $Cu_2O$ structure, $ReO_3$ having a skutterudite structure, $OsO_2$ having a rutile structure, $Rh_2O_3$ having a corundum structure, NiO having a NiO structure, and $Au_2O_3$ having a $Au_2O_3$ structure.

8. The structure according to any one of 1 to 7, wherein an average crystalline particle diameter of noble metal oxide in the noble metal oxide layer is equal to or less than a film thickness of the noble metal oxide layer.

9. The structure according to any one of 1 to 8, wherein interface roughness of the noble metal oxide layer is 5 nm or less.

10. The structure according to any one of 1 to 9, wherein a carbon concentration in a Schottky interface between the metal oxide semiconductor layer and the noble metal oxide layer is $2 \times 10^{19}$ cm$^{-3}$ or less.

11. The structure according to any one of 1 to 10, wherein resistivity of the noble metal oxide layer is $1 \times 10^{-2}$ $\Omega \cdot$cm or less.

12. The structure according to any one of 1 to 11, wherein a work function of noble metal oxide in the noble metal oxide layer is 4.8 eV or more.

13. The structure according to any one of 1 to 12, wherein the metal oxide semiconductor layer is amorphous or polycrystalline.

14. The structure according to any one of 1 to 13, wherein metal oxide in the metal oxide semiconductor layer is oxide of one or more metal elements selected from the group consisting of In, Sn, Cd, Zn, Ga, and Ge.

15. The structure according to any one of 1 to 14, wherein a content ratio of Ga or In in the metal oxide semiconductor layer is 45 atomic % or more based on total metal elements in the metal oxide semiconductor layer.

16. The structure according to any one of 1 to 15, wherein the metal oxide semiconductor layer is randomly oriented.

17. The structure according to any one of 1 to 16, wherein a Schottky barrier height between the noble metal oxide layer and the metal oxide semiconductor layer is 0.7 eV or more.

18. The structure according to any one of 1 to 17, further including a substrate on a side of the noble metal oxide layer and opposite to the metal oxide semiconductor layer.

19. The structure according to any one of 1 to 18, further having an ohmic electrode layer, wherein the ohmic electrode layer and the noble metal oxide layer are not in contact with each other.

20. The structure according to any one of 1 to 19, wherein the metal oxide semiconductor layer is formed in one layer, or two or more layers, and any one layer of the metal oxide semiconductor layer is adjacent to the noble metal oxide layer when the metal oxide semiconductor layer is formed in two or more layers.

21. The structure according to any one of 1 to 20, wherein withstand voltage when reverse voltage is 0.5 MV/cm or more is applied.

22. The structure according to any one of 1 to 21, wherein current density is $1 \times 10^{-6}$ A/cm$^2$ or less when reverse bias of 0.2 MV/cm is applied.

23. The structure according to any one of 1 to 22, wherein an ideality factor of a diode forward bias is applied is 1.5 or less.

24. The structure according to any one of 1 to 23, wherein current density reaches 1000 A/cm$^2$ at forward bias of 5 V or less.

25. A method for manufacturing a structure, wherein the metal oxide semiconductor layer is formed by sputtering in an atmosphere into which hydrogen or water is introduced to obtain the structure according to any one of 1 to 24.

26. The method for manufacturing the structure, wherein the noble metal oxide layer is formed by sputtering in an atmosphere in which 50% or more of a flow rate of an introduced rate is oxygen to obtain the structure according to any one of 1 to 24.

27. The method for manufacturing the structure according to 25 or 26, wherein annealing is performed at 220 to 500° C. after the noble metal oxide layer and the metal oxide semiconductor layer are formed.

28. The method for manufacturing the structure according to any one of 25 to 27,
wherein the noble metal oxide layer and the metal oxide semiconductor layer are continuously formed by sputtering, or
wherein vacuum or an inert atmosphere is provided between formation of the noble metal oxide layer and formation of the metal oxide semiconductor layer.

29. A semiconductor element, wherein the structure according to any one of 1 to 24 is used.

30. The semiconductor element according to 29, which is a power semiconductor element, a diode element, a Schottky barrier diode element, an electrostatic discharge protection diode, a transient voltage protection diode, a light-emitting diode, a metal-semiconductor field-effect transistor, a junction field-effect transistor, a metal-oxide semiconductor field-effect transistor, a Schottky source/drain metal-oxide semiconductor field-effect transistor, an avalanche multiplication photoelectric conversion element, a solid state imaging element, or a solar cell element, an optical sensor element, a touch-sensor element, a display element, or resistive random access memory.

31. An electronic circuit, wherein the semiconductor element according to 29 or 30 is used.

32. An electrical apparatus, an electronic apparatus, a vehicle, or a power engine, wherein the electronic circuit according to 31 is used.

The invention can provide a structure in which a Schottky barrier functions, characterized by having capability of forming a film at low temperature, excellent process adaptability, capability of freely selecting a substrate, and low reverse current characteristics, a method for manufacturing the structure, a semiconductor element, and an electronic circuit.

DESCRIPTION OF EMBODIMENTS

Figure 1:
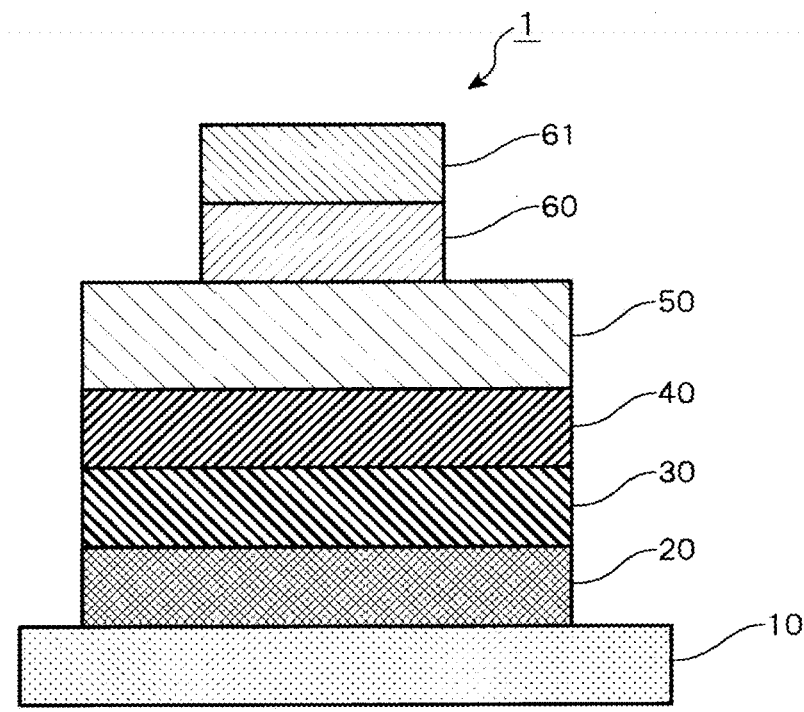
FIG. 1 is a cross-sectional view schematically showing one embodiment of a structure according to the invention.

A structure according to the invention includes a metal oxide semiconductor layer and a noble metal oxide layer, in which the metal oxide semiconductor layer and the noble metal oxide layer are adjacent to each other, and a film thickness of the noble metal oxide layer is more than 10 nm.

A semiconductor element in which a Schottky barrier functions, the semiconductor element having excellent in-plane uniformity, low contact resistance, a high on-off ratio, a high barrier height, and low reverse current characteristics, can be formed by using this structure.

Moreover, the structure has capability of forming a film at low temperature, excellent process adaptability, and capability of freely selecting a substrate.

Moreover, Schottky junction can be formed using a thin film, and therefore advantages such as process versatility, film formation at low temperature, and not limiting a substrate can be obtained. The structure has capability of device application, consolidation with various devices or the like by taking advantage of flexibility.

The metal oxide semiconductor layer is preferably formed in one layer or two or more layers. In the case of two or more layers, any one layer only needs to be adjacent to the noble metal oxide layer. The metal oxide semiconductor layer may be formed in three or more layers, or in four or more layers. The layer is ordinarily in five or less layers, but may be in a multi-layer structure of five or more layers having a repeating structure.

The metal oxide semiconductor layer is not particularly limited, and may be amorphous or crystalline, and a crystal may be microcrystalline, monocrystalline, or polycrystalline. The layer is preferably microcrystalline, polycrystalline, or amorphous, and more preferably polycrystalline or amorphous.

When the layer is amorphous, the crystal has excellent uniformity in a large area to reduce impact ionization when reverse bias is applied, thereby easily improving withstand voltage. Moreover, a variation of electrical characteristics or significant deterioration of characteristics can be relieved. Moreover, a high current diode or switching element having high withstand voltage and high reliability can be manufactured with a high yield. When the crystal is polycrystalline, the layer easily improves the uniformity in the large area and conductivity characteristics, and tends to be superior in stability.

A crystal structure of the metal oxide semiconductor layer can be measured using, for example, a Transmission Electron Microscope (TEM) or an X-Ray Diffraction (XRD).

A single crystal may be formed by, for example, allowing crystal growth by applying seed crystals as starting points, or by such as method as MBE (molecular beam epitaxy) and PLD (pulsed laser deposition).

An amorphous can be obtained, for example, by performing sputtering of metal oxide containing, as constituent elements, two or more different metal elements with different ion radii, or metal oxide that contains one metal element, but generates a plurality of different crystals. The amorphous can be formed, preferably, by setting a substrate heating temperature to 300° C. or less during sputtering, and heat treatment conditions after formation to 500° C. or less, and within one hour. The amorphous can be formed, more preferably, by setting a substrate heating temperature to 200° C. or less, and heat treatment conditions after formation to 400° C. or less. The amorphous is heated at a low temperature from 200° C. or more and 500° C. or less after formation, whereby a stable amorphous state can be obtained.

Here, a term "amorphous" means a structure in which a clear diffraction spot cannot be obtained, when a cross section the metal oxide semiconductor layer in a film thickness direction is obtained and the cross section is evaluated by an electron beam diffraction method using the Transmission Electron Microscope (TEM). A diffraction image is desirably obtained from a broad area of 10 nm or the like as an irradiation area of an electron beam. A term "clear diffraction spot" means that a diffraction spot having symmetry can be observed from the diffraction image.

Moreover, the term "amorphous" also includes the case where a crystallized or microcrystallized part is partially observed. If the partially crystallized part is irradiated with the electron beam, the diffraction image is recognized in several cases.

A term "microcrystalline structure" means a structure in which a size of a crystalline particle diameter is in a submicron or less level, and a clear grain boundary is not observed. Presence or absence of the clear grain boundary can be observed using a cross sectional TEM, for example, and the crystalline particle diameter size can be obtained by mapping the diffraction image. A part having the same diffraction image can be defined to be within the same particle.

A term "polycrystal" means a structure in which a size of the crystalline particle diameter is more than one micron and a clear grain boundary is observed. The clear grain boundary can be observed by the cross sectional TEM. The clear grain boundary exists, and therefore the particle diameter size can be defined by planar TEM or an electron backscatter diffraction method (EBSD).

The metal oxide semiconductor layer is preferably randomly oriented, irrespective of the crystalline state, from a viewpoint of a variation in the Schottky barrier.

A term "random orientation" means a state in which each crystalline particle orientation is not disproportionate to a specific orientation component.

For example, in analyzing the thin film using the XRD, in the case where relative intensity of a plurality of peaks in an obtained spectrum agrees with relative intensity in a powder X-ray pattern, such a case is referred to as random orientation. Specifically, relative to peak intensity of a plane direction in which intensity of the powder X-ray pattern is a maximum (hereinafter, referred to as a powder X-ray No. 1 peak), second and third peak intensity of the powder X-ray pattern (hereinafter, referred to as a powder X-ray No. 2 peak and a powder X-ray No. 3 peak, respectively) are taken, and the powder X-ray No. 1 peak/the powder X-ray No. 2 peak is taken as a power X-ray peak intensity ratio 1, and the powder X-ray No. 1 peak/the powder X-ray No. 3 peak is taken as a powder X-ray peak intensity ratio 2. In this case, among the plurality of peaks in the spectrum obtained by measurement, when peaks within ±1° relative to a 2θ position of the powder X-ray No. 1 to No. 3 peaks are observed, respectively, the peak corresponding to the powder X-ray No. 1 is taken as a thin-film X-ray peak 1, the peak corresponding to the powder X-ray No. 2 is taken as a thin-film X-ray peak 2, and the peak corresponding to the powder X-ray No. 3 is taken as a thin-film X-ray peak 3. When a value of the peak intensity ratio of the thin-film X-ray peak 1/the thin-film X-ray peak 2 becomes 0.3 to 3 times as much as a value of the powder X-ray peak intensity ratio 1, and a value of the peak intensity ratio of the thin-film X-ray peak 1/the thin-film X-ray peak 3 becomes 0.3 to 3 times as much as a value of the powder X-ray peak intensity ratio 2, the metal oxide semiconductor layer is deemed to be randomly oriented.

The orientation of the metal oxide semiconductor layer can be measured using the XRD, for example. In the case of a minute area, the orientation may be observed from the diffraction image of the cross sectional TEM.

Examples of the metal elements of the metal oxide in the metal oxide semiconductor layer include: In, Sn, Ge, Cd, Ti, Zn, Y, Sm, Ce, Nd, Ga, or Al. In, Sn, Cd, Zn, Ga and Ge are preferable, and In, Zn, Ga, and Sn are more preferable. These may be used alone in one kind or in combination of two or more kinds.

Thus, a spherical orbital of an s orbital can be used as a conductive path, and therefore the electrical characteristics can be easily stabilized in an in-plane direction, irrespective of polycrystal or amorphous.

The metal elements of the metal oxide in the metal oxide semiconductor layer may consist essentially of one or more selected from the group consisting of In, Sn, Ge, Cd, Ti, Zn, Y, Sm, Ce, Nd, Ga, and Al. Moreover, for example, 95 atomic % or more, 98 atomic % or more, 99 atomic % or more, or 100 atomic % of the metal elements of the metal oxide in the metal oxide semiconductor layer may be one or more selected from the group consisting of In, Sn, Ge, Cd, Ti, Zn, Y, Sm, Ce, Nd, Ga, and Al.

The metal element in the metal oxide semiconductor layer includes Ga, In, Zn or Sn, and a content ratio of Ga, In, Zn, or Sn is preferably 45 atomic % or more and more preferably 50 to 100 atomic % based on the total metal elements in the metal oxide semiconductor layer.

Moreover, a content ratio of Ga or In in the metal oxide semiconductor layer is preferably 45 atomic % or more based on the total metal elements in the metal oxide semiconductor layer. When the metal element is Ga, a content ratio of Ga is more preferably from 50 to 100 atomic %. When the metal element is In, a content ratio of In is more preferably from 50 to 70 atomic %.

When the content ratio of Ga is 45 atomic % or more, the Schottky interface (the metal oxide semiconductor layer-the noble metal oxide interface) having a wide bandgap and a high barrier can be formed.

When the content ratio of In is 45 atomic % or more, the metal oxide semiconductor layer having high conductivity and a high carrier concentration is easily obtained, and the Schottky interface having low resistance can be formed.

When the content ratio of Zn is 45 atomic % or more, the Schottky interface having enriched chemical reactivity and easiness of processing such as wet etching can be formed.

When the content ratio of Sn is 45 atomic % or more, the Schottky interface having enriched chemical stability and advantage from a viewpoint of durability can be formed.

In the metal element of the metal oxide in the metal oxide semiconductor layer, an atomic ratio of the following formulas (A) to (C) is preferably satisfied. Thus, high withstand voltage or low on-resistance is easily achieved.

$$0 \leq x/(x+y+z) \leq 0.8 \quad (A)$$

$$0 \leq y/(x+y+z) \leq 0.8 \quad (B)$$

$$0 \leq z/(x+y+z) \leq 1.0 \quad (C)$$

(wherein, x denotes the number of atoms of one or more kinds selected from the group consisting of In, Sn, Ge and Ti;

y denotes the number of atoms of one or more kinds selected from the group consisting of Zn, Y, Sm, Ce and Nd; and z denotes the number of atoms of one or more kinds selected from the group consisting of Ga and Al.)

If x is 0.8 or less, when the element of x is In or Sn, insulation properties of the metal oxide are not excessively decreased, and the Schottky junction can be easily obtained, and when the element of x is Ge or Ti, the insulation properties of the metal oxide are not excessively increased, and heat generation caused by ohmic potential drop can be suppressed.

The metal element of the metal oxide of the metal oxide semiconductor layer more preferably satisfies an atomic ratio of the following formulas (A-1) to (C-1).

$$0 \leq x/(x+y+z) \leq 0.7 \quad (A-1)$$

$$0 \leq y/(x+y+z) \leq 0.8 \quad (B-1)$$

when an element of z is Ga: $0.02 \leq z/(x+y+z) \leq 1.0$ when the element of z is Al: $0.005 \leq z/(x+y+z) \leq 0.5 \quad (C-1)$ (wherein, x, y and z are the same with x, y and z in the above-described formulas (A) to (C).)

When the element of z is Ga, if the ratio is 0.02 or more, oxygen in the metal oxide becomes hard to be eliminated, and the variation of the electrical characteristics tends to be suppressed.

The metal element of the metal oxide in the metal oxide semiconductor layer further preferably satisfies an atomic ratio of the following formulas (A-2) to (C-2).

$$0.1 \leq x/(x+y+z) \leq 0.5 \quad (A-2)$$

$$0.1 \leq y/(x+y+z) \leq 0.5 \quad (B-2)$$

$$0.03 \leq z/(x+y+z) \leq 0.5 \quad (C-2)$$

(wherein, x and y are the same with x and y in the above-described formulas (A) to (C), and z is the number of atoms of Ga.)

Moreover, the metal element of the metal oxide in the metal oxide semiconductor layer preferably satisfies an atomic ratio of the following formulas (A-3) and (C-3).

$$0 \leq x/(x+y+z) \leq 0.25 \quad (A-3)$$

$$0.3 \leq z/(x+y+z) \leq 1.0 \quad (C-3)$$

(wherein, x, y and z are the same with x, y and z in the above-described formulas (A) to (C).)

A carrier concentration of the metal oxide semiconductor layer is ordinarily $1 \times 10^{11}$ to $1 \times 10^{18}$ cm$^{-3}$, and specific examples include $1 \times 10^{13}$ to $1 \times 10^{18}$ cm$^{-3}$. For example, the carrier concentration can be determined by CV (capacity-voltage) measurement.

Specific examples of the metal oxide in the metal oxide semiconductor layer include InGaZnO(1:1:1) (ratio of a metal element of metal oxide, indicating that In:Ga:Zn is 1:1:1, hereinafter, the same shall apply), InGaZnO(5:3:2), InGaZnO(5:1:4), InSnZnO(25:15:60), InSnZnO(48.5:15:36.5), InGaO(1:1) (ratio of a metal element of a metal oxide semiconductor, indicating that In:Ga is 1:1, hereinafter, the same shall be apply), InGaO(93:7), InGaO(47:53), In$_2$O$_3$, Ga$_2$O$_3$, InSnZnO, InAlO, GaZnO and ZnSnO.

For example, by InGaO(47:53), a high bandgap and low-resistance characteristics can be obtained.

As a crystalline material, specific examples of the metal oxide in the metal oxide semiconductor layer include indium oxide, indium oxide doped with Ga, indium oxide doped with Al, indium oxide doped with Ga and Al, indium oxide doped with Zn, or indium oxide doped with Sn.

Further, specific examples include metal oxide including In, Zn and a third element, in which the third element is at least one or more kinds of metal elements selected from Sn, Ga, Hf, Zr, Ti, Al, Mg, Ge, Sm, Nd and La.

Moreover, as an amorphous material, specific examples of the metal oxide in the metal oxide semiconductor layer include Sn—In—Zn oxide, In—Zn—Ga—Mg oxide, In oxide, In—Sn oxide, In—Ga oxide, In—Zn oxide, Zn—Ga oxide, Sn—In—Zn oxide, In—Sn—Zn—Al oxide, In—Sn—Zn—Mg oxide, In—Ga—Zn—Al oxide and Ga oxide. A composition ratio of a constituent metal element may be 1, or needs not be 1.

For Zn or Sn, an amorphous phase can be easily formed by incorporating In thereinto. For example, in the case of an In—Zn system, a content of In is preferably 20 atomic % or more in total metal elements.

In the case of a Sn—In system, a content of In is preferably 80 atomic % or more in total metal elements.

In the case of a Sn—In—Zn system, a content of In is preferably 15 atomic % or more in total metal elements.

In the case of Ga oxide, a tetra-coordinate structure and a hexa-coordinate structure are mixed in many cases, and therefore an amorphous structure can be held even at an annealing temperature of approximately 500° C. also in a composition of $Ga_2O_3$.

A film thickness of the metal oxide semiconductor layer is not limited, and is ordinarily 5 to 8000 nm, preferably 50 to 1000 nm, and more preferably 100 to 500 nm.

In the metal oxide semiconductor layer, in the case of two or more layers, a film thickness of each layer may be within the above-described range, and a total film thickness of all the layers of two or more layers may be within the above-described range.

Specific resistance of the metal oxide semiconductor layer is preferably $1\times10^{-2}$ Ω·cm or more, and more preferably $1\times10^{0}$ to $1\times10^{8}$ Ω·cm. Thus, a design of the device having a depletion region can be performed.

The carrier concentration of the metal oxide semiconductor layer is preferably $1\times10^{18}$ cm$^{-3}$ or less. If the carrier concentration is $1\times10^{18}$ cm$^{-3}$ or less, contact with the noble metal oxide layer results in one-side step-junction, and features of the Schottky diode, such as high-speed response, tends to be developed.

Mobility of the metal oxide semiconductor layer is preferably 0.1 cm$^2$/Vs or more. If the mobility is within the above-described range, a low-resistance diode can be designed.

The carrier concentration, the mobility and the specific resistance of the metal oxide semiconductor layer can be measured using a Hall effect measurement system, for example.

The bandgap of the metal oxide semiconductor layer is preferably 1 eV or more. If the bandgap thereof is 1 eV or more, the Schottky interface having dielectric breakdown characteristics superior to silicon can be provided. The bandgap is more preferably 2 eV or more, and still more preferably is 3 eV or more. Thus, the Schottky interface not affected by visible light can be formed. The bandgap can be measured using, for example, a UV-VIS apparatus.

A film thickness of the noble metal oxide layer is more than 10 nm, and is preferably 15 nm or more, and more preferably 30 nm or more. An upper limit is not particularly limited, but is ordinarily 1000 nm or less. If the upper limit is 1000 nm or less, the layer is tends to be advantageous in view of cost.

Moreover, an average crystalline particle diameter of the noble metal oxide in the noble metal oxide layer is preferably equal to or less than the film thickness of the noble metal oxide layer. Thus, a polycrystalline grain boundary is divided, conduction transmitted along a grain boundary can be suppressed, a variation in in-plane can be reduced, and the Schottky barrier having uniformity tends to be developed.

It should be noted that the average crystalline particle diameter is an average value of the particle diameters of ten crystalline particles at the same depth of the cross sectional TEM image, in which the image in a film depth direction, observed by the transmission electron microscope (TEM) at magnification of 500 thousand times, is obtained. The crystalline particle is defined by deeming, as the single crystal, a place in which interference fringes are in parallel to each other by using the interference fringe. A maximum Feret diameter in each single crystal is taken as the crystalline particle diameter.

A film thickness of the noble metal oxide layer can be measured by the cross sectional TEM, for example. On the above occasion, the average crystalline particle diameter of the noble metal oxide layer can be confirmed to be equal to or less than the film thickness of the noble metal oxide layer.

A film thickness of each layer of the structure according to the invention can be measured in the same method as in the method described above.

The noble metal oxide layer preferably includes a polycrystalline structure. Thus, the structure can be annealed at high temperature.

Examples of the noble metal oxide in the noble metal oxide layer include, from a viewpoint of forming the favorable Schottky interface with the metal oxide semiconductor layer in view of a relationship between conductivity and a work function, one or more selected from the group consisting of palladium oxide, ruthenium oxide, platinum oxide, iridium oxide, silver oxide, rhenium oxide, osmium oxide, rhodium oxide, nickel oxide, and gold oxide.

Examples of the noble metal oxide preferably include, from viewpoints of forming a high Schottky barrier to form a stable structure, palladium oxide, ruthenium oxide, platinum oxide, and, iridium oxide. Above all, palladium oxide has a wide window during sputtering, and an advantage from an industrial point of view, and therefore is preferable.

Moreover, oxide of Mo, W, Cr, Te, Mn, Fe, and Co may be used as the noble metal oxides in the noble metal oxide layer.

The noble metal oxide in the noble metal oxide layer is preferably one or more selected from the group consisting of PdO having a PdO structure, $RuO_2$ having a rutile structure, $PtO_2$ having an α-$PtO_2$ structure, $IrO_2$ having a rutile structure, $Ag_2O$ having a $Cu_2O$ structure, $ReO_3$ having a skutterudite structure, $OsO_2$ having a rutile structure, $Rh_2O_3$ having a corundum structure, NiO having a NiO structure, and $Au_2O_3$ having a $Au_2O_3$ structure. Thus, the noble metal oxide layer has excellent conductivity, a high work function, and a stable structure, and therefore easily functions as a favorable noble metal oxide layer.

The noble metal oxide may be used alone in one kind or in combination of two or more kinds.

A crystal structure of the noble metal oxide layer can be measured using the XRD, for example. In the case of a minute area, the orientation may be observed from the diffraction image of the cross sectional TEM.

For example, the crystal structure can be confirmed from agreement of a thin film X-ray diffraction pattern with an assumed crystal structure X-ray diffraction pattern. Specifically, the crystal structure can be confirmed from agreement of the thin film X-ray diffraction pattern with a crystal structure X-ray diffraction pattern obtained from JCPDS (Joint Committee of Powder Diffraction Standard) card or ICSD (The Inorganic Crystal Structure Database).

A preferable crystal structure of palladium oxide is PdO having the PdO structure. The crystal structure being PdO having the PdO structure can be confirmed by observation of a peak of a PdO structure compound as results of X-ray diffraction measurement of the thin film, for example. PdO having the PdO structure shows an ICSD (26598) or JCPDS (85-0624) peak pattern in the database, or a similar (shifted in a peak position of 2θ/θ) pattern by X-ray diffraction, for example.

Palladium oxide is generally insoluble in a large number of acids, and slightly soluble in aqua regia and 48% hydrobromic acid. Palladium is soluble well in aqua regia, a potassium iodide solution containing iodide, or a sodium cyanide solution containing an oxidant. Between palladium and palladium oxide, an etching rate difference relative to various solutions can be used upon patterning the structure according to the invention. Upon patterning a palladium oxide layer by etching, aqua regia heated at approximately 60° C. is preferably used. Selective etching can be performed by using the etching rate difference of palladium and palladium oxide relative to aqua regia.

A preferable crystal structure of the ruthenium oxide is $RuO_2$ having the rutile structure. The crystal structure being $RuO_2$ having the rutile structure can be confirmed by observation of a peak of a $RuO_2$ compound having the rutile structure as results of X-ray diffraction measurement of the thin film, for example. $RuO_2$ having the rutile structure shows an ICSD (15071) pattern in the database, or a similar (shifted) pattern, by X-ray diffraction, for example.

Ruthenium oxide is generally insoluble in a large number of acids, and dissolved into melted potassium hydroxide. Ruthenium is generally soluble in an alkali hypochlorite solution, and gradually dissolved into air-containing hydrochloric acid and aqua regia. Between ruthenium and ruthenium oxide, an etching rate difference relative to various solutions can be utilized upon patterning the structure according to the invention. Aqua regia heated at approximately 60° C. and containing a large amount of air is preferably used upon patterning a ruthenium oxide layer by etching. Selective etching can be used by using the etching rate difference between ruthenium and ruthenium oxide relative to aqua regia.

Moreover, ruthenium oxide can be patterned by dry etching. For example, reactive etching can be performed by an oxygen gas, a fluorocarbon gas, a fluorine gas, a chlorine gas, a bromine gas, an iodine gas, an ozone gas, a hydrogen halide gas and halocarbon gas. Moreover, the above-described gas species may be mixed and used.

A preferable crystal structure of platinum oxide is $PtO_2$ having the α-$PtO_2$ structure. The crystal structure being $PtO_2$ having the α-$PtO_2$ structure can be confirmed by observation of a peak of a $PtO_2$ compound having the α-$PtO_2$ structure as results of X-ray diffraction measurement of the thin film, for example. $PtO_2$ having the α-$PtO_2$ structure shows an ICSD (164289) pattern in the database, or a similar (shifted) pattern, by X-ray diffraction, for example.

Platinum oxide is generally insoluble in hydrochloric acid, sulfuric acid, nitric acid, and aqua regia; but is soluble by heating with sulfurous acid. Platinum is generally soluble in aqua regia. Between platinum and platinum oxide, an etching rate difference relative to various solutions can be used upon patterning the structure according to the invention. Heating with sulfurous acid is preferable upon patterning the platinum oxide layer by etching. Selective etching can be used by using the etching rate difference between platinum and the platinum oxide relative to aqua regia.

A preferable crystal structure of iridium oxide is $IrO_2$ having the rutile structure. The crystal structure being $IrO_2$ having the rutile structure can be confirmed by observation of a peak of an $IrO_2$ compound having the rutile structure as results of X-ray diffraction measurement of the thin film, for example. $IrO_2$ having the rutile structure shows an ICSD (81028) pattern in the database, or a similar (shifted) pattern by X-ray diffraction, for example.

Iridium oxide is generally insoluble in a large number of acids and bases. Iridium is generally slightly soluble in aqua regia. Between iridium and iridium oxide, an etching rate difference relative to various solutions can be used upon patterning the structure according to the invention. The iridium oxide layer is difficult to be etched, and therefore a lift-off method is preferably used upon etching the iridium oxide layer. Selective etching can be used by using the etching rate difference between iridium and iridium oxide relative to aqua regia.

A preferable crystal structure of silver oxide is $Ag_2O$ having the $Cu_2O$ structure. The crystal structure being $Ag_2O$ having the $Cu_2O$ structure can be confirmed by observation of a peak of a $Ag_2O$ compound having the $Cu_2O$ structure as results of X-ray diffraction measurement of the thin film, for example. $Ag_2O$ having the $Cu_2O$ structure shows an ICSD (605623) pattern in the database, or a similar (shifted) pattern by X-ray diffraction, for example.

Silver oxide is generally soluble in ammonium water and nitric acid. Silver is generally soluble in dilute nitric acid and hot concentrated sulfuric acid. Between silver and silver oxide, an etching rate difference relative to various solutions can be used upon patterning the structure according to the invention by etching. A solution containing nitric acid is preferably used upon patterning the silver oxide layer by etching. Selective etching can be used by using the etching rate difference between silver and silver oxide relative to the nitric acid.

A preferable crystal structure of rhenium oxide is $ReO_3$ having the skutterudite structure. The crystal structure being $ReO_3$ having the skutterudite structure can be confirmed by observation of a peak of a $ReO_3$ compound having the skutterudite structure as results of X-ray diffraction measurement of the thin film, for example. $ReO_3$ having the skutterudite structure shows an ICSD (201875) pattern in the database, or a similar (shifted) pattern by X-ray diffraction, for example.

Rhenium oxide is generally soluble in water. Rhenium is generally soluble in nitric acid and hot concentrated sulfuric acid, and is soluble in hydrogen peroxide and bromine water. Between rhenium and rhenium oxide, an etching rate difference relative to various solutions can be used upon patterning the structure according to the invention.

A preferable crystal structure of osmium oxide is $OsO_2$ having the rutile structure. The crystal structure being $OsO_2$ having the rutile structure can be confirmed by observation of a peak of an $OsO_2$ compound having the rutile structure as results of X-ray diffraction measurement of the thin film, for example. $OsO_2$ having the rutile structure shows an ICSD (15070) pattern in the database, or a similar (shifted) pattern by X-ray diffraction, for example.

Osmium oxide is generally easily soluble in ethanol, and gradually dissolved in water. Osmium generally reacts with halogen at high temperature, but is practically insoluble in aqua regia. Between osmium and osmium oxide, an etching rate difference relative to various solutions can be used upon patterning the structure according to the invention.

A preferable crystal structure of rhodium oxide is $Rh_2O_3$ having the corundum structure. The crystal structure being $Rh_2O_3$ having the corundum structure can be confirmed by observation of a peak of a $Rh_2O_3$ compound having the corundum structure as results of X-ray diffraction measurement of the thin film, for example. $Rh_2O_3$ having the corundum structure shows an ICSD (647369) pattern in the database, or a similar (shifted) pattern by X-ray diffraction, for example.

Rhodium oxide is generally soluble in hydrochloric acid and perchloric acid. Rhodium is generally soluble in hot sulfuric acid and heated aqua regia. Between rhodium and rhodium oxide, an etching rate difference relative to various solutions can be used upon patterning the structure according to the invention.

A preferable crystal structure of nickel oxide is NiO having the NiO structure. The crystal structure being NiO having the NiO structure can be confirmed by observation of a peak of a NiO compound having the NiO structure as results of X-ray diffraction measurement of the thin film, for example. NiO having the NiO structure shows an ICSD (9866) pattern in the database, or a similar (shifted) pattern by X-ray diffraction, for example.

Nickel oxide is generally slightly soluble in hydrochloric acid, sulfuric acid, and nitric acid, and practically insoluble in water and a sodium hydroxide solution. Nickel is generally soluble in hydrochloric acid and dilute nitric acid, but a reaction therefor is slow. Nickel is soluble in dilute nitric acid and forms a passive state in concentrated nitric acid. Between nickel and nickel oxide, an etching rate difference relative to various solutions can be used upon patterning the structure according to the invention.

A preferable crystal structure of gold oxide is $Au_2O_3$ having the $Au_2O_3$ structure. The crystal structure being $Au_2O_3$ having the $Au_2O_3$ structure can be confirmed by observation of a peak of a $Au_2O_3$ compound having the $Au_2O_3$ structure as results of X-ray diffraction measurement of the thin film, for example. $Au_2O_3$ having the $Au_2O_3$ structure shows an ICSD (8014) pattern in the database, or a similar (shifted) pattern by X-ray diffraction, for example.

Into the noble metal oxide layer, an element having strong bonding force with oxygen may be incorporated. For example, in terms of an element ratio, such an element may be incorporated thereinto in a proportion of preferably 70% or less, more preferably 50% or less, and further preferably 30% or less, of the noble metal elements in the noble metal oxide layer. The noble metal oxide layer preferably has the polycrystalline structure, but may take a form in which the polycrystalline structure is incorporated into the amorphous structure. Reduction resistance of the noble metal oxide is improved by incorporating the element having strong bonding force with oxygen thereinto. Examples of the element having strong bonding force with oxygen include Ti, Si, Zr, Y, Al, Mg, Zr, and Hf, having large standard free energy of formation of oxide. For example, Ru—Si—O can cause satisfaction of both a high work function and low specific resistance, and therefore is preferable.

Gold oxide is generally soluble in a concentrated basic solution. Gold is generally soluble well in aqua regia, a potassium iodide solution containing iodine, and a sodium cyanide solution containing oxidant. Between gold and gold oxide, an etching rate difference relative to various solutions can be used upon patterning the structure according to the invention.

The database used in X-ray diffraction is generally provided in a powder pattern or the like, and is randomly oriented. If the noble metal oxide layer is a randomly oriented polycrystalline thin film, a main peak obtained by the XRD measurement is generally observed as a spectrum having a median peak in a position of ±1° relative to the 2θ position in the database. Further, when a ratio is taken with intensity of a spectrum having the second and the third peak intensity in the database is taken relative to the peak intensity in the plane direction in which the intensity in the database is at a maximum, a measured spectrum is generally within ±1° relative to the 2θ position in the database, and a peak intensity ratio reaches a value as much as 0.3 to 3 times as the in the database.

Moreover, when the measured spectrum is out of the above-described relationship, for example, if the peak observed in the 2θ position does not have the maximum intensity in the measured value relative to the peak having the maximum intensity in the database, the noble metal oxide layer is oriented on a specific plane in many cases.

The noble metal oxide layer is preferably polycrystalline in view of stability and stress relaxation, and randomly oriented from a viewpoint of the variation in the Schottky barrier.

In the case where a proportion of the specific plane orientation component is large, the step is easily formed on the surface, and a weak orientation component is not stabilized within the plane, and therefore such a case has a risk of causing reduction of a substantial Schottky barrier.

A carrier concentration of the noble metal oxide layer is preferably $1\times10^{18}$ cm$^{-3}$ or more. If the carrier concentration is $1\times10^{18}$ cm$^{-3}$ or more, the contact with the metal oxide semiconductor layer results in one-side step-junction, and the features of the Schottky diode, such as the high-speed response, tends to be developed. The carrier concentration can be determined by the Hall measurement or the like, for example.

Interface roughness of the noble metal oxide layer is preferably 5 nm or less, and more preferably 2 nm or less. Thus, fluctuations of the Schottky barrier in the interface are reduced, whereby a substantially high Schottky barrier can be obtained.

The interface roughness of the noble metal oxide layer can be measured using the cross sectional TEM, for example.

Specifically, the interface roughness of the noble metal oxide layer can be determined by photographing three places in the cross sectional TEM, tracing unevenness of the interface between the noble metal oxide layer and the metal oxide semiconductor layer, and calculating the traced line in accordance with the calculation method of the root mean square roughness (RMS) specified in JIS B0601-2001. The cross sectional TEM is preferably obtained at the magnification at which, when the traced line of the interface between the noble metal oxide layer and the metal oxide semiconductor is drawn, the traced line has five or more local maximal values and a difference between the local maximal value and a local minimal value adjacent to each other can be clearly judged.

The specific resistance of the noble metal oxide layer is preferably $1\times10^{-2}$ Ω·cm or less, and more preferably from $1\times10^{-3}$ Ω·cm to $1\times10^{-5}$ Ω·cm. Thus, the device can be designed without depending on resistance of the noble metal oxide layer. Here, the specific resistance has the same meaning with resistivity or electrical resistivity, and no difference as physical properties is not produced depending on the name.

The specific resistance of the noble metal oxide layer can be measured using van der Pauw method, for example. The specific resistance may be directly measured by electrical measurement.

The work function of the noble metal oxide in the noble metal oxide layer is preferably 4.8 eV or more, and more preferably 5.0 to 6.0 eV. Thus, a work function difference from the metal oxide semiconductor increases, and a structure having a high Schottky barrier height can be formed.

The work function of the noble metal oxide in the noble metal oxide layer can be measured using, for example, X-ray photoelectron spectroscopy (XPS), ultraviolet photoelectron spectroscopy (UPS), photoelectron spectroscopy in air, and Kelvin probe microscope (KPM).

The structure according to the invention preferably has the depletion region, and more preferable has the depletion region in a part in the metal oxide semiconductor layer adjacent to the noble metal oxide layer. Although a depth of the depletion region is different depending on positive or negative or magnitude of applied voltage, a maximum depth of the depletion region is preferably the same with a film thickness of the metal oxide semiconductor layer. The depth of the depletion region is preferably 50 to 100% of the film thickness of the metal oxide semiconductor layer, and more preferably 70 to 100% thereof. Depending on film forming conditions, the depth of the depletion region may be more than the film thickness of the metal oxide semiconductor layer, and the maximum depth of the depletion region may be 110% of the film thickness of the metal oxide semiconductor layer. The depth of the depletion can be obtained by CV (capacity-voltage) measurement, for example.

When the metal oxide semiconductor layer is formed in two or more layers, the depth of the depletion region may be within the above-described range in the metal oxide semiconductor layer adjacent to the noble metal oxide layer, or may be within the above-described range relative to the total film thickness of all the layers of two or more layers.

A carbon concentration in the Schottky interface between the metal oxide semiconductor layer and the noble metal oxide layer is preferably $2 \times 10^{19}$ cm$^{-3}$ or less, and more preferably from $1 \times 10^{12}$ cm$^{-3}$ to $2 \times 10^{19}$ cm$^{-3}$. Thus, a satisfactory interface between the metal oxide semiconductor layer and the noble metal oxide layer can be formed, and the stability can be increased, the variation can be reduced, and a high substantial Schottky barrier can be achieved.

The carbon concentration in the Schottky interface can be measured using a depth profile of secondary ion mass spectrometry (SIMS), for example.

A Schottky barrier height between the noble metal oxide layer and the metal oxide semiconductor layer is preferably 0.7 eV or more, and more preferably 1.0 to 2.0 eV. Thus, rectification characteristics can be improved.

In the structure according to the invention, an ideality factor of a diode when forward bias is applied is preferably 1.5 or less, and more preferably 1.0 to 1.3. Thus, the device having low power consumption can be easily designed.

When a resistance component other than the Schottky barrier, such as semiconductor resistance, electrode resistance, and contact resistance, do not have bias dependence according to a thermionic emission model, the Schottky barrier height and the ideality factor of the diode when forward bias is applied can be determined as described below, for example.

The following Formula (1) holds between a measured current value I and applied voltage V. According to Formula (1), a graph of ln I-V plot between the current value and the voltage value is drawn, and a tangent line is drawn in a part having satisfactory linearity of approximately 50 mV to approximately 1000 mV, whereby $I_0$ can be determined from an intercept of the tangent line with V=0. More specifically, as described in literature (Appl. Phys. Lett., 49, 85, 1986), $I_0$ can be determined by using Cheung's plot and excluding an influence of R component.

$$I = I_o \exp\left(\frac{q(V-IR)}{nkT}\right)\left[1 - \exp\left(-\frac{q(V-IR)}{kT}\right)\right] \quad (1)$$

I: measured current value [A]
$I_0$: saturation current [A]
R: contact resistance by a metal oxide semiconductor, an electrode or the like [Ω]
n: ideality factor of diode
k: Boltzmann's constant ($8.617 \times 10^{-5}$ eV/K)
T: sample temperature during measurement (K)
q: elementary charge [$1.602 \times 10^{-19}$ C]
V: applied voltage [V]

$I_0$ denotes saturation current and corresponds to the current value when 0 V is applied. On the other hand, a relationship of Formula (2) holds between a saturation current value and a Schottky barrier height.

$$I_o = AA^{**}T^2 \exp\left(\frac{-q\phi_{bo}}{kT}\right) \quad (2)$$

$\phi_{bo}$: Schottky barrier height [eV]
A: effective area of diode [cm$^2$]
A**: Richardson coefficient [Acm$^{-2}$K$^{-2}$]

Here, the Richardson coefficient depends on an effective mass value of the semiconductor, and is 120 Acm$^{-2}$K$^{-2}$ when effective mass is 1. When the metal oxide in the metal oxide semiconductor layer is InGaZnO(1:1:1), the effective mass is reported to be 0.3, and therefore A** can be deemed to be 36 Acm$^{-2}$K$^{-2}$. In the case of a thin film having a known Richardson coefficient, the Schottky barrier height can be determined by using $I_0$ determined by measurement at room temperature, according to Formula (3).

$$\phi_{bo} = \frac{kT}{q} \ln\left[\frac{AA^{**}T^2}{I_o}\right] \quad (3)$$

When the Richardson constant is unknown, A and $\phi_{bo}$ can be determined from temperature dependence. As represented in Formula (2), A can be determined from an intercept, and $\phi_{bo}$ can be determined from an inclination of the Anderson plot by plotting $\ln(I_0/T^2)$ obtained from each temperature with 1/kT (Anderson plot).

The ideality factor of the diode can be determined from the inclination of the part having satisfactory linearity of approximately 50 mV to approximately 1000 mV in the ln I-V plot, as represented by Formula (4) subjected to differential transformation of Formula (1).

$$n = \frac{q}{kT}\left(\frac{dV}{d \ln I}\right) \quad (4)$$

Moreover, when the semiconductor resistance has the bias dependence (SCLC conduction) according to the thermionic emission model, the Schottky barrier height and the ideality factor of the diode when forward bias is applied can be determined as described below, for example.

Each parameter can be determined according to simulation of an SCLC model intervened with exponential trap, assuming presence of an initial free charrier concentration, with reference to the literature (J. Appl. Phys., 104, 123706, 2008).

$$J = eun(x)E(x) = eu[n_0 + n_{i,c}(x)]E(x), \quad (6)$$

$$\frac{dE}{dx} = \frac{e}{\epsilon}n_{inj}(x) = \frac{e}{\epsilon}[n_{i,c}(x) + n_{i,t}(x)], \quad (7)$$

$$L = \int_0^L dx = \int_0^{Ea} \frac{dx}{dE}dE, \quad (8)$$

$$V = \int_0^L E dx = \int_0^{Ea} E\frac{dx}{dE}dE, \quad (9)$$

$$n_{i,t}(x) = N_t\left[\left(\frac{n(x)}{N_c}\right)^{T/T_i} - \left(\frac{n_0}{N_c}\right)^{T/T_i}\right] \quad (10)$$

The above-described Formula (6) is a formula representing current density obtained by taking into account an initial carrier concentration at a distance x from an ohmic electrode and a free carrier injected from a side of the ohmic electrode in the formula in which the current is constant. In Formula (6), "e" denotes an elementary charge, and "u" denotes mobility, and $n_0$ and $n_{i,c}(x)$ denote an initial free carrier concentration and a concentration of an electron involving in conduction among injected electrons at the distance x. Moreover, Formula (7) represents the Poisson equation, and means that a change in an electric field E is continuously caused by a free carrier injected in a position x and a trapped carrier according to total injected electrons. Formulas (8) and (9) represent boundary conditions, in which L denotes a film thickness of a semiconductor layer, and Ea denotes maximum electric field intensity at X=0 to x. Formula (10) represents a concentration of trapped electrons among injected electrons in the position x, when exponential trap is assumed. $N_t$ denotes a trap level concentration existing from a conductivity end to the Fermi level, $N_c$ denotes effective density of state. $T_t$ denotes a characteristic temperature, and n(x) denotes a free carrier concentration in the position x.

In Formulas (6) to (10), $n_0$, $T_t$, and $N_t$ are applied as parameters, and values determined by separate measurement are applied as a dielectric constant ε, mobility u, and effective density of state $N_c$. A temperature and a film thickness are presumed to be known. Thus, I-$V_{semi}$ characteristics when a Schottky barrier does not exist, namely, variable resistance R ($V_{semi}$) resulting from the semiconductor can be determined. Here, applied voltage V can be regarded to satisfy an equation: V=$V_{schottky}$+$V_{semi}$, and therefore a term of V-IR in Formula (1) is taken as V-$V_{semi}$, and a relation of $V_{semi}$ with I determined by simulation is used. Specifically, with regard to I-V characteristics experimentally determined, $V_{semi}$ is incorporated into Formula (1), $\phi_{bo}$ and n are applied as further fitting parameters, and $n_0$, $T_t$, $N_t$, $\phi_{bo}$ and n can be simultaneously determined according to numerical simulation. Thus, $\phi_{bo}$ and n can be determined.

The structure according to the invention may include one or more layers formed of metals and metal oxides having different compositions, on a side of the noble metal oxide layer and opposite to the metal oxide semiconductor layer in order to reduce the contact resistance with the substrate or a current extraction electrode or to improve adhesion.

The structure according to the invention may further include a noble metal layer adjacent to the noble metal oxide layer and on a side opposite to the metal oxide semiconductor layer. Thus, reduction of the noble metal oxide layer can be prevented.

Specific examples of the metal element of the noble metal layer include Pd, Mo, Pt, Ir, Ru, Au, Ag, Ni, W, Cr, Re, Te, Tc, Mn, Os, Fe, Rh, Co and an alloy of two or more metal elements thereof. The metal elements may be used alone in one kind or in combination of two or more kinds.

Moreover, as the metal element of the noble metal layer, the same metal element with the metal element of the noble metal oxide layer is preferably used. Specific examples of a combination of the noble metal layer and the noble metal oxide layer (noble metal layer/noble metal oxide layer) include Pd/PdO, Pt/PtO, Ir/IrO and Ru/RuO. The combination of the same metal elements is used, whereby the contact resistance is hard to be caused in the interface between the noble metal oxide layer and the noble metal layer, and the Schottky junction excellent in low resistance can be performed.

A film thickness of the noble metal layer is ordinarily 1 nm to 1 μm, preferably 10 nm to 500 nm, more preferably 20 nm to 200 nm, and particularly preferably 25 nm to 100 nm. In the above-described range, reduction caused by an influence from a side adjacent to the noble metal oxide layer and opposite to the metal oxide semiconductor layer can be suppressed, and flatness of the noble metal oxide layer can be improved.

The structure according to the invention may further include a low-resistance base metal layer adjacent to the noble metal layer and on a side opposite to the noble metal oxide layer.

Thus, interaction between the substrate and the noble metal oxide layer can be prevented and the contact resistance can be reduced. Moreover, adhesion of the noble metal oxide layer onto the substrate can be improved, and the surface smoothness of the noble metal oxide layer can be improved.

Examples of the metal element of the low-resistance base metal layer include Ti, Mo, Ag, In, Al, W, Co, and Ni, and an alloy of two or more metal elements thereof or silicide of two or more metal elements thereof. The metal element is preferably Ti, Mo, Ag, In, or Al which forms low-resistance silicide in combination with a Si-containing substrate, and more preferably Ti or Mo which has low resistance and forms favorable Schottky junction in combination with the noble metal oxide.

A thickness of the low-resistance base metal layer is ordinarily 1 nm to 1 μm, preferably 2 nm to 100 nm, and more preferably 5 nm to 50 nm. In the above-described range, the low-resistance base metal layer has sufficient adhesion, and tends to be small in an increase in the resistance.

The structure according to the invention may further have an ohmic electrode layer. The ohmic electrode layer and the noble metal oxide layer preferably are not brought into contact with each other.

Thus, the rectification characteristics and the depth of the depletion region can be controlled.

The ohmic electrode layer preferably has one layer, or two or more layers. The ohmic electrode layer may have three or more layers, or four or more layers. The ohmic electrode layer ordinarily has five or less layers.

A material of the ohmic electrode layer is not particularly limited, as long as a favorable ohmic connection can be made with the metal oxide semiconductor layer, and is preferably one or more metal elements (including an alloy) selected from the group consisting of Ti, Mo, Ag, In, Al, W, Co, and Ni or a compound (oxide or the like) of one or more metal elements thereof, and more preferably one or more metal elements (including an alloy) selected from the group consisting of Mo, Ti, Au, Ag, In, and Al, or a compound thereof.

Moreover, the ohmic electrode layer can be formed of two or more layers. For example, a Mo electrode layer is used on a side in contact with the metal oxide semiconductor layer, and a metal layer of Au, Al, or the like, which is a low-resistance metal, is thickly laminated thereon, and the resulting layer can applied as a base for wire bonding. The ohmic electrode layer is used, whereby an electric current can be extracted without power loss.

A film thickness of the ohmic electrode layer is ordinarily 1 nm to 5 µm. The film thickness thereof is preferably 5 to 1000 nm, and more preferably 10 to 500 nm.

When the ohmic electrode layer has two or more layers, a film thickness of each layer may be within the above-described range, and a total film thickness of all the layers of two or more layers may be within the above-described range.

The structure according to the invention may further include a substrate (support substrate) on a side of the noble metal oxide layer and opposite to the metal oxide semiconductor layer.

The substrate is not particularly limited, and a publicly-known substrate can be used, and specific examples include a conductive substrate, a semiconductor substrate and an insulating substrate.

As the insulating substrates, a substrate having piezoelectric characteristics or capability of optical application may be applied. Moreover, a substrate having a circuit or a multi-layer structure may be used. For example, an electrical apparatus, a vehicle or a power engine, having an electronic circuit thereon, can be used as the substrate.

As the conductive substrate, a conventionally-known substrate having excellent surface smoothness prepared by applying doping treatment with a high concentration on a semiconductor substrate, such as a silicon single crystal substrate, a silicon polycrystalline substrate, and a silicon crystal substrate can be used.

Moreover, a SiC substrate, a GaN substrate, a GaAs substrate or the like may also be used.

Moreover, a metallic substrate of Al, Cu, Ni, SUS (stainless steel), Au, Ag, W, Ti, or the like may be used.

Moreover, a substrate prepared by forming a conductive layer on a surface of an insulating substrate to have conductivity thereon may be used.

From a viewpoint of mass productivity or cost, a silicon substrate is preferable as the conductive substrate. The silicon substrate may be of n-type, i-type, or p-type, and when the electric current is applied in longitudinally direction, the silicon substitute is preferably of n-type or p-type having low electrical resistance. As a dopant, conventionally-known B, P, Sb or the like can be used.

Particularly when resistance is reduced, As or red phosphorous may be used as the dopant.

The semiconductor substrate may be arranged in contact with the noble metal layer or the low-resistance base metal layer.

A material of the semiconductor substrate is not particularly limited, as long as surface smoothness is kept.

As the semiconductor substrate, a Si substrate, a GaN substrate, a SiC substrate, a GaP substrate, a GaAs substrate, a ZnO substrate, a $Ga_2O_3$ substrate, a GaSb substrate, an InP substrate, an InAs substrate, an InSb substrate, a ZnS substrate, a ZnTe substrate, and a diamond substrate of which the carrier concentration is adjusted to $1\times10^{18}$ $cm^{-3}$ or less can be used.

The semiconductor substrate may be monocrystalline or polycrystalline. Moreover, the semiconductor substrate may be an amorphous substrate or a substrate partially including an amorphous material. A substrate on which a semiconductor film is formed using a method such as chemical vapor deposition (CVD) on the conductive substrate, the semiconductor substrate, or the insulating substrate may be used.

The insulating substrate is not particularly limited as long as a substrate having insulation is applied, and the insulating substrate generally can be arbitrarily selected.

For example, a non-alkali glass substrate prepared according to a fusion process or a float process for quartz glass, bariumborosilicate glass, aluminoborosilicate glass, aluminosilicate glass or the like, a ceramic substrate, a plastic substrate having heat resistance that can withstand treatment temperature of the present preparation step (for example, polyimide substrate), or the like can be used. In the case of the plastic substrate, the plastic substrate may have flexibility.

Moreover, as the insulating substrate, a dielectric substrate may be used. Specific examples of the dielectric substrate include a lithium niobate substrate, a lithium tantalate substrate, a zinc oxide substrate, a crystal substrate and a sapphire substrate.

Further, a substrate in which an insulating film or a dielectric film is arranged on a surface of a metal substrate of a stainless steel alloy or the like may be used. Moreover, the insulating film may be formed on the substrate as an undercoat film. As the undercoat film, a monolayer or a lamination of a silicon oxide film, a silicon nitride film, a silicon oxide nitride film, a silicon nitride oxide film or the like can be formed using a CVD process, a sputtering process or the like.

As the substrate, a backing material having, on the conductive substrate, the semiconductor substrate or the insulating substrate, an arbitrary structure formed of a plurality of materials, a layer structure, a circuit, wiring, an electrode or the like may be used.

Specific examples of a material of the arbitrary structure include various composite materials of a metal or an insulator, such as a metal forming a back end of line on a large-scale integrated circuit (LSI), and an interlayer insulating film.

A layer of the layer structure is not particularly limited, and a publicly-known layer such as an electrode layer, an insulating layer, a semiconductor layer, a dielectric layer, a protective film layer, a stress buffering layer, a light shielding layer, an electron or hole injection layer, an electron or hole transport layer, an emission layer, an electron or hole blocking layer, a crystal growth layer, an adhesion improvement layer, a memory layer, liquid crystal layer, a capacitor layer and a storage layer can be used.

Specific examples of the electrode layer generally include an Al layer, a Si layer, a Sc layer, a Ti layer, a V layer, a Cr layer, a Ni layer, a Cu layer, a Zn layer, a Ga layer, a Ge layer, an Y layer, a Zr layer, a Nb layer, a Mo layer, a Tc layer, a Ru layer, a Rh layer, a Pd layer, a Ag layer, a Cd layer, an In layer, a Sn layer, a Sb layer, a Te layer, a Hf layer, a Ta layer, a W layer, a Re layer, an Os layer, an Ir layer, a Pt layer, a Au layer, an alloy layer containing one or more metals in the layers, and an oxide electrode layer. A carrier concentration of the semiconductor such as an oxide semiconductor and Si is increased, and the resulting material can also be used in the electrode layer.

Specific examples of the insulating layer generally include an oxide insulating film and a nitride film, containing one or more metals selected from the group consisting of Al, Si, Sc, Ti, V, Cr, Ni, Cu, Zn, Ga, Ge, Y, Zr, Nb, Mo, Tc, Ru, Rh, Pd, Ag, Cd, In, Sn, Sb, Te, Hf, Ta, W, Re, Os, Ir, Pt and Au.

Specific examples of the semiconductor layer widely include a Si layer, a GaN layer, a SiC layer, a GaP layer, a GaAs layer, a GaSb layer, an InP layer, an InAs layer, an InSb layer, a ZnS layer, a ZnTe layer, a diamond layer, an oxide semiconductor layer such as $Ga_2O_3$, ZnO and InGaZnO, and an organic semiconductor layer such as pentacene without depending on a single crystal, a polycrystal and an amorphous crystalline state.

Specific examples of the dielectric layer include a lithium niobate layer, a lithium tantalate layer, a zinc oxide layer, a crystal substrate layer, a sapphire layer, a $BaTiO_3$ layer, a $Pb(Zr,Ti)O_3$ (PZT) layer, a $(Pb,La)(Zr,Ti)O_3$ (PLZT) layer, a $Pb(Zr,Ti,Nb)O_3$ (PZTN) layer, a $Pb(Ni,Nb)O_3$—$PbTiO_3$ (PNN-PT) layer, a $Pb(Ni,Nb)O_3$—$PbZnO_3$ (PNN-PZ) layer, a $Pb(Mg,Nb)O_3$—$PbTiO_3$ (PMN-PT) layer, an $SrBi_2Ta_2O_9$ (SBT) layer, a $(K,Na)TaO_3$ layer, a $(K,Na)NbO_3$ layer, a $BiFeO_3$ layer, a $Bi(Nd,La)TiO_x$ layer (x=2.5 to 3.0), a HfSiO (N) layer, a $HfO_2$—$Al_2O_3$ layer, a $La_2O_3$ layer and a $La_2O_3$—$Al_2O_3$ layer.

Specific examples of the film of the protective film layer include a film having excellent insulation properties and low permeability of water or the like, irrespective of an inorganic substance or an organic substance. Specific examples of the protective film layer include a $SiO_2$ layer, a $SiN_x$ layer (x=1.20 to 1.33), a SiON layer and an $Al_2O_3$ layer.

Specific examples of the stress buffering layer include an AlGaN layer.

Specific examples of the light shielding layer include a black matrix layer containing a metal, a metal-organic substance or the like, and a color filter layer.

Specific examples of the electron or hole injection layer include an oxide semiconductor layer and an organic semiconductor layer.

Specific examples of the electron or hole transport layer include an oxide semiconductor layer and an organic semiconductor layer.

Specific examples of the emission layer include an inorganic semiconductor layer and an organic semiconductor layer.

Specific examples of the electron or hole blocking layer include an oxide semiconductor layer.

Specific examples of the substrate include a power generating device, a light-emitting device, a sensor, a power conversion device, a calculation device, a protection device, an optoelectronics device, a display, a memory, a semiconductor device having a back end of line, and a storage device.

The layer of the layer structure may be a monolayer or two or more layers.

The withstand voltage of the structure according to the invention when reverse voltage is applied is preferably 0.5 MV/cm or more, and more preferably 0.6 to 5.0 MV/cm. Thus, the device having high withstand voltage is easily designed.

Moreover, a variation of the withstand voltage is preferably 0.1 MV/cm or less.

The withstand voltage can be calculated by measuring breakdown voltage when reverse voltage is applied, and dividing the breakdown voltage by the film thickness of the metal oxide semiconductor layer, for example. The variation of the withstand voltage is taken as a standard deviation of the withstand voltage of 50 or more points measured on the same substrate in the same process, for example.

In the structure according to the invention, when reverse bias of 0.2 MV/cm is applied, the current density reaches preferably $1\times10^{-6}$ A/cm$^2$ or less, and more preferably $1\times10^{-7}$ to $1\times10^{-13}$ A/cm$^2$. Thus, the device having low leakage and low noise is easily designed.

In the structure according to the invention, the current density preferably reaches 1000 A/cm$^2$, and more preferably reaches 5000 to 100,000 A/cm$^2$ at forward bias of 5 V or less. Thus, the device having low resistance is easily designed.

A method for forming each layer is not particularly limited, and can be performed using: a CVD process such as a thermal CVD process, a catalytic chemical (CAT)-CVD process, a photo-assisted CVD process, a mist CVD process, a metal organic (MO)-CVD process and a plasma CVD process; a method for forming a film of atom level control, such as MBE and an atomic layer deposition (ALD) apparatus; a physical vapor deposition (PVD) process such as ion plating, ion beam sputtering, magnetron sputtering, DC sputtering and pulse sputtering; a conventionally-known method using a ceramic step, such as a doctor blade process, an injection process, an extrusion process, a hot working process, a sol gel process and an aerosol deposition process; a wet process such as an application process, a spin coating process, a printing process, a spray process, an electrodeposition process, a plating process and a micelle electrolytic process; or the like.

A method for forming the noble metal oxide layer is not particularly limited, and a method for performing reactive sputtering to a desired metal target can be preferably used under an atmosphere into which oxygen is incorporated.

A method for forming the metal oxide semiconductor layer is not particularly limited, and sputtering is preferable.

As a forming (introduced) gas for the metal oxide semiconductor layer, at least one or more kinds of a rare gas, oxygen, hydrogen, and water are preferably selected. Examples of the rare gas include Ar, and He.

The metal oxide semiconductor layer is preferably formed under an atmosphere into which hydrogen or water is introduced. Thus, the metal oxide semiconductor layer can be randomly oriented.

As an atmosphere of forming the noble metal oxide layer, 50% or more (more preferably, 70 to 100%) of an introduced gas flow rate is preferably oxygen. Thus, a stable noble metal oxide layer can be formed, and stability of the Schottky barrier can be improved.

A distance between the sputtering target and the substrate (TS interval) is preferably 10 mm to 200 mm. The case where the TS interval is less than 10 mm has a risk of being unable to cause discharging. The case where the TS interval is more than 200 mm results in producing coarse film quality of the semiconductor to have a risk of forming the film having a large characteristic temperature.

After forming the noble metal oxide layer and the metal oxide semiconductor layer, the films are preferably annealed. An annealing temperature is preferably 220 to 500° C., and more preferably, 250 to 450° C. Thus, reliability and stability resulting from the metal oxide semiconductor layer can be improved.

The noble metal oxide layer and the metal oxide semiconductor layer are preferably continuously formed by sputtering; or a space between formation of the noble metal oxide layer and formation of the metal oxide semiconductor layer is preferably adjusted to vacuum or an inert atmosphere.

Thus, the structure can be manufactured in a state in which cleanliness of the interface is kept.

Examples of the inert atmosphere include an atmosphere of Ar, and $N_2$. Vacuum preferably has pressure equal to or less than 1/100 of atmospheric pressure, and more preferable has pressure of about back pressure of a sputtering chamber. A plasma treatment or the like may be included in the process to the extent that the carbon concentration at the interface between the noble metal oxide layer and the metal oxide semiconductor layer is not increased.

Thus, a stable Schottky interface can be formed.

FIG. 1 is a cross-sectional view schematically showing one embodiment of a structure according to the invention.

In FIG. 1, in a structure 1, a low-resistance base metal layer 20, a noble metal layer 30, a noble metal oxide layer 40, a metal oxide semiconductor layer 50, a first ohmic electrode layer 60, and a second ohmic electrode layer 61 are laminated on a substrate 10 in this order.

The first ohmic electrode layer 60 and the second ohmic electrode layer 61 may be long in consideration of drawing in a transverse direction.

When the substrate 10 is an insulating substrate or a semiconductor substrate, the low-resistance base metal layer 20 and the noble metal layer 30 may be long in consideration of drawing in the transverse direction. When the substrate 10 is a conductive substrate, the substrate 10 may have an extraction electrode layer on a rear surface of the substrate 10. The extraction electrode layer may be formed in one layer and two or more layers. The extraction electrode on the rear surface of the substrate 10 is desirably metal from a viewpoint of conductivity.

Moreover, the structure may have an interlayer insulating film for electrically insulating between respective layers. Each layer may have a step in the transverse direction depending on the method of forming the interlayer insulating film. Part between respective layers may be short-circuited, and a remainder may be insulated by the interlayer insulating film.

An area in which the first ohmic electrode layer 60 is in contact with the metal oxide semiconductor layer 50 preferably is not extended to an end of the metal oxide semiconductor layer 50. Further, the area in which the first ohmic electrode layer 60 is in contact with the metal oxide semiconductor layer 50 preferably is not extended to the end of the metal oxide semiconductor layer 50, and, when viewed from a direction perpendicular to a laminated surface, an end of the area in which the first ohmic electrode layer 60 is in contact with the metal oxide semiconductor layer 50 preferably exists on an inner side relative to an end of an area in which the noble metal oxide layer 40 is in contact with the metal oxide semiconductor layer 50. If the above-described arrangement is formed, leak current can be further suppressed.

FIGS. 2 to 9 each is a diagram schematically showing another embodiment of the structure according to the invention.

Figure 2:
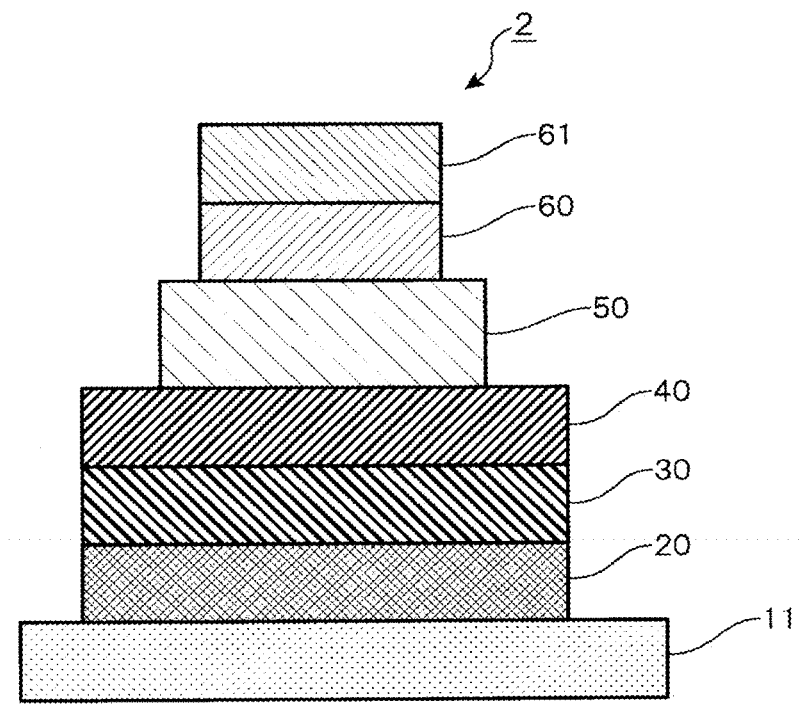
FIG. 2 is a cross-sectional view schematically showing another embodiment of the structure according to the invention.

In FIG. 2, in a structure 2, a low-resistance base metal layer 20, a noble metal layer 30, a noble metal oxide layer 40, a metal oxide semiconductor layer 50, a first ohmic electrode layer 60, and a second ohmic electrode layer 61 are laminated on a conductive substrate 11 in this order.

The first ohmic electrode layer 60 and the second ohmic electrode layer 61 may be long in consideration of drawing in the transverse direction.

Figure 3:
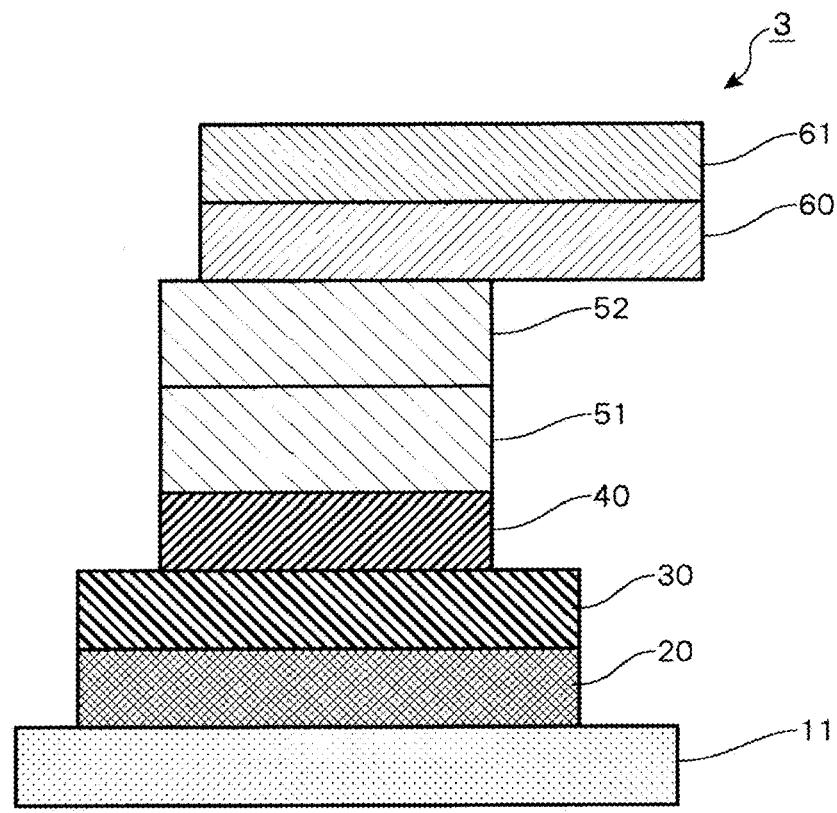
FIG. 3 is a cross-sectional view schematically showing another embodiment of the structure according to the invention.

In FIG. 3, in a structure 3, a low-resistance base metal layer 20, a noble metal layer 30, a noble metal oxide layer 40, a first metal oxide semiconductor layer 51, a second metal oxide semiconductor layer 52, a first ohmic electrode layer 60, and a second ohmic electrode layer 61 are laminated on a conductive substrate 11 in this order.

The first ohmic electrode layer 60 and the second ohmic electrode layer 61 may be long in consideration of drawing in the transverse direction.

Figure 4:
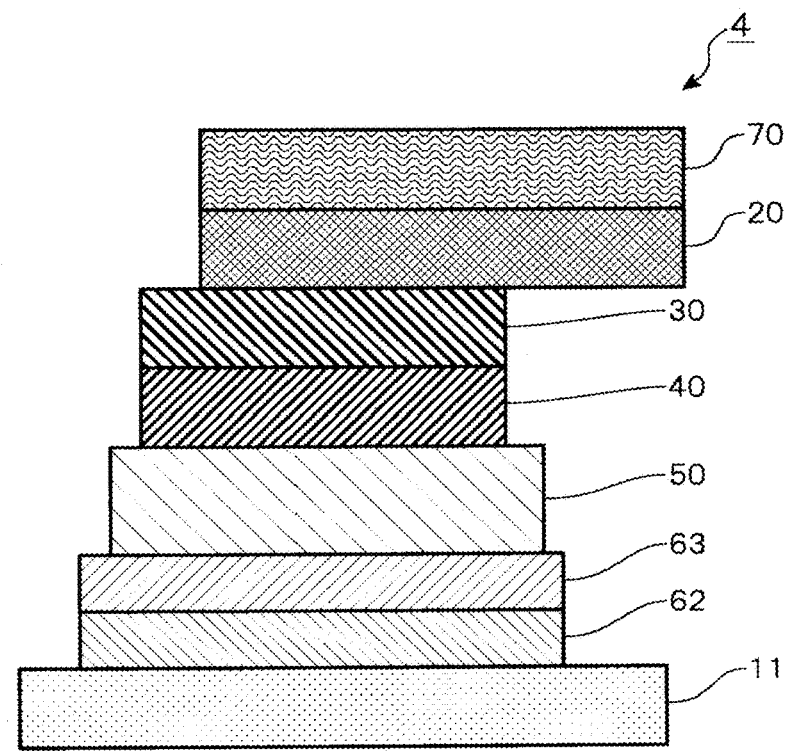
FIG. 4 is a cross-sectional view schematically showing another embodiment of the structure according to the invention.

In FIG. 4, in a structure 4, a first ohmic electrode layer (junction layer) 62, a second ohmic electrode layer (contact metal layer) 63, a metal oxide semiconductor layer 50, a noble metal oxide layer 40, a noble metal layer 30, a low-resistance base metal layer 20, and a cap metal 70 are laminated on a conductive substrate 11 in this order.

The low-resistance base metal layer 20 and the cap metal 70 may be long in consideration of drawing in the transverse direction.

Figure 5:
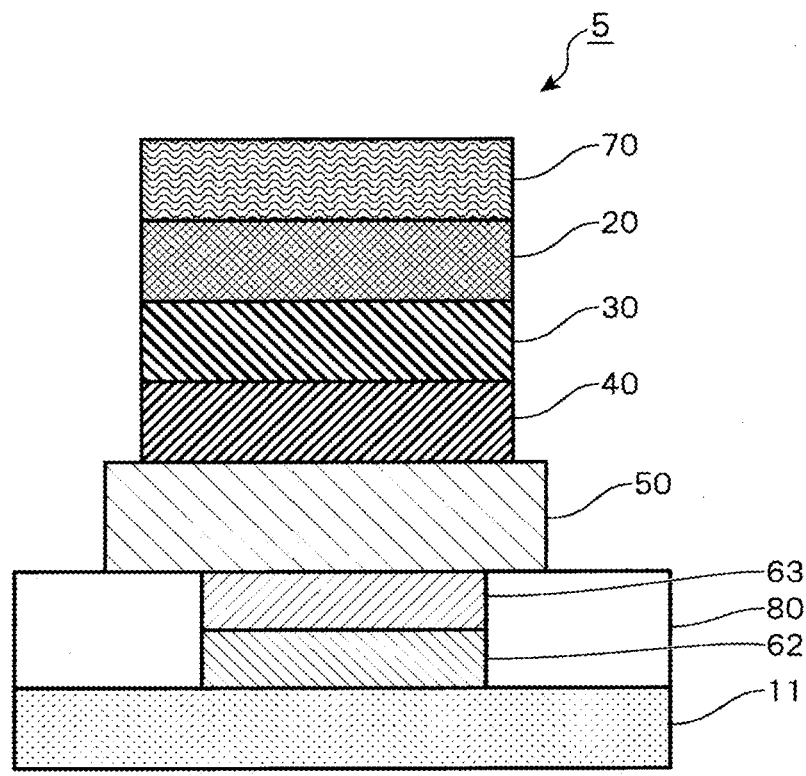
FIG. 5 is a cross-sectional view schematically showing another embodiment of the structure according to the invention.

In FIG. 5, in a structure 5, a first ohmic electrode layer (junction layer) 62, a second ohmic electrode layer (contact metal layer) 63, a metal oxide semiconductor layer 50, a noble metal oxide layer 40, a noble metal layer 30, a low-resistance base metal layer 20, and a cap metal 70 are laminated on a conductive substrate 11 in this order. It should be noted that a part without the first ohmic electrode layer (junction layer) 62 and the second ohmic electrode layer (contact metal layer) 63, between the conductive substrate 11 and the metal oxide semiconductor layer 50, is filled with an interlayer insulating film 80; an area in which the second ohmic electrode layer 63 is in contact with the metal oxide semiconductor layer 50 is not extended to an end of the metal oxide semiconductor layer 50, and when viewed from the direction perpendicular to the laminated surface, an end of an area in which the second ohmic electrode layer 63 is in contact with the metal oxide semiconductor layer 50 exists on an inner side relative to an end of an area in which the noble metal oxide layer 40 is in contact with the metal oxide semiconductor layer 50.

The low-resistance base metal layer 20 and the cap metal 70 may be long in consideration of drawing in the transverse direction.

Figure 6:
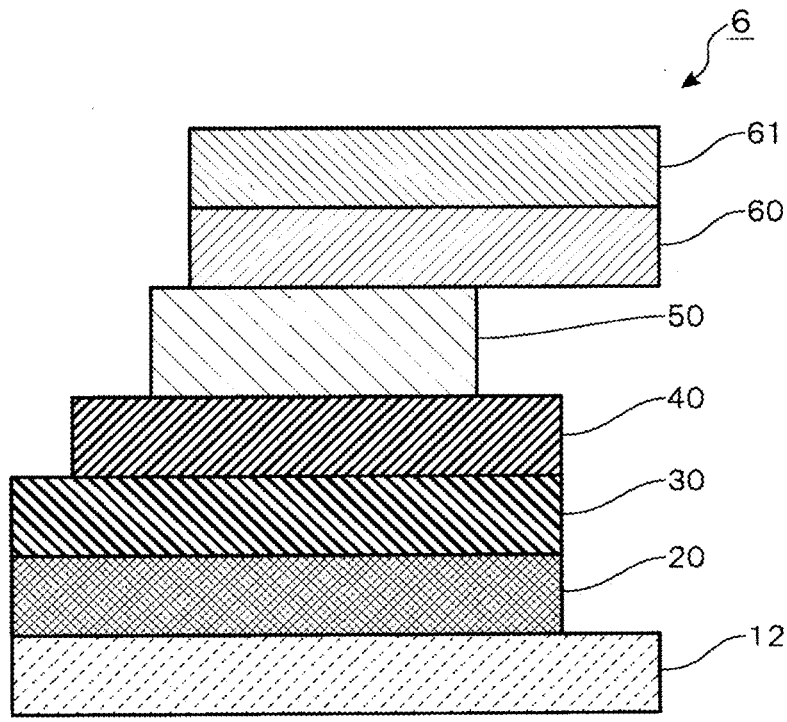
FIG. 6 is a cross-sectional view schematically showing another embodiment of the structure according to the invention.

In FIG. 6, in a structure 6, a low-resistance base metal layer 20, a noble metal layer 30, a noble metal oxide layer 40, a metal oxide semiconductor layer 50, a first ohmic electrode layer 60, and a second ohmic electrode layer 61 are laminated on a glass substrate 12 in this order.

The first ohmic electrode layer 60 and the second ohmic electrode layer 61 may be long in consideration of drawing in the transverse direction.

Figure 7:
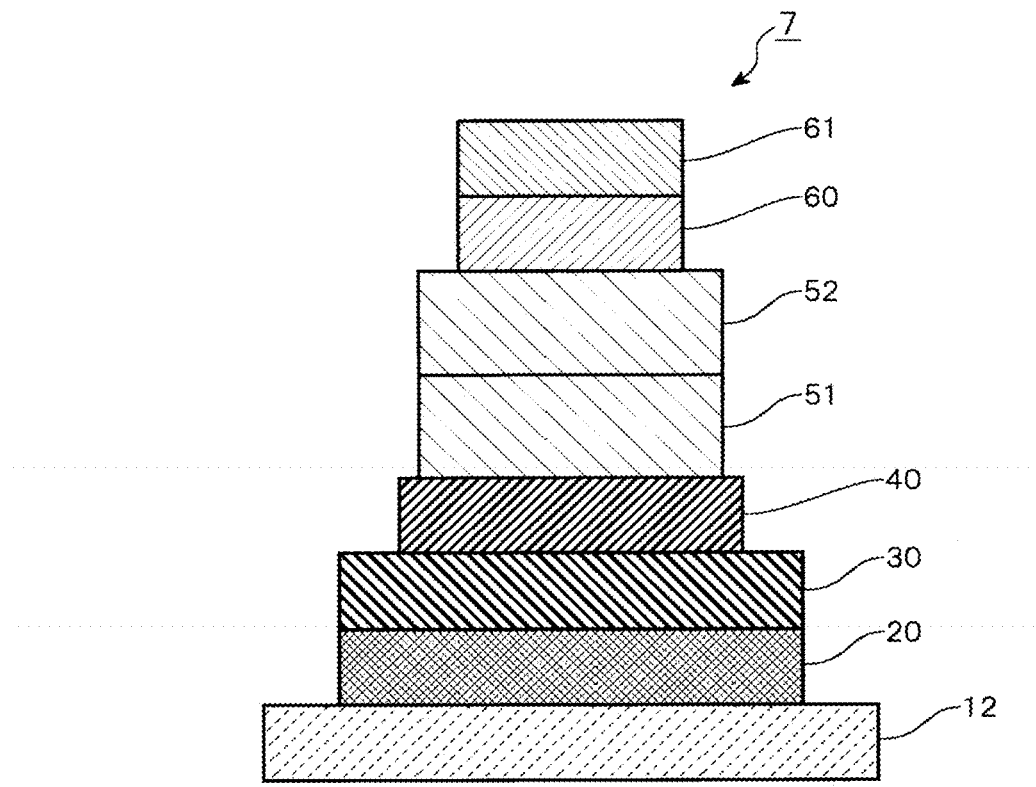
FIG. 7 is a cross-sectional view schematically showing another embodiment of the structure according to the invention.

In FIG. 7, in a structure 7, a low-resistance base metal layer 20, a noble metal layer 30, a noble metal oxide layer 40, a first metal oxide semiconductor layer 51, a second metal oxide semiconductor layer 52, a first ohmic electrode layer 60, and a second ohmic electrode layer 61 are laminated on a glass substrate 12 in this order.

The first ohmic electrode layer 60 and the second ohmic electrode layer 61 may be long in consideration of drawing in the transverse direction.

Figure 8:
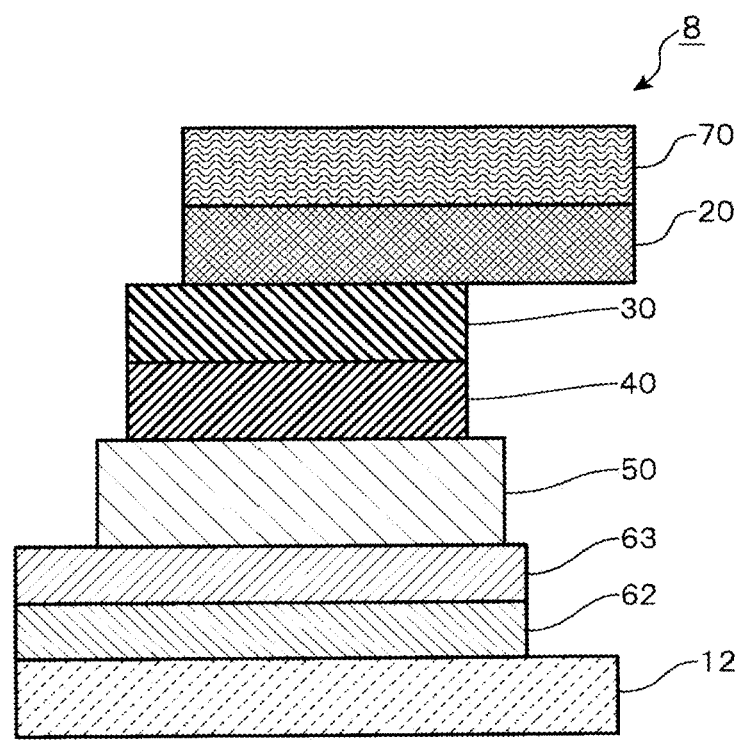
FIG. 8 is a cross-sectional view schematically showing another embodiment of the structure according to the invention.

In FIG. 8, in a structure 8, a first ohmic electrode layer (junction layer) 62, a second ohmic electrode layer (contact metal layer) 63, a metal oxide semiconductor layer 50, a noble metal oxide layer 40, a noble metal layer 30, a low-resistance base metal layer 20, and a cap metal 70 are laminated on a glass substrate 12 in this order.

The low-resistance base metal layer 20 and the cap metal 70 may be long in consideration of drawing in the transverse direction.

Figure 9:
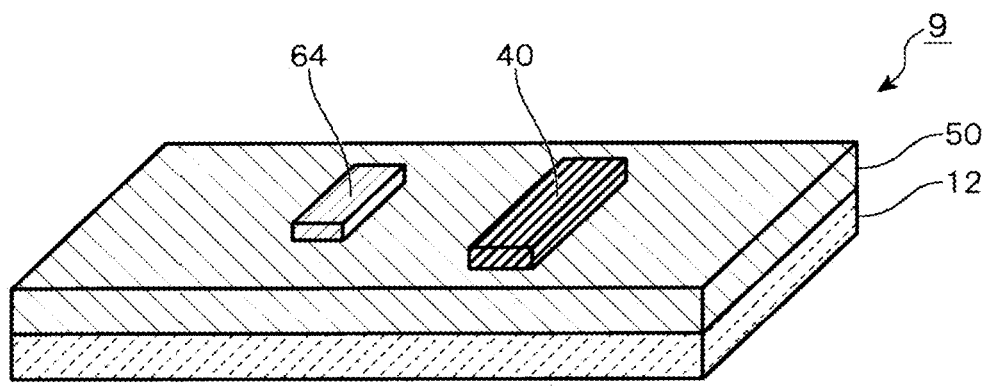
FIG. 9 is a cross-sectional view schematically showing another embodiment of the structure according to the invention.

In FIG. 9, in a structure 9, a metal oxide semiconductor layer 50 is laminated on a glass substrate 12, and a noble metal oxide layer 40 and an ohmic electrode layer 64 are arranged on the metal oxide semiconductor layer 50 at intervals.

Figure 10A:
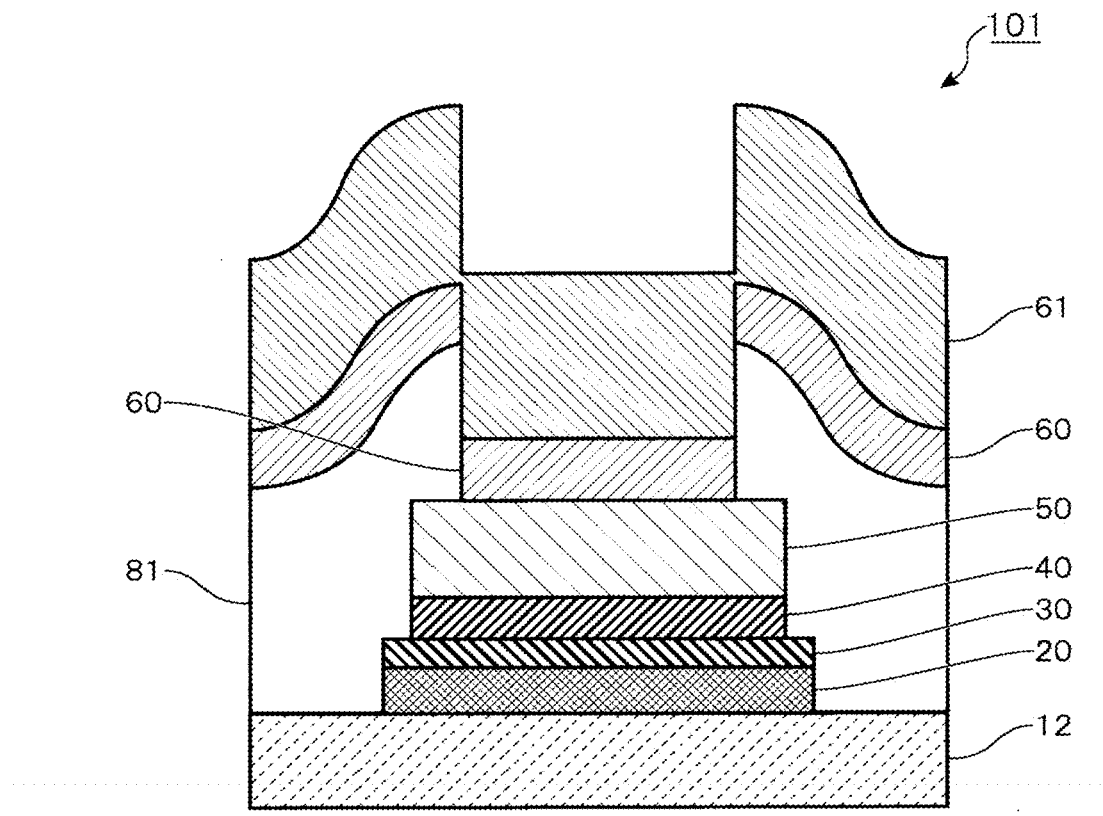
FIG. 10A is a cross-sectional view schematically showing another embodiment of the structure according to the invention.
Figure 10B:
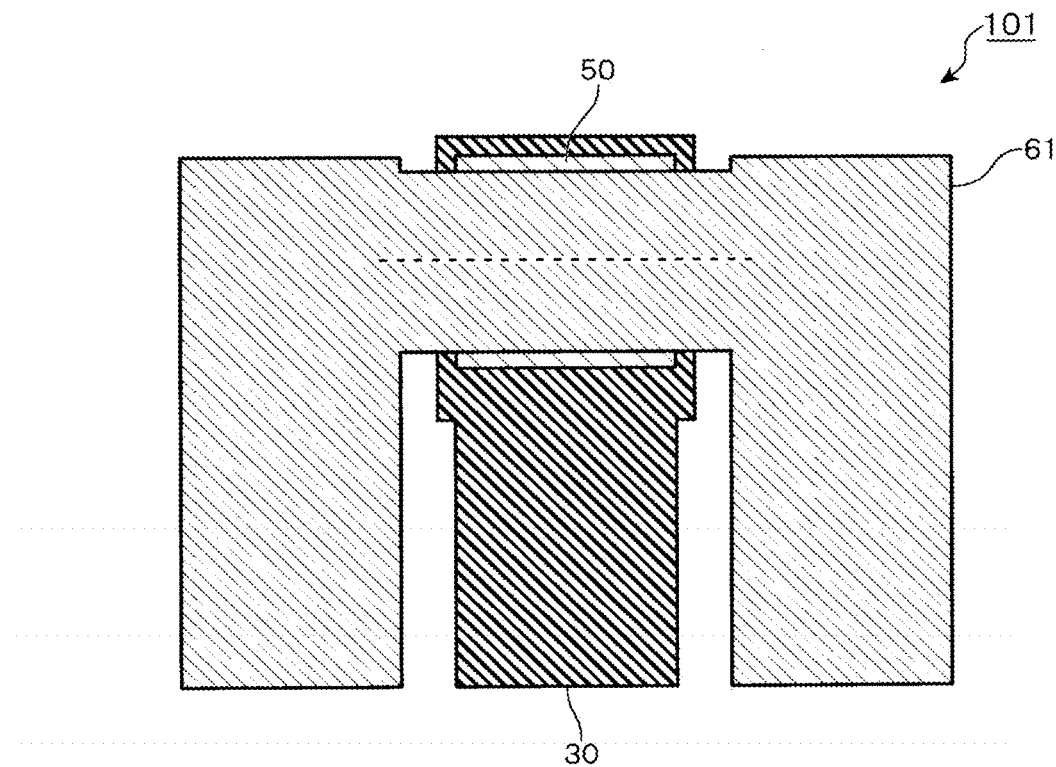
FIG. 10B shows a plan view schematically showing another embodiment of the structure according to the invention.
Figure 10C:
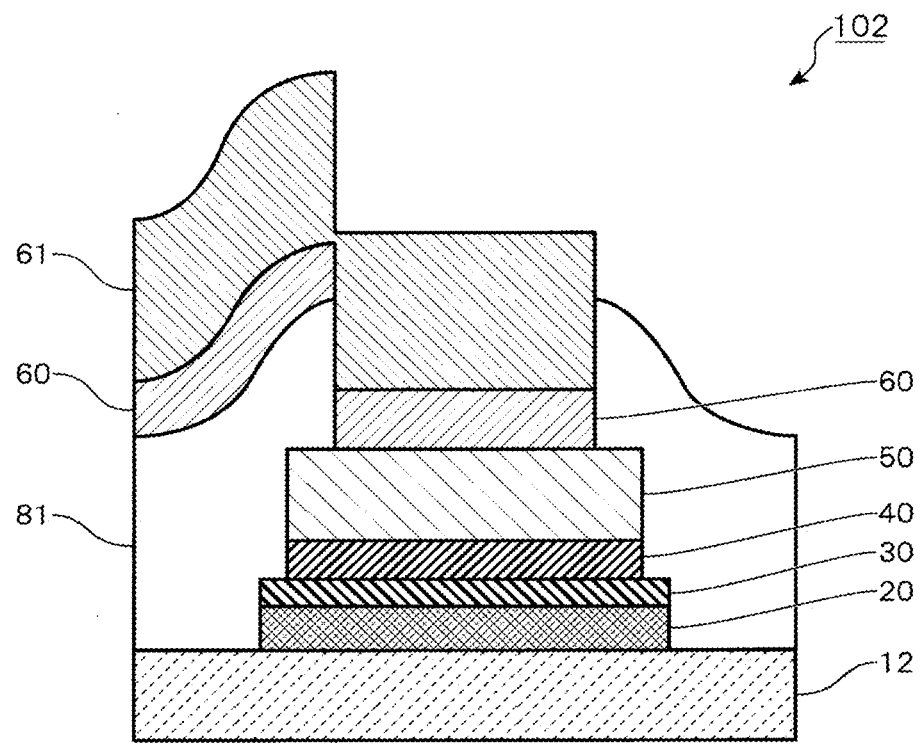
FIG. 10C is a cross-sectional view schematically showing another embodiment of the structure according to the invention.
Figure 10D:
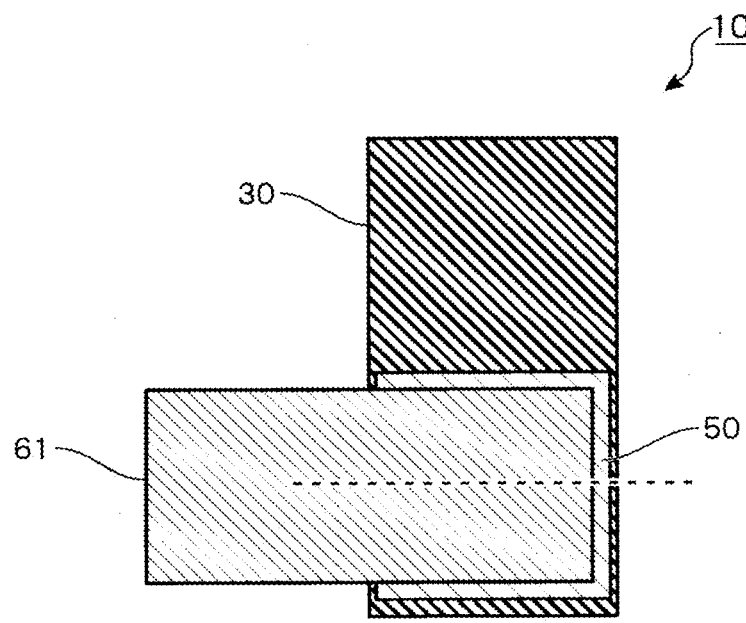
FIG. 10D shows a plan view schematically showing another embodiment of the structure according to the invention.
Figure 10E:
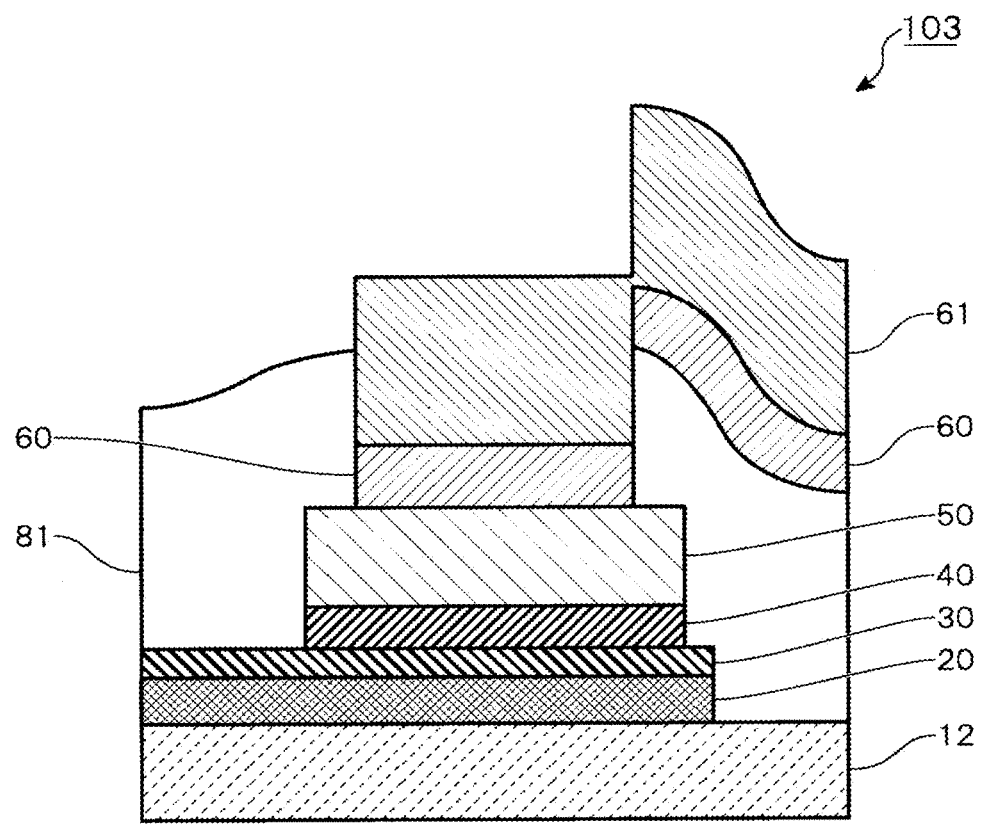
FIG. 10E is a cross-sectional view schematically showing another embodiment of the structure according to the invention.
Figure 10F:
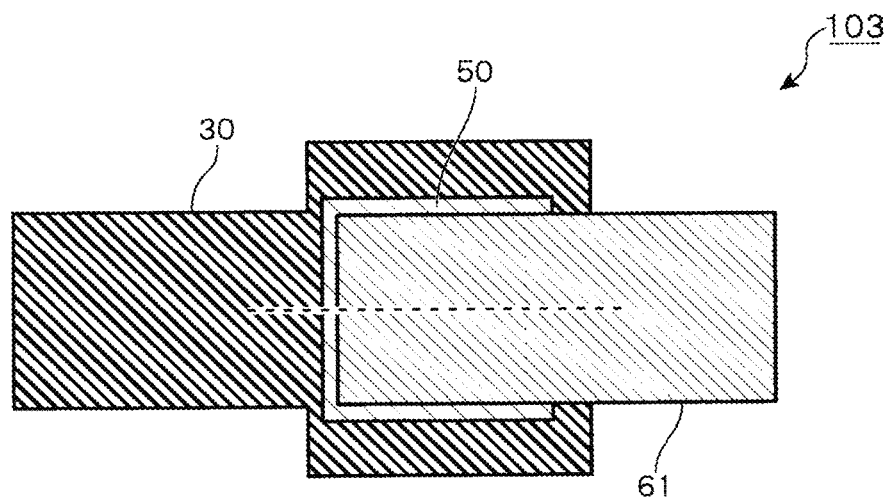
FIG. 10F shows a plan view schematically showing another embodiment of the structure according to the invention.

FIGS. 10A, 10C, and 10E each are a cross-sectional view schematically showing another embodiment of the structure according to the invention, and FIGS. 10B, 10D, and 10F each are a plan view schematically showing another embodiment of the structure according to the invention.

FIG. 10A is a cross-sectional view schematically showing another embodiment of the structure according to the invention, and FIG. 10B is a plan view of FIG. 10A in which a substrate and polyimide are excluded.

As shown in FIG. 10A, in a structure 101, a low-resistance base metal layer 20, a noble metal layer 30, a noble metal oxide layer 40, and a metal oxide semiconductor layer 50 are laminated on a glass substrate 12 in this order. After polyimide 81 is formed, the polyimide 81 is opened, and further a first ohmic electrode layer 60 and a second ohmic electrode layer 61 are laminated in this order.

FIG. 10B is a plan view excluding the glass substrate 12 and the polyimide 81 of FIG. 10A, and FIG. 10A shows a cross-sectional view of a part of a dashed line in FIG. 10B.

FIG. 10C is a cross-sectional view schematically showing another embodiment of the structure according to the invention, and FIG. 10D is a plan view of FIG. 10C in which a substrate and polyimide are excluded.

As shown in FIG. 10C, in a structure 102, a low-resistance base metal layer 20, a noble metal layer 30, a noble metal oxide layer 40, and a metal oxide semiconductor layer 50 are laminated on a glass substrate 12 in this order. After polyimide 81 is formed, the polyimide 81 is opened, and further a first ohmic electrode layer 60 and a second ohmic electrode layer 61 are laminated in this order.

FIG. 10D is a plan view excluding the glass substrate 12 and the polyimide 81 in FIG. 10C, and FIG. 10D shows a cross-sectional view of a part of a dashed line in FIG. 10D.

FIG. 10E is a cross-sectional view schematically showing another embodiment of the structure according to the invention, and FIG. 10F is a plan view of FIG. 10E in which a substrate and polyimide are excluded.

As shown in FIG. 10E, in a structure 103, a low-resistance base metal layer 20, a noble metal layer 30, a noble metal oxide layer 40, and a metal oxide semiconductor layer 50 are laminated on a glass substrate 12 in this order. After polyimide 81 is formed, the polyimide 81 is opened, and further a first ohmic electrode layer 60 and a second ohmic electrode layer 61 are laminated in this order.

FIG. 10F is a plan view excluding the glass substrate 12 and the polyimide 81 in FIG. 10E, and FIG. 10E shows a cross-sectional view of a part of a dashed line in FIG. 10F.

The elements from FIGS. 1 to 10 can also be connected in multi-stage and used. Two or more same elements are arranged on a surface within a substrate surface, and one noble metal oxide layer is configured to be electrically connected in series to the other ohmic electrode, in which such a circuit design can also be formed, in which applied voltage can be distributed to each element. Moreover, a circuit configuration in which one ohmic electrode is connected to the other ohmic electrode can also be used. In addition thereto, a circuit configuration in which one noble metal oxide layer is electrically connected to the other noble metal oxide layer can also be formed. The elements and the circuit configurations as described above can be connected in a plurality of stages in parallel to each other and used. Connections of the elements are combined, whereby adjustment of threshold voltage upon applying voltage, adjustment of the withstand voltage, waveform separation or the like can be achieved.

The structure according to the invention can be used for a semiconductor element such as a power semiconductor element, a (rectifier) diode element, a Schottky barrier diode element, an electrostatic discharge (ESD) protection diode, a transient voltage suppressor (TVS) protection diode, a light-emitting diode, a metal-semiconductor field-effect transistor (MESFET), a junction field-effect transistor (JFET), a metal-oxide semiconductor field-effect transistor (MOSFET), a Schottky source/drain MOSFET, an avalanche multiplication photoelectric conversion element, a solid state imaging element, or a solar cell element, an optical sensor element, a touch-sensor element, a display element, a resistive random access memory, a protection element, a power conversion element, and an arithmetic element. In particular, the current can be extracted without power loss, and therefore the structure according to the invention is suitable for power application. The semiconductor element can be used for the Schottky barrier diode, the junction field-effect transistor (JFET), and the field-effect transistor. The electronic circuit using the present element, the Schottky barrier diode, or the junction field-effect transistor can be used for the electrical apparatus, the electronic apparatus, the vehicle, the power engine, and the like.

The structure according to the invention may be combined with a structure having a circuit or a multi-layer structure on the support substrate. In the above case, the structure may be used as part of a power generation device, a light-emitting device, a sensor, a power conversion device, an arithmetic device, a protection device, optoelectronics, a display, and a memory, or a combination thereof.

Examples of the structure having the circuit or the multi-layer structure on the substrate include a back end of line structure having multi-layer wiring on a Si substrate, a resistive random access memory, and a logic IC. Moreover, the present structure may be combined with a high-frequency device formed on the dielectric substrate.

EXAMPLES

Example 1

An n-type Si substrate having electrical resistivity of 1 mΩ·cm (diameter: 4 inches, P doped) was mounted onto Sputtering System CS-200 (made by ULVAC, Inc.), and an atmosphere was vacuumed. A film of Ti was formed at a thickness of 15 nm as a low-resistance base metal layer. Film forming conditions were set to: DC 300 W, 0.5 Pa, for 100 seconds under an Ar atmosphere.

Subsequently, a film of Pd was formed at a thickness of 50 nm as a noble metal layer. Film forming conditions were set to: DC 300 W, 0.5 Pa, for 60 seconds under an Ar atmosphere.

Next, a film of PdO was formed at a thickness of 40 nm as a noble metal oxide layer. Film forming conditions were set to: DC 300 W, 0.5 Pa, for 270 seconds under an $O_2$ atmosphere (100% oxygen in an introduced gas flow rate).

A film of a metal oxide semiconductor InGaZnO(1:1:1) was formed at a thickness of 200 nm as a metal oxide semiconductor layer. Film forming conditions were set to: DC 300 W, 0.5 Pa, for 780 seconds under a mixed gas atmosphere of Ar 99% and $H_2O$ 1%.

Film formation from the low-resistance base metal layer to the metal oxide semiconductor layer was performed by using three types of 4 inch targets set to CS-200, mounting the n-type Si substrate thereonto, and vacuuming the atmosphere, and then a film was consistently formed without extracting the substrate.

After film formation, the substrate was extracted, and annealed for one hour at 300° C. in air by using an electric furnace. The substrate was again set to CS-200 together with an area mask (for forming a film having a diameter of 500 μm), and then Mo as a first ohmic electrode layer and Au as a second ohmic electrode layer were laminated at a thickness of 150 nm, and a thickness of 500 nm, respectively, and the film was formed (the first ohmic electrode layer and the second ohmic electrode layer are collectively referred to as an ohmic electrode layer) to obtain an element (structure). Film forming conditions were set to: DC 100 W, and 0.5 Pa under the Ar atmosphere.

It should be noted that a film of Ti was formed on a rear surface at a thickness of 100 nm as an extraction electrode for measurement. Film forming conditions were set to: DC 300 W, 0.5 Pa, for 700 seconds under the Ar atmosphere by using CS-200.

It should be noted that the obtained element has the structure shown in FIG. 1.

Figure 11:
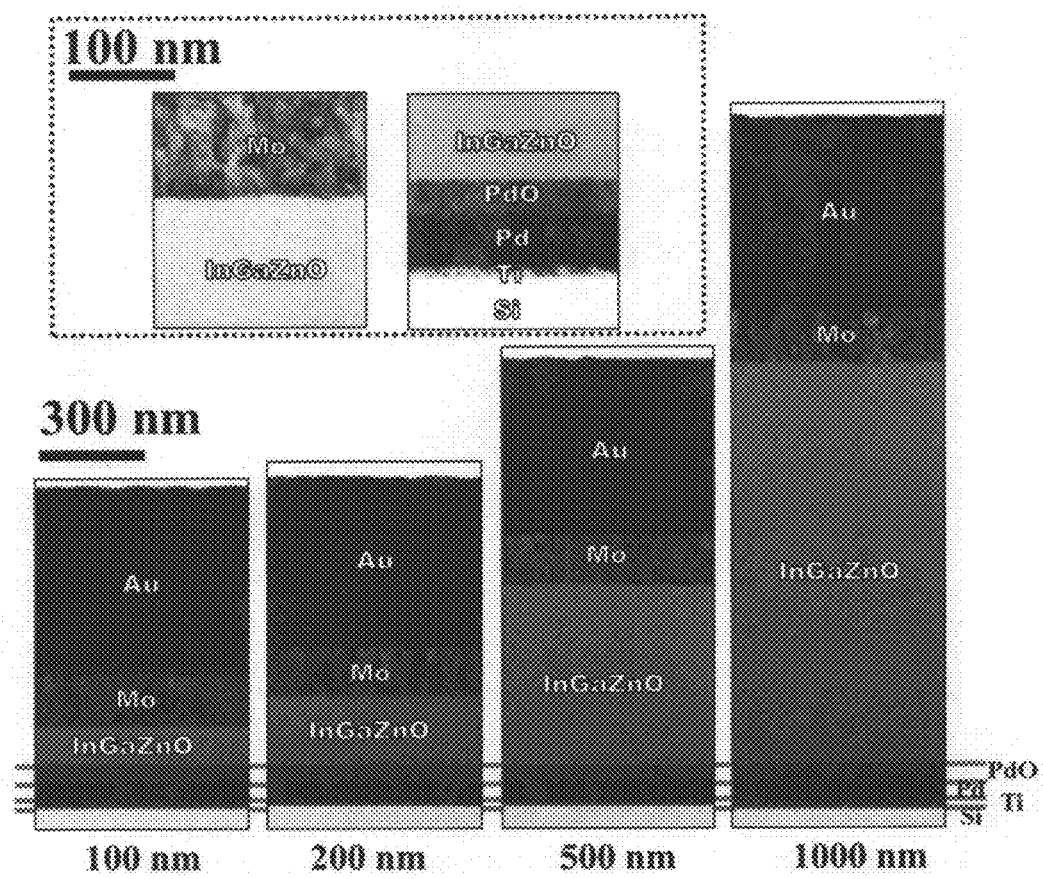
FIG. 11 is diagrams showing cross sectional TEMs of the elements in Examples 1 to 4.

A film thickness of each layer was measured using a cross sectional TEM. The cross sectional TEM of the element in Example 1 is shown in "200 nm" in FIG. 11. The cross sectional TEMs of the elements in Examples 2 to 4 to be described later are shown in "100 nm", "500 nm" and "1000 nm" in FIG. 11, respectively. Dotted line portions in FIG. 11 show enlarged views of an interface between the ohmic electrode layer and the metal oxide semiconductor layer and an interface between the noble metal oxide layer and the metal oxide semiconductor layer in Example 1 (in the case where the metal oxide semiconductor layer having a thickness of 200 nm).

Figure 12:
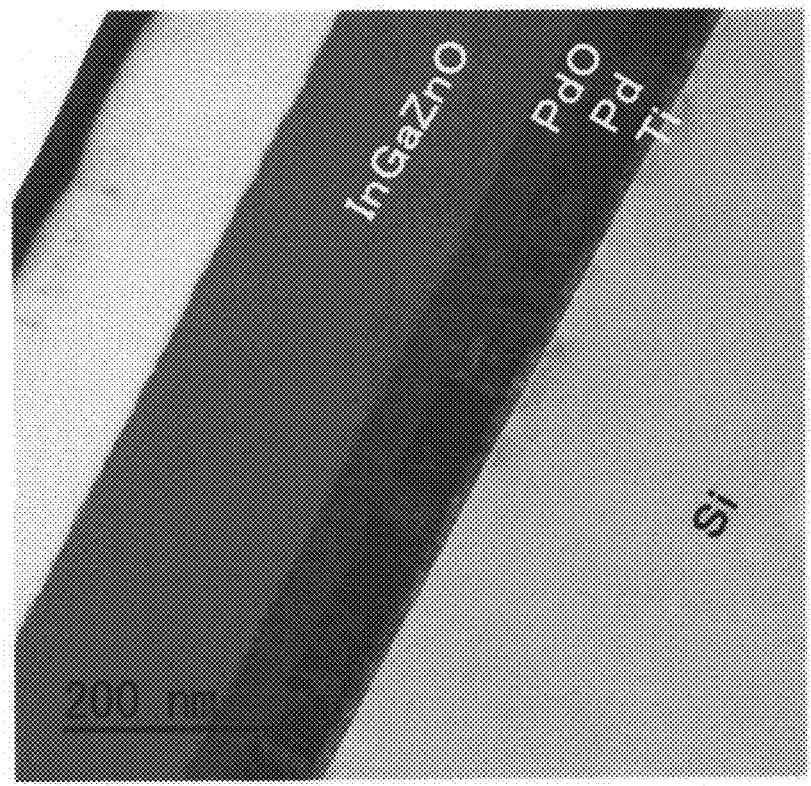
FIG. 12 is an enlarged view showing a cross sectional TEM of the element in Example 1.
Figure 13:
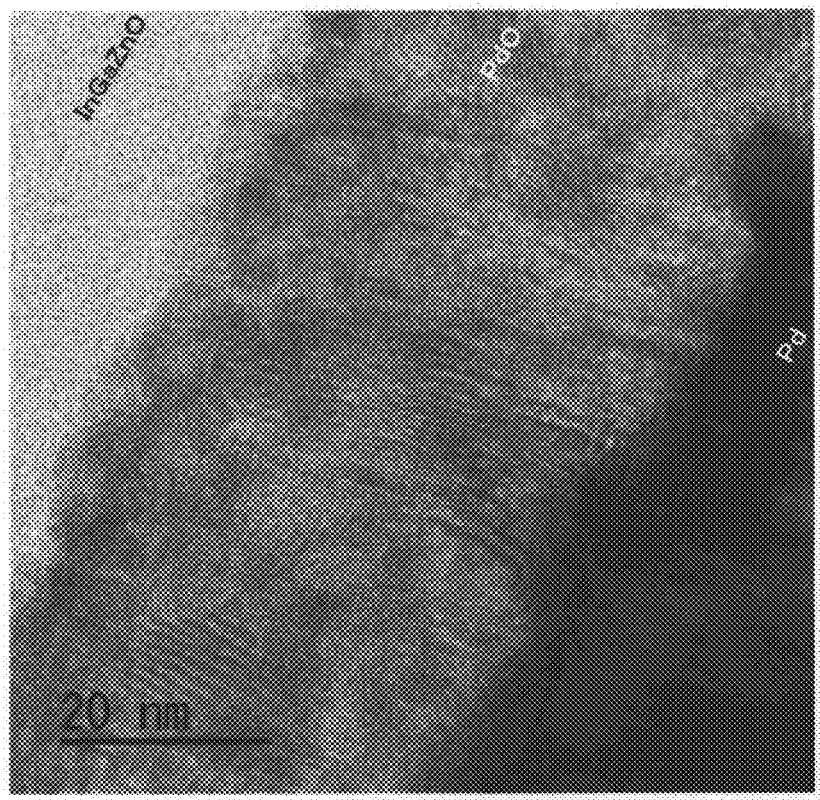
FIG. 13 is an enlarged view showing a cross sectional TEM of the element in Example 1.

It was confirmed that an average crystalline particle diameter in the noble metal oxide layer is equal to or less than a film thickness of the noble metal oxide layer upon measurement of a cross sectional TEM. FIGS. 12 and 13 each show an enlarged view of the cross sectional TEM of the element in Example 1.

CV (capacity-voltage) was measured on the obtained element by using E4980 (made by Keysight Technologies) to determine a depth of a depletion region. As a measurement frequency, 1 kHz was used and AC amplitude was adjusted to 0.03 V.

Figure 14:
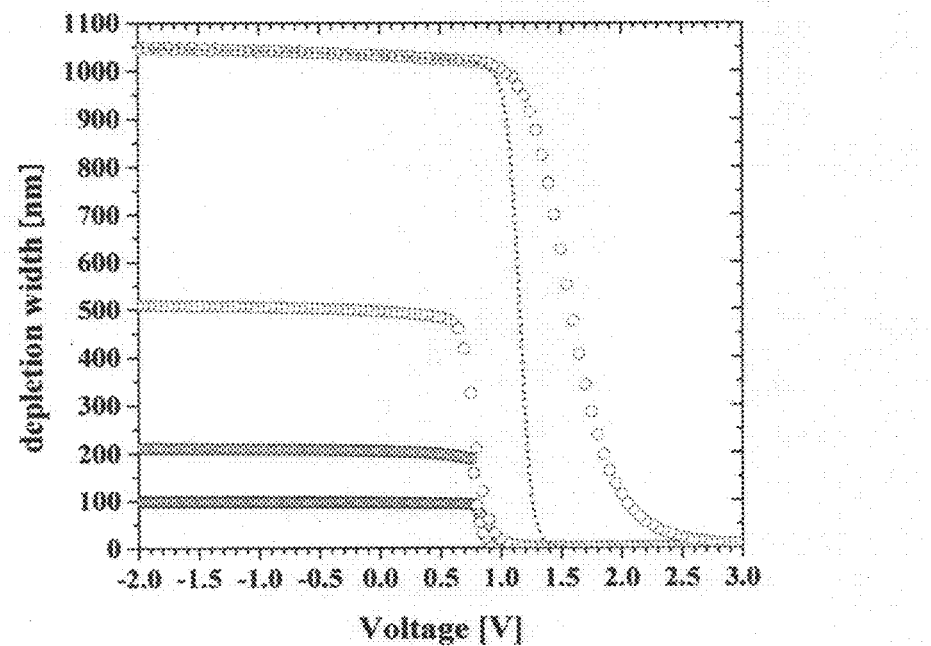
FIG. 14 is a diagram showing the results of CV measurement of the elements in Examples 1 to 4.

FIG. 14 shows the results of CV measurement on the elements in Example 1 and Examples 2 to 4 to be described later.

In FIG. 14, among graphs represented using circles, the bottom graph shows the results of CV measurement on the element in Example 2, and sequentially from the bottom, the results of CV measurement on the element in Example 1, the results of CV measurement on the element in Example 3, and the top graph shows the results of CV measurement on the element in Example 4 are represented.

The depth of the depletion region in Example 1 was 210 nm.

A dashed line represents a change in the depth of the depletion region corresponding to $V_{schottky}$ obtained from FIG. 15 to be described later and the results of temperature dependence. Each parameter was analyzed according to simulation of an SCLC model intervened with an exponential trap, assuming presence of an initial free charrier concentration with reference to J. Appl. Phys., 104, 123706, 2008.

Here, the depth d (nm) of the depletion region was determined from minimum capacity $C_{min}$ when reverse voltage is applied by using a relational formula: $C/A = \varepsilon \times \varepsilon_0 / d$.

C denotes capacity (F), A denotes an effective area (cm$^2$) of an electrode, and ε denotes relative permittivity (16 in the case of InGaZnO(1:1:1)) of a metal oxide semiconductor. The relative permittivity was determined from the CV measurement of film thickness dependence of a sample in which the film thickness is known.

Then, $\varepsilon_0$ denotes permittivity of vacuum (8.854×10$^{-14}$ F/cm).

Here, when viewed from the direction perpendicular to the laminated surface of the element, an effective area A of the electrode represents an area of an overlapped part of the noble metal oxide layer, the metal oxide semiconductor layer, and the ohmic electrode layer. An area of the ohmic electrode layer having a diameter of 500 μm was taken as A.

A carbon concentration in a Schottky interface of the noble metal oxide layer and the metal oxide semiconductor layer was measured on the obtained element by using ADEPT1010 (made by ULVAC-PHI, Inc.) according to SIMS.

C (carbon, mass number: 12) was selected as an element of interest, and the measurement was performed by selecting Cs$^+$ as a primary ion species, at accelerating energy of a primary ion of 3 keV, and secondary ion polarity of Negative. It should be noted that charge compensation was not performed, and mass resolution was set to Normal.

The carbon concentration was quantitatively determined using a ratio of intensity to the carbon concentration in an indium oxide-tin oxide (ITO) standard thin film sample.

The Schottky interface was taken as a place in which a depth profile of an intensity value of GaO in the metal oxide semiconductor layer and a depth profile of an intensity value of PdO in the noble metal oxide layer are crossed, and a maximum value of a C spectrum (depth profile of C) existing within a value ±20 nm thereof was taken as the carbon concentration in the Schottky interface. The results are shown in Table 1.

A Schottky barrier height and an ideality factor of a diode were determined by measuring a forward current by using a semiconductor analyzer B1500 (made by Keysight Technologies) (fine current was measured by Atto Sense Unit (ASU)).

In addition to the measurement at room temperature (25° C.), temperature dependence was measured using a temperature control chuck PA200 (made by Cascade Microtech, Inc.).

In Example 1, when the Schottky barrier height at room temperature was determined using $I_0$ calculated from Cheung's plot and effective mass of 0.3, the Schottky barrier height was 1.2 eV. Moreover, when Anderson' plot was performed from the temperature dependency, and the Schottky barrier height and the Richardson constant were determined, and the values were 1.24 eV and 42 Acm$^{-2}$K$^{-2}$, respectively. The ideality factor of the diode was 1.2.

The values calculated from Cheung's plot as the Schottky barrier height are shown in Table 1.

Figure 15:
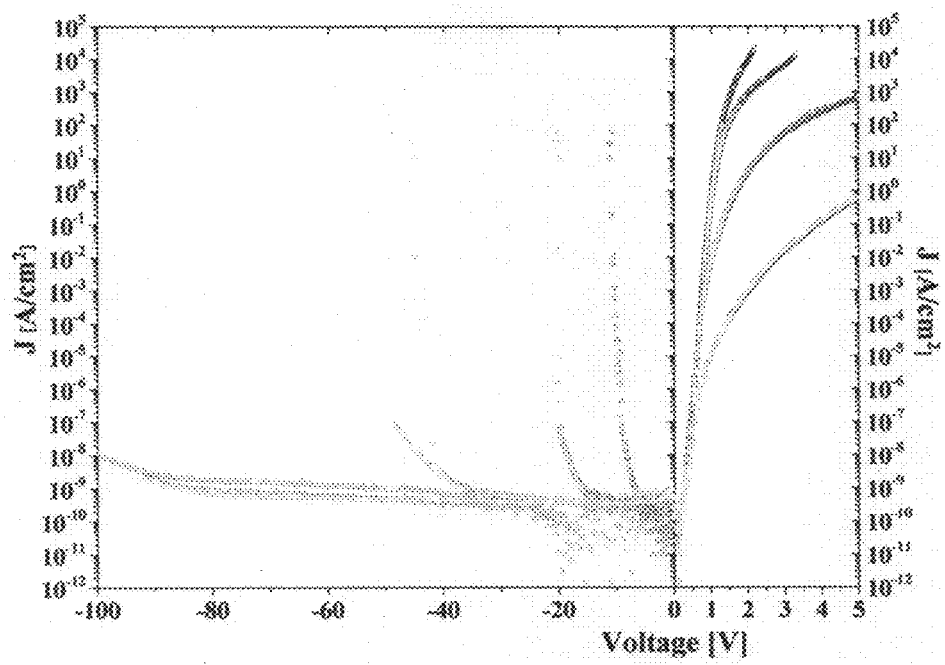
FIG. 15 is a diagram showing the results of evaluation of I-V characteristics (semi-log plot) in Examples 1 to 4.
Figure 16:
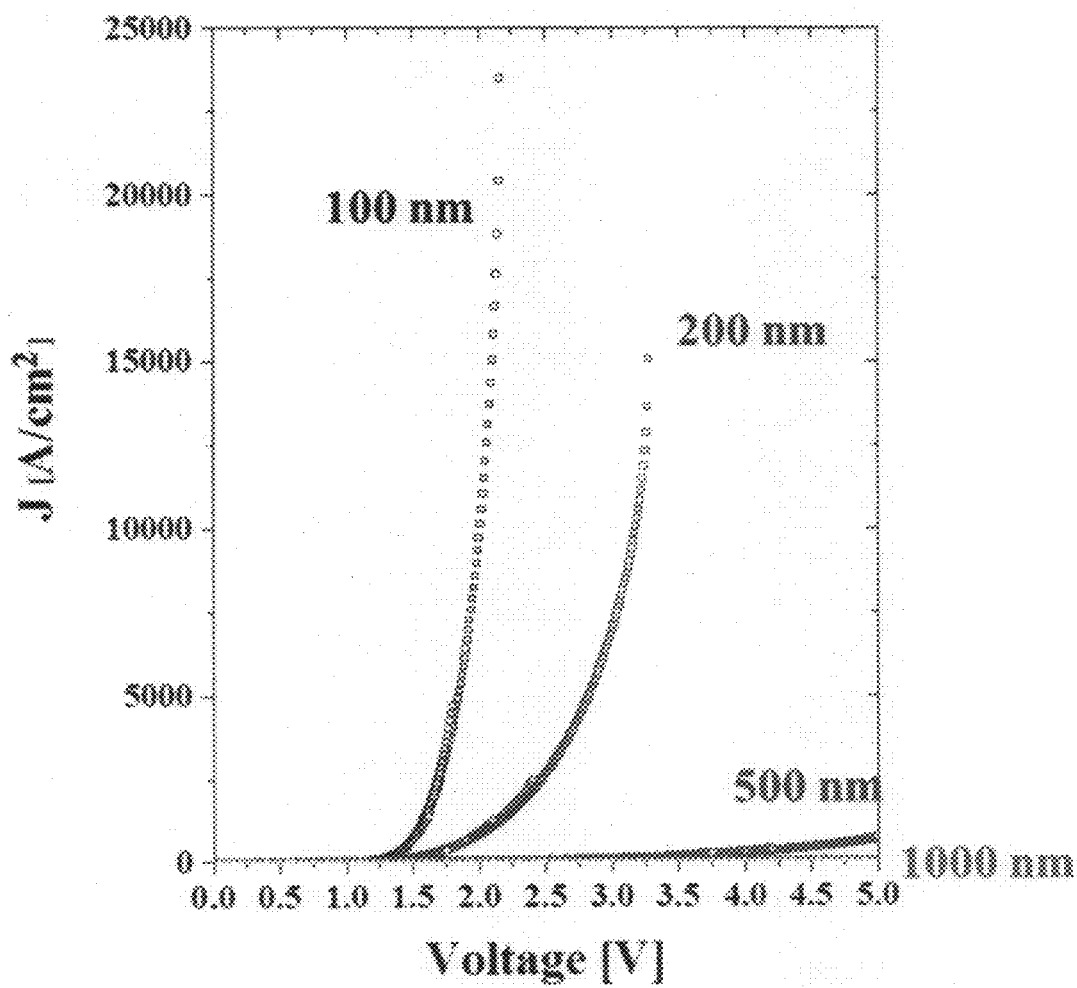
FIG. 16 is a diagram showing the results of evaluation of I-V forward characteristics (linear scale) in Examples 1 to 4.
Figure 17:
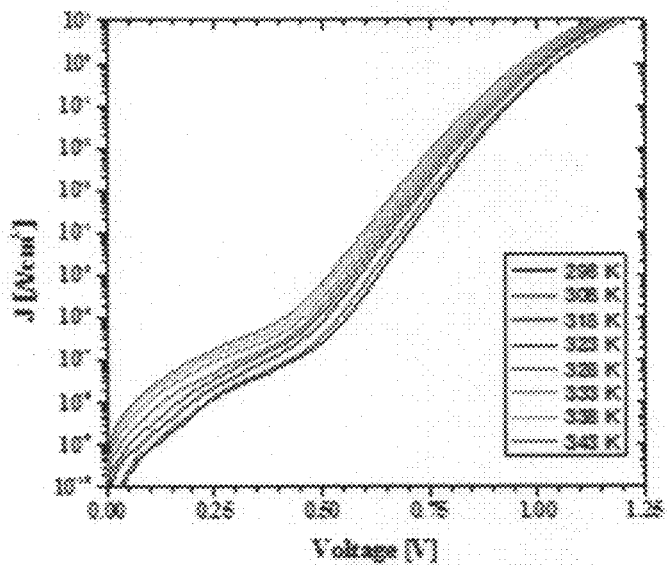
FIG. 17 is a diagram showing the results of evaluation of I-V forward temperature dependence (semi-log plot) in Example 1.
Figure 18:
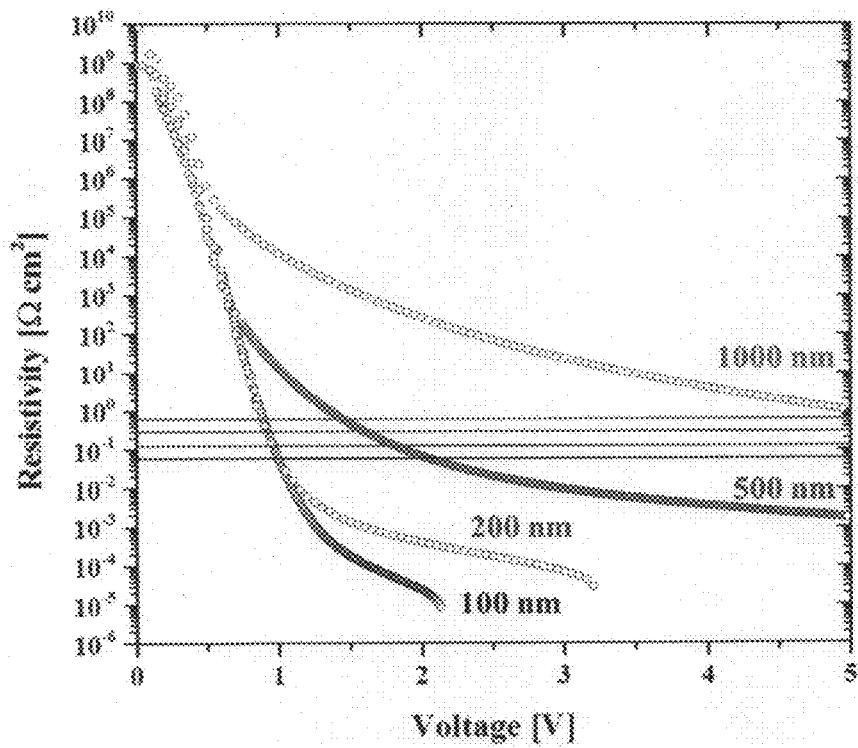
FIG. 18 is a diagram showing the results of evaluation of differential resistance (semi-log plot) in Examples 1 to 4.
Figure 19:
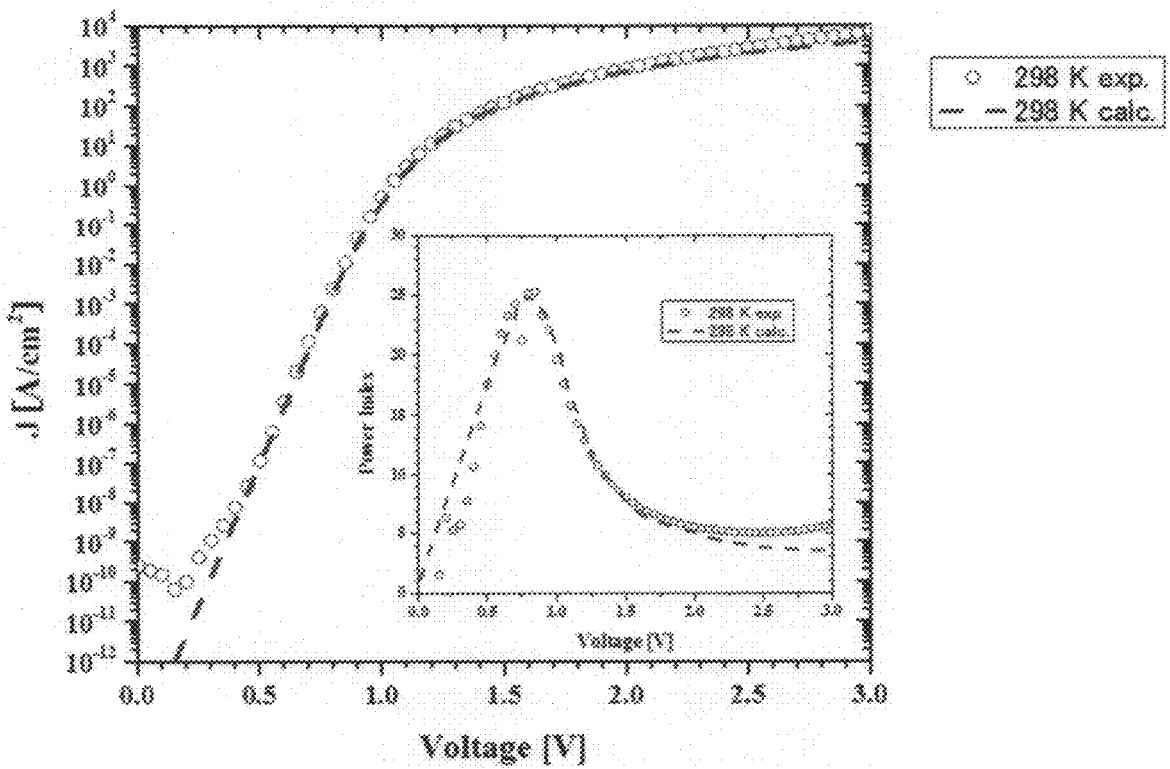
FIG. 19 is a diagram showing the results of evaluation of I-V forward characteristics (semi-log plot) and voltage dependence of power index (inset) in Example 1.

FIG. 15 shows the results of evaluation of I-V characteristics (semi-log plot) in Example 1 and Examples 2 to 4 to be described later; FIG. 16 shows the results of evaluation of I-V forward characteristics (linear scale) in Example 1 and Examples 2 to 4 to be described later; FIG. 17 shows the results of evaluation of I-V forward temperature dependence (semi-log plot) in Example 1; FIG. 18 shows the results of evaluation of differential resistance (semi-log plot) in Example 1 and Examples 2 to 4 to be described later; FIG. 19 shows the results of evaluation of I-V forward characteristics (semi-log plot) and power index voltage dependence (inset) in Example 1 (a circle represents an experimental value and a dotted line represents the results of simulation; and FIG. 20 shows comparison between the experimental value in FIG. 17 and the simulation.

In FIGS. 15, 16, and 18, the results in Examples 1 to 4 are shown as "200 nm", "100 nm", "500 nm", and "1000 nm", respectively.

In FIG. 17, the bottom graph shows a graph at 298 K, and sequentially from the bottom, a graph at 308 K, a graph at 318 K, a graph at 323 K, a graph at 328 K, a graph at 333 K, and a graph at 338 K are shown, and the top graph shows a graph at 343 K.

Figure 20:
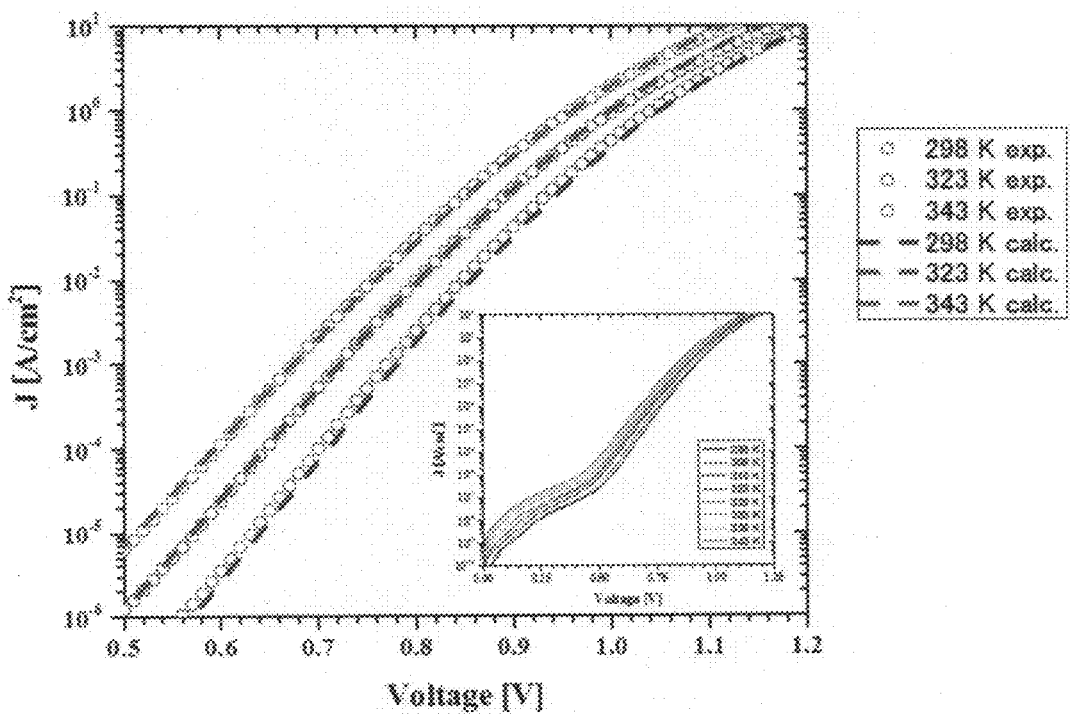
FIG. 20 is a diagram showing comparison between an experimental value in FIG. 17 and simulation.

In FIG. 20, a circle represents an experimental value, and a dotted line represents the results of simulation, the bottom graph represents experimental values and the results of simulation at 298 K, the second graph from the bottom represents experimental values and the results of simulation at 323 K, and the top graph represents experimental values and the results of simulation at 343 K.

Figure 21:
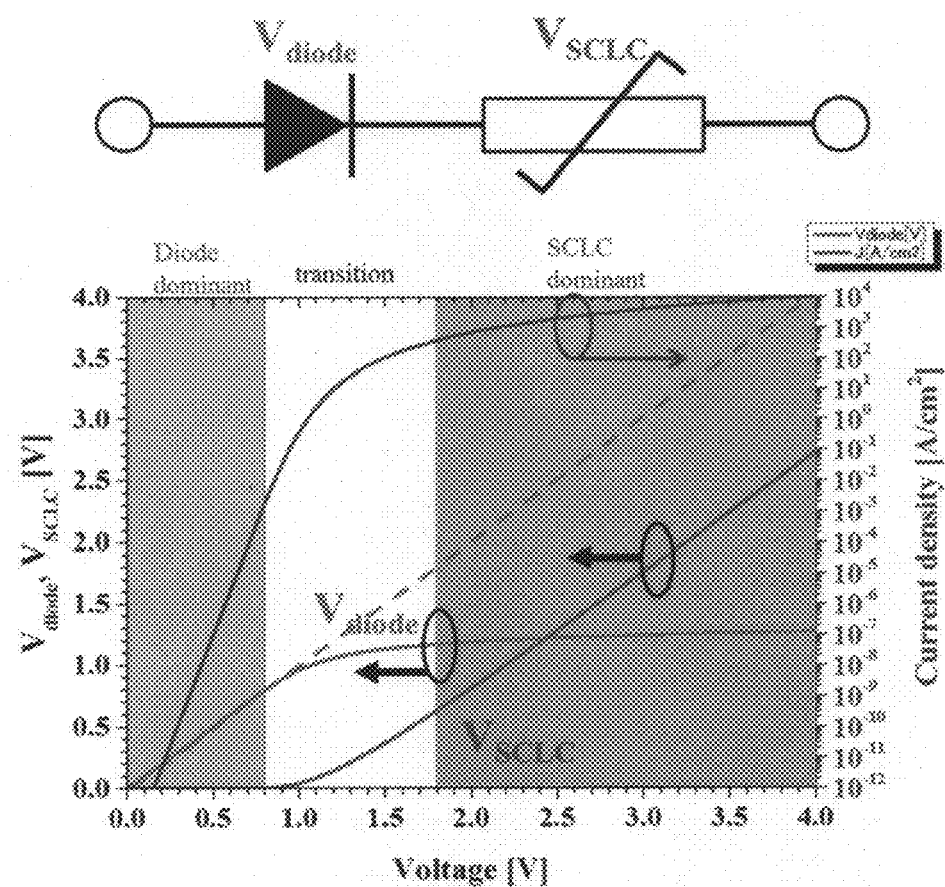
FIG. 21 is a diagram showing the results of evaluation of I-V forward characteristics (semi-log plot) in Example 1.

FIG. 21 represents the results of evaluation of I-V forward characteristics (semi-log plot) in Example 1, and is a drawing showing a partial pressure relationship of applied voltage when a current value is measured. It was found from the results of simulation that, as in an equivalent circuit shown, the applied voltage was distributed to voltage $V_{diode}$ to the Schottky interface and voltage $V_{SCLC}$ to the metal oxide semiconductor layer. Details of the voltage values applied to the diode can be known from FIG. 21, and therefore further detailed values of the ideality factor of the diode and the Schottky barrier height were able to be determined.

A metal oxide semiconductor layer was formed on a quartz substrate in a manner similar to the metal oxide semiconductor layer of the above-described element, annealing after formation was performed in the similar manner to obtain the quartz substrate with the metal oxide semiconductor layer.

Figure 22:
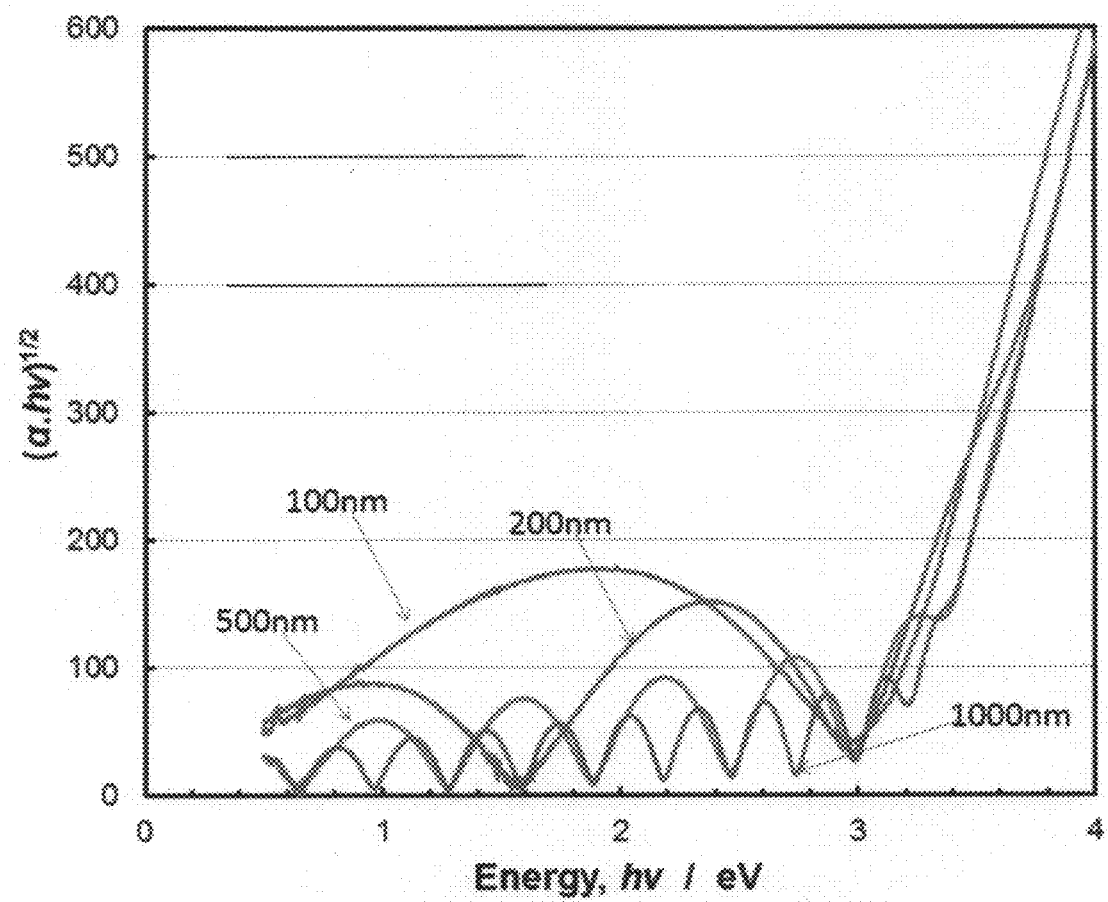
FIG. 22 shows a diagram obtained by plotting hv on a horizontal axis and $(\alpha h v)^{1/2}$ on a vertical axis for the quartz substrates with the metal oxide semiconductor layers related to Examples 1 to 4.

Transmission spectra were measured on the obtained quartz substrate with the metal oxide semiconductor layer related to Example 1 and the quartz substrate with the metal oxide semiconductor layer related to Examples 2 to 4 to be described later by using UV-VIS spectrometer V-370 (made by JASCO Corporation) to prepare a diagram shown in FIG. 22, in which hv was plotted on a horizontal axis and $(\alpha h v)^{1/2}$ was plotted on a vertical axis. Then, "$\alpha$" denotes an absorption coefficient, h denotes the Planck's constant, and v denotes frequency of incident light. The results in Examples 1 to 4 are shown as "200 nm", "100 nm", "500 nm", and "1000 nm", respectively.

A curve plotted with data on the graph was drawn, a tangent line was drawn in a position of an inflection point, and a point at which the tangent line and the horizontal axis were crossed was taken as a bandgap. The results are shown in Table 1.

A noble metal oxide layer was formed on a quartz substrate in a manner similar to the noble metal oxide layer of the above-described element to obtain the quartz substrate with the noble metal oxide layer.

Crystal structures of the noble metal oxide layer and the metal oxide semiconductor layer were measured on the obtained quartz substrate with the noble metal oxide layer and the above-described quartz substrate with the metal oxide semiconductor layer by using a full automatic horizontal multipurpose X-ray diffraction (XRD) apparatus SmartLab (made by RIGAKU Corporation). As X-rays, Cu-Kα rays (wavelength: 1.5406 Å, monochromatized by a graphite monochromator) were used.

Figure 23:
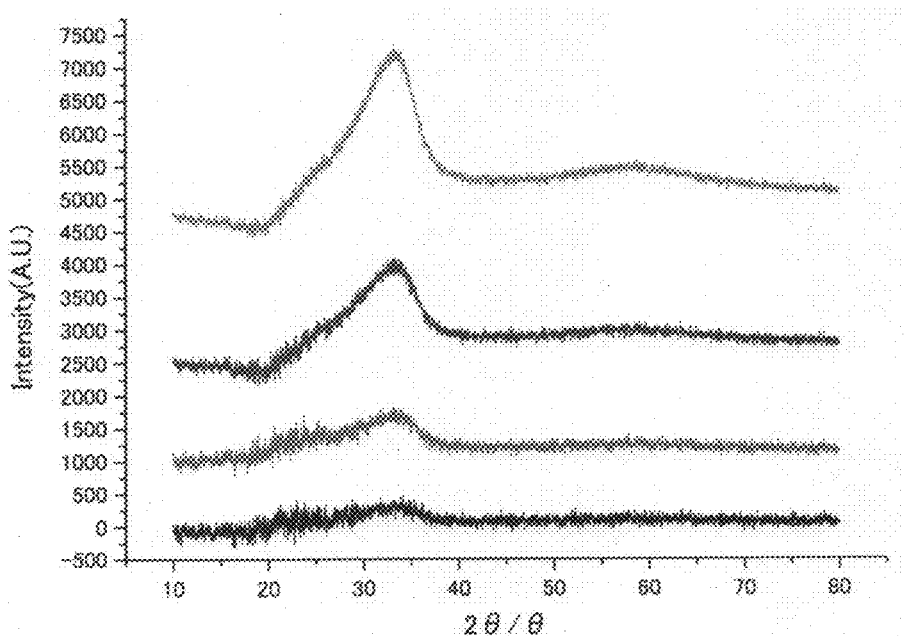
FIG. 23 is a diagram showing XRD patterns for the quartz substrates with the metal oxide semiconductor layers related to Examples 1 to 4.
Figure 24:
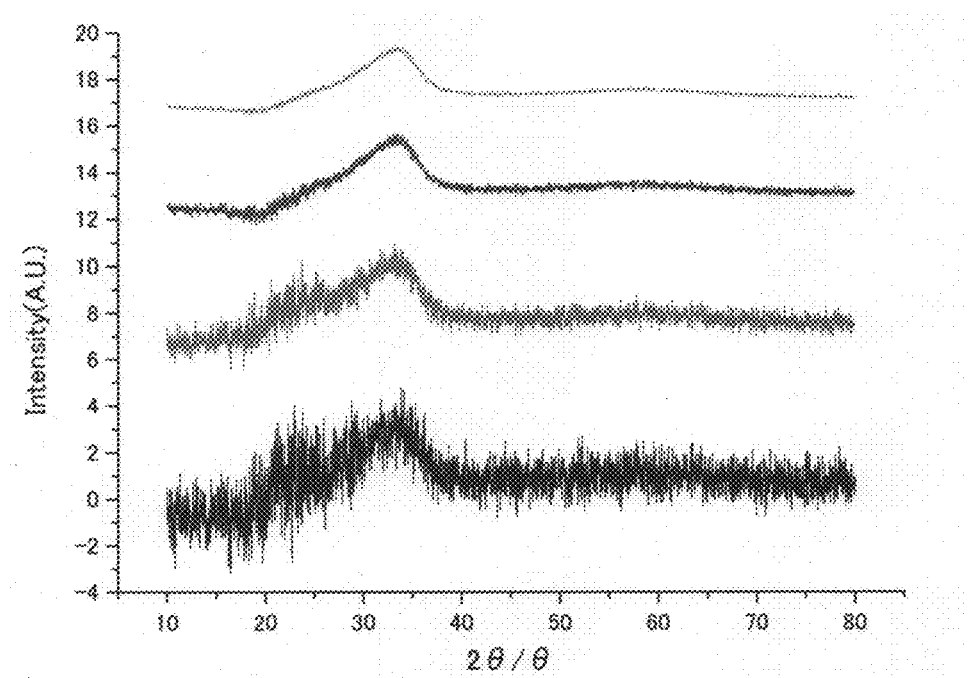
FIG. 24 is a diagram showing XRD patterns for the quartz substrates with the metal oxide semiconductor layers related to Examples 1 to 4.

FIG. 23 shows XRD patterns of the quartz substrates with the metal oxide semiconductor layers (results obtained by differentiating substrate information) for Example 1 and Examples 2 to 4 to be described later, and FIG. 24 shows XRD patterns (results obtained by further normalizing the value in FIG. 23 with the film thickness of the metal oxide semiconductor layer) of the quartz substrates with the metal oxide semiconductor layers for Example 1 and Examples 2 to 4 to be described later.

In FIG. 23, the bottom graph shows the XRD pattern for Example 2, and sequentially from the bottom, the XRD pattern for Example 1, and the XRD pattern for Example 3 are shown, and the top graph shows the XRD pattern for Example 4.

In FIG. 24, the bottom graph shows the XRD pattern for Example 2, and sequentially from the bottom, the XRD pattern for Example 1, and the XRD pattern for Example 3 are shown, and the top graph shows the XRD pattern for Example 4.

The results of the crystal structures of the noble metal oxide layers and the metal oxide semiconductor layers are shown in Table 1.

Figure 25:
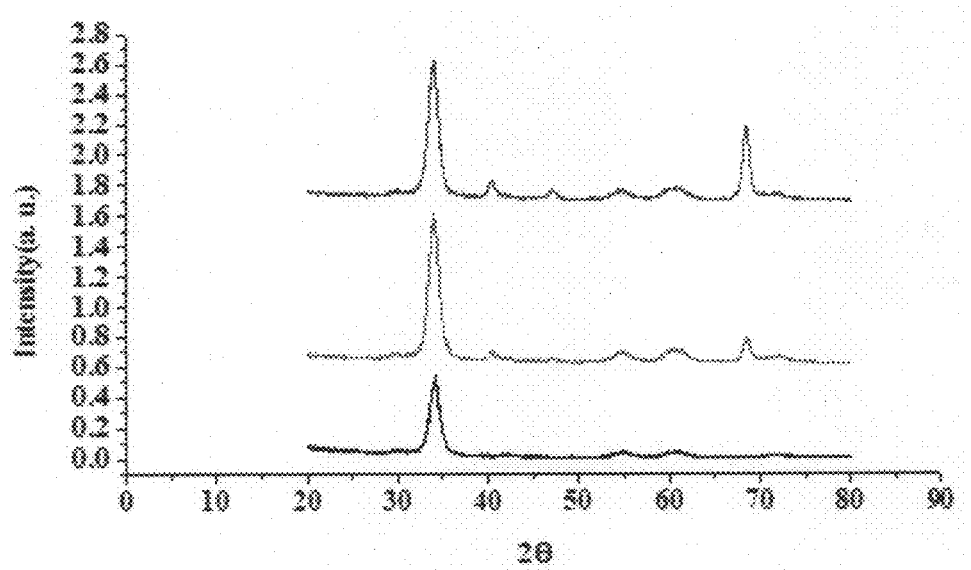
FIG. 25 is a diagram showing an XRD pattern of the element in Example 1.

An XRD pattern was measured on the above-described element by exposing the noble metal oxide layer by chemical etching, and using a grazing incidence X-ray XRD (SmartLab (made by Rigaku Corporation)). FIG. 25 shows the XRD pattern. Then, ω denotes an incident angle of X-ray relative to a surface of a sample, and θ denotes an angle of a detector relative to the surface of the sample.

In FIG. 25, the bottom graph shows the XRD pattern at ω=0.3°, the second graph from the bottom shows the XRD pattern at ω=0.4°, and the top graph shows the XRD pattern at ω=0.5°. The XRD pattern at ω=0.3° shows a spectrum derived only from the noble metal oxide layer without causing superimposition of a signal from Pd in an undercoat as a result of measurement when X-rays are most shallowly entered into the sample.

Figure 26:
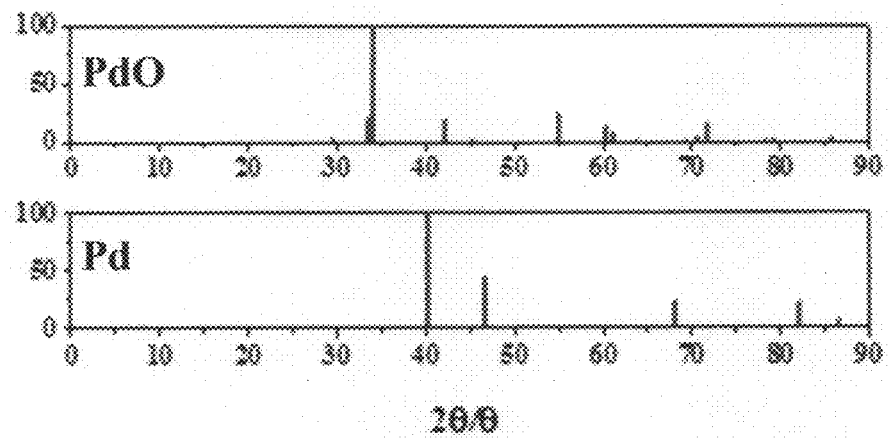
FIG. 26 is a diagram showing JCPDS (85-0624) and JCPDS (89-4897).

Moreover, the spectra of JCPDS (85-0624) are shown in an upper column in FIG. 26 and the spectra of JCPDS (89-4897) are shown in a lower column in FIG. 26.

From these results, it was identified that the noble metal oxide is PdO having a randomly oriented polycrystalline PdO structure.

Figure 27:
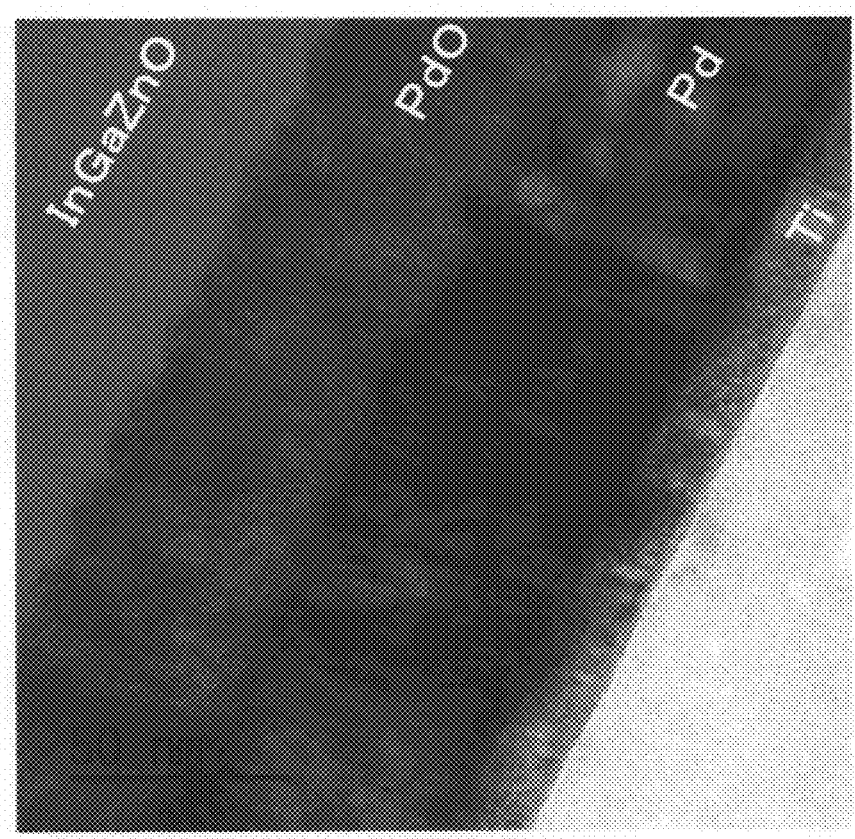
FIG. 27 is a diagram showing a cross sectional TEM of the element in Example 1.

Interface roughness of the noble metal oxide layer was measured on the above-described element by using the cross sectional TEM. FIG. 27 shows the cross sectional TEM of the element in Example 1. The interface roughness of the noble metal oxide layer was determined by photographing three places in the area as shown in FIG. 27, tracing unevenness of the interface between the noble metal oxide layer and the metal oxide semiconductor layer, and calculating the traced line in accordance with the calculation method of root mean square roughness (RMS) specified in JIS B0601-2001. The results obtained are shown in Table 1.

A work function of the noble metal oxide in the noble metal oxide layer was measured using a photoelectron spectrometer in air AC-3 (made by Riken Keiki Co., Ltd.). The results obtained are shown in Table 1.

Orientation of the metal oxide semiconductor layer was measured using a transmission electron microscope (TEM). The results obtained are shown in Table 1.

A carrier concentration, mobility, and specific resistance of the metal oxide semiconductor layer, and specific resistance of the noble metal oxide layer were measured as described below.

The specific resistance of the metal oxide semiconductor layer and the noble metal oxide layer was measured on the above-described quartz substrate with the noble metal oxide layer and the quartz substrate with the metal oxide semiconductor layer by cutting the substrate each into 1 cm-square, attaching In electrodes onto four corners, and using a Hall effect measurement system Resitest 8400 (made by TOYO Corporation) at room temperature according to a Van der Pauw method. Moreover, the carrier concentration of the metal oxide semiconductor layer was measured by Hall effect measurement. The mobility of the metal oxide semiconductor layer was calculated using a value of the specific resistance and a value of the carrier concentration of the metal oxide semiconductor layer.

Differential on-resistance (Ron) was evaluated on the above-described element by using B1500. Minimum differential resistance (Ron=$\Delta V/\Delta I$) upon applying voltage to the element up to 5 V was taken as the differential on-resistance. The results obtained are shown in Table 1.

Moreover, current density upon applying reverse bias of 0.2 MV/cm and current density upon applying forward bias of 0 to 5 V were evaluated by using B1500. The results obtained are shown in Table 1.

It was confirmed that the current density reaches 1000 A/cm$^2$ at forward bias of 5 V or less by using B1500.

Withstand voltage of the obtained element when reverse voltage is applied and a variation of withstand voltage were evaluated by using B1500. The results obtained are shown in Table 1.

Figure 28:
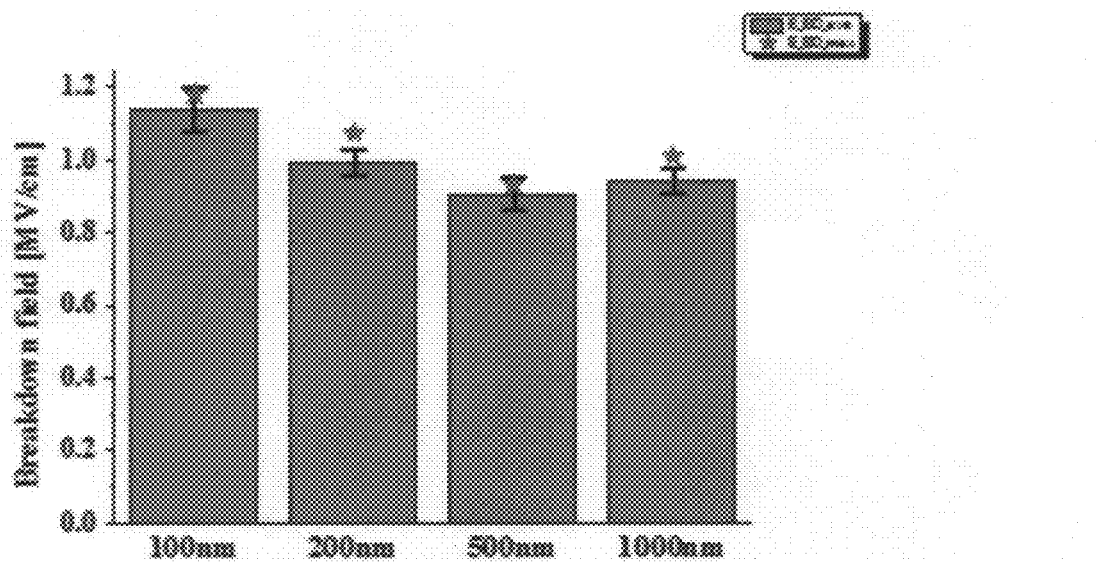
FIG. 28 is a diagram showing the results of evaluation of withstand voltage for the elements in Examples 1 to 4.
Figure 29:
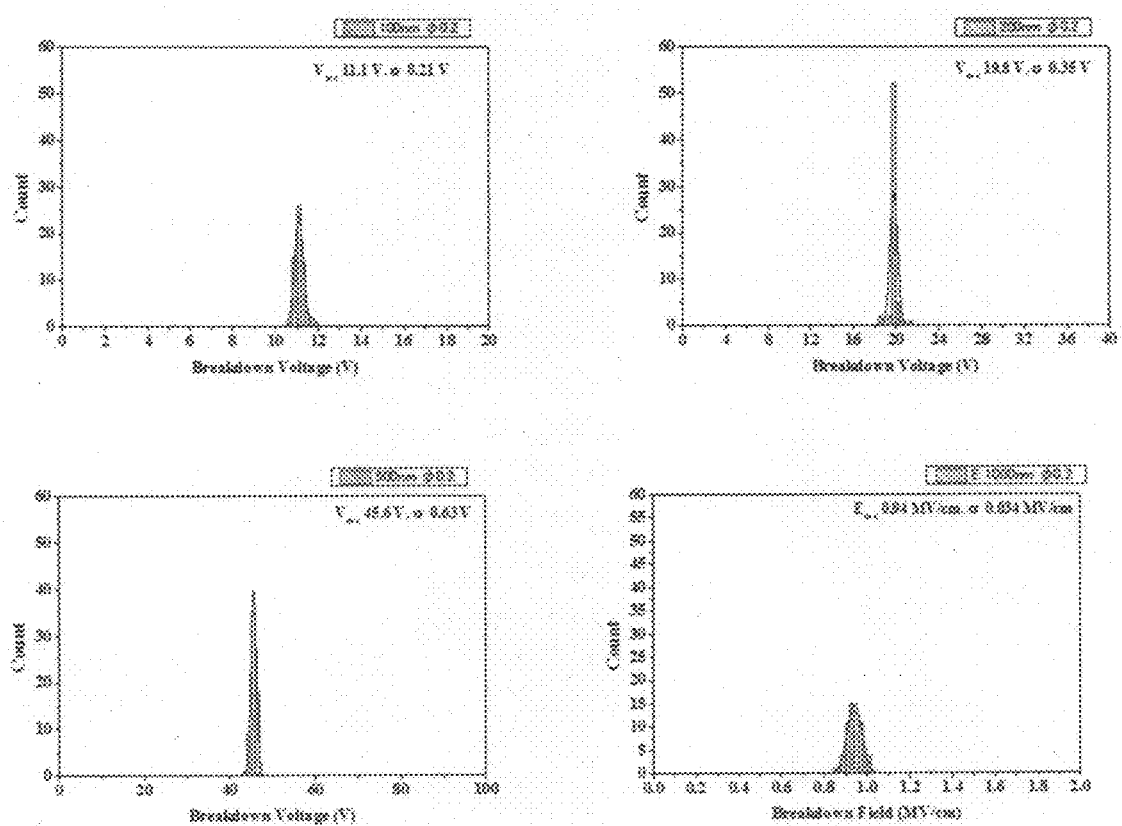
FIG. 29 is a diagram showing histograms of actual breakdown voltage corresponding to FIG. 28.
Figure 30:
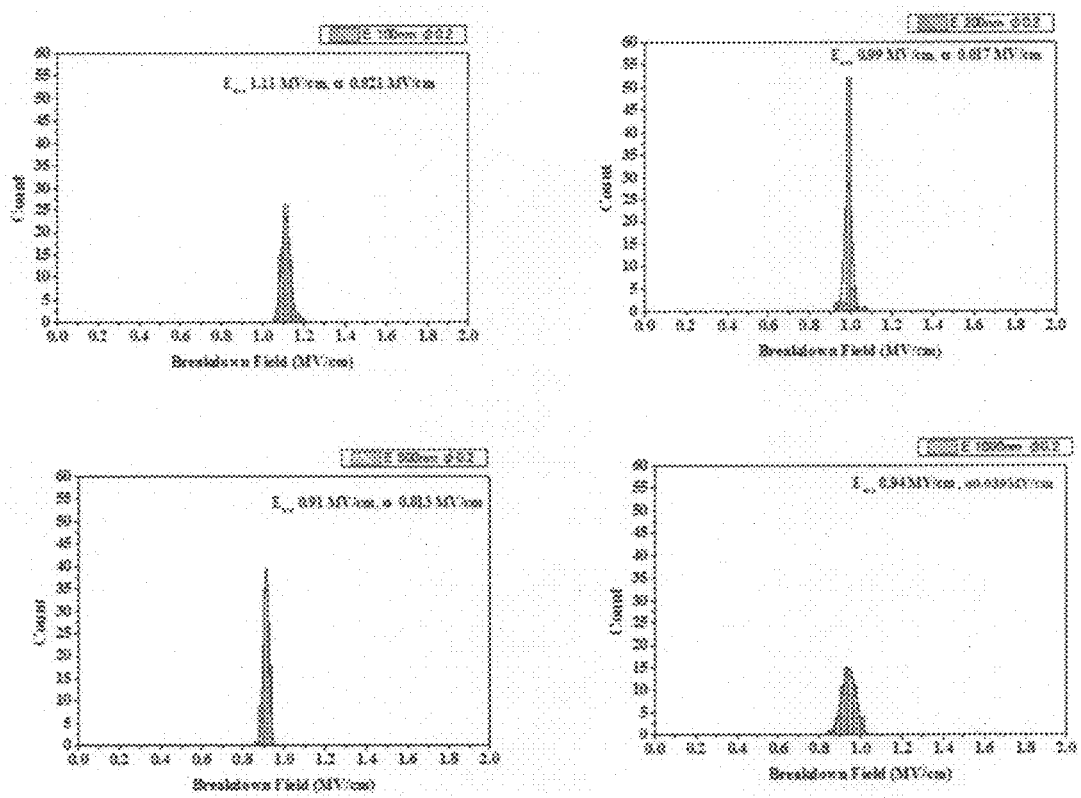
FIG. 30 is a diagram showing histograms of withstand voltage obtained by normalizing the value in FIG. 29 with a film thickness.

FIG. 28 shows the results of evaluation of the withstand voltage for the elements (represented as "200 nm", "100 nm", "500 nm", and "1000 nm", respectively) in Example 1 and Examples 2 to 4 to be described later. A height of a bar graph shows an average withstand voltage value obtained by measuring the elements in 50 points or more. An error bar represents a standard deviation, and a green asterisk represents maximum withstand voltage. FIG. 29 shows a histogram of an actual breakdown voltage corresponding to the value in FIG. 28; and FIG. 30 shows a histogram of the withstand voltage obtained by normalizing the value with the film thickness in FIG. 29. From the present results, the withstand voltage and the variation of the withstand voltage in Table 1 were obtained.

In FIG. 29, upper left shows a histogram of breakdown voltage in Example 2, upper right shows a histogram of breakdown voltage in Example 1, lower left shows a histogram of breakdown voltage in Example 3, and lower right shows a histogram of breakdown voltage in Example 4.

In FIG. 30, upper left shows a histogram of withstand voltage in Example 2, upper right shows a histogram of withstand voltage in Example 1, lower left shows a histogram of withstand voltage in Example 3, and lower right shows a histogram of withstand voltage in Example 4.

Examples 2 to 47 and Comparative Examples 1 to 14

An element was prepared and evaluated in the same manner as in Example 1 by applying conditions shown in Tables 1 to 13. The results are shown in Tables 1 to 13.

In Tables, InGaO(1:1) represents that a ratio: In:Ga as the ratio of metal elements of a metal oxide semiconductor is 1:1.

Moreover, in Tables, a layer having no film thickness description represents that the layer was not laminated.

In Tables, "Ga$_2$O$_3$/InGaZnO(1:1:1)" for the metal oxide semiconductor represents that Ga$_2$O$_3$ as a first metal oxide semiconductor layer, and InGaZnO(1:1:1) as a second metal oxide semiconductor layer were formed and laminated. A crystal structure, an orientation carrier concentration, mobility, specific resistance and a bandgap in the metal oxide semiconductor layer, when a film of the metal oxide semiconductor layer was formed and laminated, are not described.

In Tables, aluminum as a support substrate is an aluminum substrate (diameter: 4 inches) having electrical resistivity less than 0.01 mΩ·cm, polysilicon is a polysilicon substrate (diameter: 4 inches) having electrical resistivity of 10 mΩ·cm, non-alkali glass is an EagleXG substrate (diameter: 4 inches) (made by Corning Incorporated) having electrical resistivity of ∞ mΩ·cm, and polyimide is a polyimide substrate (diameter: 4 inches) having electrical resistivity of ∞ mΩ·cm.

Moreover, relative permittivity of a metal oxide semiconductor Ga$_2$O$_3$ is 14, relative permittivity of InGaZnO(5:3:2) is 19, relative permittivity of InGaZnO(5:1:4) is 20, relative permittivity of InSnZnO(25:15:60) is 21, relative permittivity of InSnZnO(48.5:15:36.5) is 25, relative permittivity of InGaO(1:1) is 17, and relative permittivity of InGaO(93:7) is 12. The relative permittivity was determined from the results of film thickness dependence according to the CV measurement for the sample in which the film thickness was known.

It was confirmed on the elements in Examples 2 to 47 that an average crystalline particle diameter of the noble metal oxide layer is equal to or less than a film thickness of the noble metal oxide layer upon measuring the film thickness of each layer.

Figure 31:
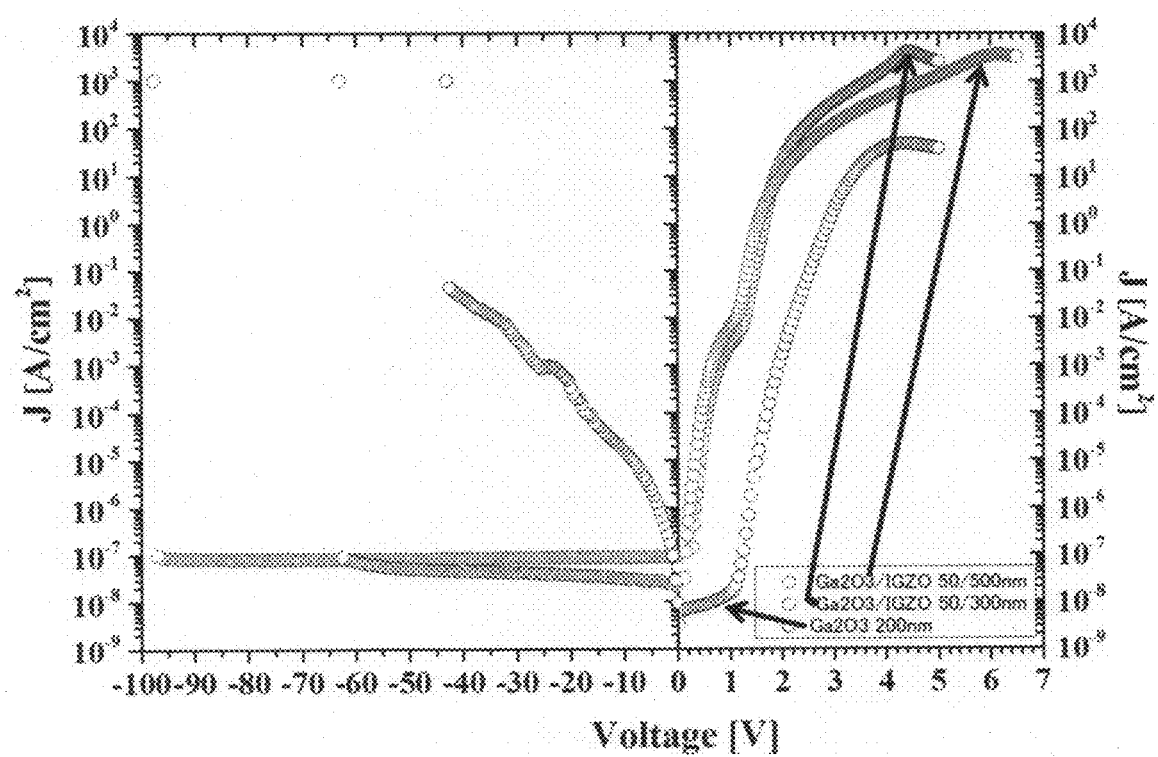
FIG. 31 is a diagram showing the results of evaluation of I-V characteristics (semi-log plot) of the elements in Examples 5 to 7.
Figure 32:
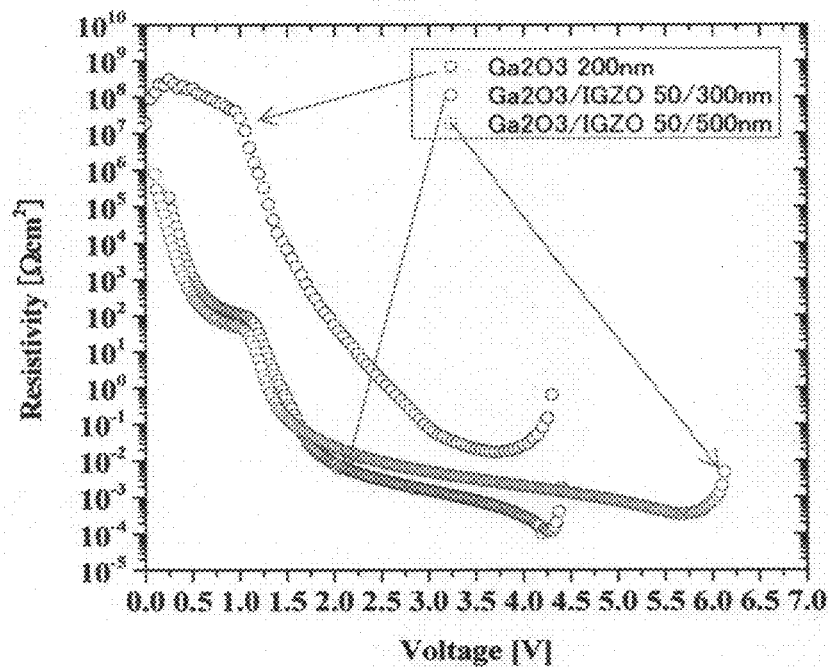
FIG. 32 is a diagram showing differential resistance-voltage (semi-log plot) of the elements in Examples 5 to 7.

FIG. 31 shows the results of evaluation of I-V characteristics (semi-log plot) of the elements in Examples 5 to 7. FIG. 32 shows differential resistance-voltage (semi-log plot) of the elements in Examples 5 to 7.

In FIG. 31, "Ga2O3 200 nm" represents Example 5 (43.0 V, 2.15 MV/cm), "Ga2O3/IGZO 50/300 nm" represents Example 6 (63.0 V, 1.80 MV/cm), and "Ga2O3/IGZO 50/500 nm" represents Example 7 (97.5 V, 1.77 MV/cm).

In FIG. 32, "Ga2O3 200 nm" represents Example 5, "Ga2O3/IGZO 50/300 nm" represents Example 6, and "Ga2O3/IGZO 50/500 nm" represents Example 7.

Figure 33:
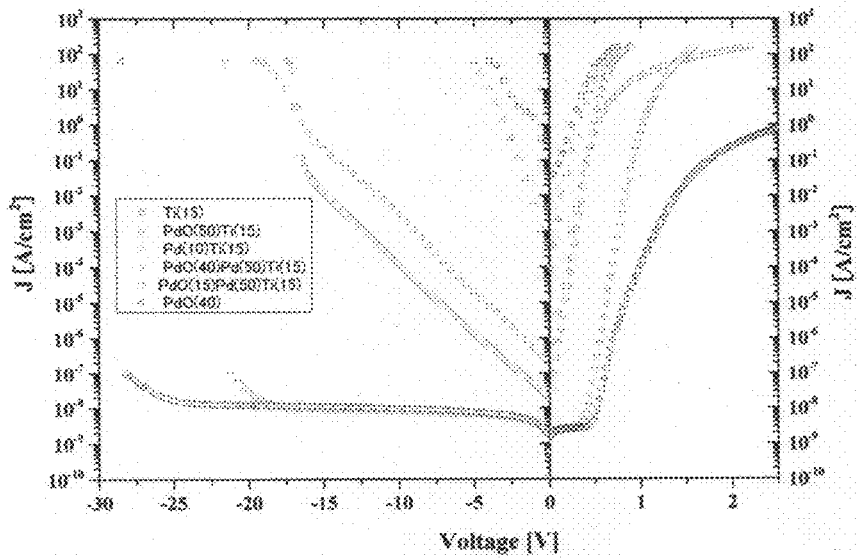
FIG. 33 is a diagram showing the results of evaluation of I-V characteristics (semi-log plot) of the elements in Examples 1, 8, 10 and 22 and Comparative Examples 2 to 3.

FIG. 33 shows the results of evaluation of I-V characteristics (semi-log plot) of the elements in Examples 1, 8, 10 and 22, and Comparative Examples 2 to 3.

In FIG. 33, "PdO(40)Pd(50)Ti(15)" represents Example 1, "PdO(15)Pd(50)Ti(15)" represents Example 8, "PdO(50)Ti(15)" represents Example 10, "PdO(40)" represents Example 22, "Ti(15)" represents Comparative Example 2, and "Pd(10)Ti(15)" represents Comparative Example 3.

Figure 34:
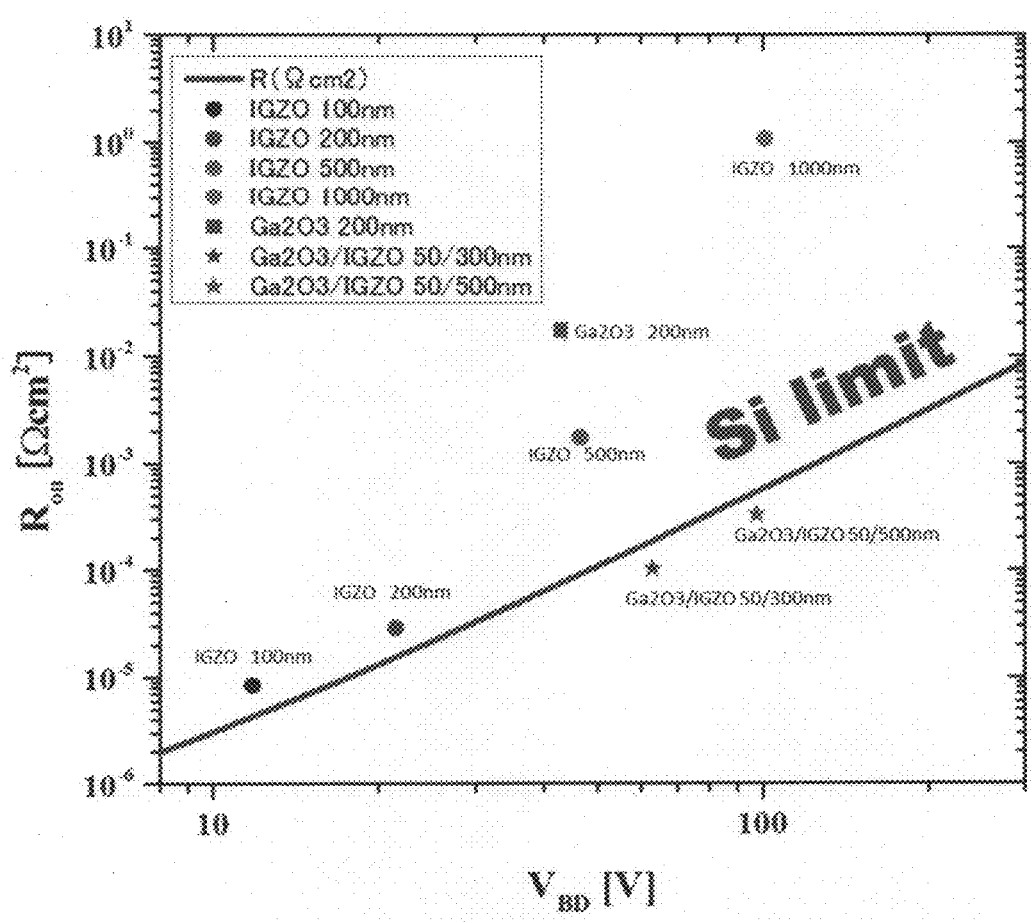
FIG. 34 is a diagram showing a relationship between on-resistance and withstand voltage of the elements in Examples 1 to 7.

FIG. 34 shows a relationship between on-resistance and withstand voltage of the elements in Examples 1 to 7. It was found that a single crystal silicon limit was achieved in the elements in Examples 6 and 7.

"IGZO 100 nm" represents Example 2, "IGZO 200 nm" represents Example 1, "IGZO 500 nm" represents Example 3, "IGZO 1000 nm" represents Example 4, "Ga2O3 200 nm" represents Example 5, "Ga2O3/IGZO 50/300 nm" represents Example 6, and "Ga2O3/IGZO 50/500 nm" represents Example 7.

TABLE 1

| | | | Example 1 | Example 2 | Example 3 | Example 4 | Example 5 |
|---|---|---|---|---|---|---|---|
| Element configuration | Support substrate | Material | Mono-crystalline Si (P doped) | Mono-crystalline Si (P doped) | Mono-crystalline Si (P doped) | Mono-crystalline Si (P doped) | Mono-crystalline Si (P doped) |
| | | Electrical resistivity (mΩcm) | 1 | 1 | 1 | 1 | 1 |
| | | Film thickness (μm) | 250 | 250 | 250 | 250 | 250 |
| | Low-resistance base metal layer | Material | Ti | Ti | Ti | Ti | Ti |
| | | Thickness (nm) | 15 | 15 | 15 | 15 | 15 |
| | Noble metal layer | Composition | Pd | Pd | Pd | Pd | Pd |
| | | Film thickness (nm) | 50 | 50 | 50 | 50 | 50 |
| | Noble metal oxide layer | Composition | PdO | PdO | PdO | PdO | PdO |
| | | Film thickness (nm) | 40 | 40 | 40 | 40 | 40 |
| | | Crystal structure | Polycrystalline PdO structure | Polycrystalline PdO structure | Polycrystalline PdO structure | Polycrystalline PdO structure | Polycrystalline PdO structure |
| | | Interface roughness (nm) | <2 nm | <2 nm | <2 nm | <2 nm | <2 nm |
| | | Specific resistance (Ωcm) | $8 \times 10^{-3}$ | $8 \times 10^{-3}$ | $8 \times 10^{-3}$ | $8 \times 10^{-3}$ | $8 \times 10^{-3}$ |
| | | Work function of noble metal oxide (eV) | 5.3 | 5.3 | 5.3 | 5.3 | 5.3 |
| | Metal oxide semiconductor layer | Metal oxide semiconductor | InGaZnO (1:1:1) | InGaZnO (1:1:1) | InGaZnO (1:1:1) | InGaZnO (1:1:1) | $Ga_2O_3$ |
| | | Introduced gas during film formation | $H_2O$ 1% | $H_2O$ 1% | $H_2O$ 1% | $H_2O$ 1% | $O_2$ 1% |
| | | Film thickness (nm) | 200 | 100 | 500 | 1000 | 200 |
| | | Crystal structure | Amorphous | Amorphous | Amorphous | Amorphous | Amorphous |
| | | Orientation | Random orientation | Random orientation | Random orientation | Random orientation | Random orientation |
| | | Carrier concentration ($cm^{-3}$) | $2.4 \times 10^{13}$ | $7.4 \times 10^{12}$ | $1.1 \times 10^{13}$ | $4.0 \times 10^{13}$ | $6.2 \times 10^{10}$ |
| | | Mobility ($cm^2$/Vs) | 9.2 | 9.2 | 10.8 | 9.6 | 0.5 |
| | | Specific resistance (Ωcm) | $2.4 \times 10^4$ | $9.1 \times 10^4$ | $5.6 \times 10^4$ | $1.7 \times 10^4$ | $2.2 \times 10^8$ |
| | | Bandgap (eV) | 3.3 | 3.2 | 3.3 | 3.3 | 4.4 |
| | Ohmic electrode layer | Electrode configuration | Mo/Au | Mo/Au | Mo/Au | Mo/Au | Mo/Au |
| | | Film thickness (nm) | 150/500 | 150/500 | 150/500 | 150/500 | 150/500 |
| | Depth of depletion region (nm) | | 210 | 104 | 516 | 1063 | 190 |
| | Carbon concentration in Schottky interface ($cm^{-3}$) | | $5 \times 10^{18}$ | $5 \times 10^{18}$ | $5 \times 10^{18}$ | $5 \times 10^{18}$ | $1 \times 10^{19}$ |
| | Annealing temperature (° C.) | | 300 | 300 | 300 | 300 | 300 |
| | Schottky barrier height (eV) | | 1.2 | 1.1 | 1.2 | 1.2 | 0.9 |
| Evaluation | Differential on-resistance (mΩcm²) | | $3 \times 10^{-5}$ | $1 \times 10^{-5}$ | $1 \times 10^{-3}$ | $1 \times 10^{-0}$ | $2 \times 10^{-2}$ |
| | Withstand voltage (MV/cm) | | 1.03 | 0.98 | 0.89 | 0.90 | 2.10 |
| | Variation of withstand voltage (MV/cm) | | 0.21 | 0.02 | 0.04 | 0.02 | 0.33 |
| | Current density during appluing reverse bias of 0.2 MV/cm (A/cm²) | | $2 \times 10^{-10}$ | $3 \times 10^{-10}$ | $4 \times 10^{-10}$ | $3 \times 10^{-10}$ | $1 \times 10^{-6}$ |
| | Maximum current density during applying forward bias of 5 V (A/cm²) | | 15000 | 24000 | 720 | 0.6 | 60 |
| | Ideality factor of diode | | 1.2 | 1.2 | 1.2 | 1.3 | 1.9 |

TABLE 2

| | | | Example 6 | Example 7 | Example 8 | Example 9 | Example 10 |
|---|---|---|---|---|---|---|---|
| Element configuration | Support substrate | Material | Mono-crystalline Si (P doped) | Mono-crystalline Si (P doped) | Mono-crystalline Si (P doped) | Mono-crystalline Si (P doped) | Mono-crystalline Si (P doped) |
| | | Electrical resistivity (mΩcm) | 1 | 1 | 1 | 1 | 1 |
| | | Film thickness (μm) | 250 | 250 | 250 | 250 | 250 |
| | Low-resistance base metal layer | Material | Ti | Ti | Ti | Ti | Ti |
| | | Thickness (nm) | 15 | 15 | 15 | 15 | 15 |
| | Noble metal layer | Composition | Pd | Pd | Pd | Pd | — |
| | | Film thickness (nm) | 50 | 50 | 50 | 50 | — |
| | Noble metal oxide layer | Composition | PdO | PdO | PdO | PdO | PdO |
| | | Film thickness (nm) | 40 | 40 | 15 | 100 | 50 |
| | | Crystal structure | Polycrystalline PdO structure | Polycrystalline PdO structure | Polycrystalline PdO structure | Polycrystalline PdO structure | Polycrystalline PdO structure |
| | | Interface roughness (nm) | <2 nm | <2 nm | <3 nm | <3 nm | <4 nm |
| | | Specific resistance (Ωcm) | $8 \times 10^{-3}$ | $8 \times 10^{-3}$ | $9 \times 10^{-3}$ | $5 \times 10^{-3}$ | $8 \times 10^{-3}$ |

TABLE 2-continued

|  |  |  | Example 6 | Example 7 | Example 8 | Example 9 | Example 10 |
|---|---|---|---|---|---|---|---|
|  |  | Work function of noble metal oxide (eV) | 5.3 | 5.3 | 5.3 | 5.2 | 5.3 |
|  | Metal oxide semiconductor layer | Metal oxide semiconductor | $Ga_2O_3$/InGaZnO (1:1:1) | $Ga_2O_3$/InGaZnO (1:1:1) | InGaZnO (1:1:1) | InGaZnO (1:1:1) | InGaZnO (1:1:1) |
|  |  | Introduced gas during film formation | $O_2$ 1%/$H_2O$ 1% | $O_2$ 1%/$H_2O$ 1% | $H_2O$ 1% | $H_2O$ 1% | $H_2O$ 1% |
|  |  | Film thickness (nm) | 50/300 | 50/500 | 200 | 200 | 200 |
|  |  | Crystal structure | — | — | Amorphous | Amorphous | Amorphous |
|  |  | Orientation | — | — | Random orientation | Random orientation | Random orientation |
|  |  | Carrier concentration ($cm^{-3}$) | — | — | $2.4 \times 10^{13}$ | $2.4 \times 10^{13}$ | $2.4 \times 10^{13}$ |
|  |  | Mobility ($cm^2$/Vs) | — | — | 9.2 | 9.2 | 9.2 |
|  |  | Specific resistance ($\Omega$cm) | — | — | $2.4 \times 10^4$ | $2.4 \times 10^4$ | $2.4 \times 10^4$ |
|  |  | Bandgap (eV) | — | — | 3.3 | 3.3 | 3.3 |
|  | Ohmic electrode layer | Electrode configuration | Mo/Au | Mo/Au | Mo/Au | Mo/Au | Mo/Au |
|  |  | Film thickness (nm) | 150/500 | 150/500 | 150/500 | 150/500 | 150/500 |
|  | Depth of depletion region (nm) |  | 330 | 560 | 195 | 195 | 150 |
|  | Carbon concentration in Schottky interface ($cm^{-3}$) |  | $1 \times 10^{19}$ | $1 \times 10^{19}$ | $5 \times 10^{18}$ | $5 \times 10^{18}$ | $5 \times 10^{18}$ |
|  | Annealing temperature (° C.) |  | 300 | 300 | 300 | 300 | 300 |
|  | Schottky barrier height (eV) |  | 0.8 | 0.8 | 0.85 | 0.85 | 0.74 |
| Evaluation | Differential on-resistance (m$\Omega$cm$^2$) |  | $2 \times 10^{-4}$ | $1 \times 10^{-3}$ | $8 \times 10^{-6}$ | $8 \times 10^{-6}$ | $1 \times 10^{-4}$ |
|  | Withstand voltage (MV/cm) |  | 1.80 | 1.70 | 0.85 | 0.85 | 0.98 |
|  | Variation of withstand voltage (MV/cm) |  | 0.37 | 0.40 | 0.11 | 0.11 | 0.30 |
|  | Current density during applying reverse bias of 0.2 MV/cm (A/cm$^2$) |  | $4 \times 10^{-8}$ | $1 \times 10^{-7}$ | $1 \times 10^{-6}$ | $1 \times 10^{-6}$ | $7 \times 10^{-7}$ |
|  | Maximum current density during applying forward bias of 5 V (A/cm$^2$) |  | 2600 | 1200 | 50000 | 50000 | 5000 |
|  | Ideality factor of diode |  | 1.6 | 1.7 | 1.1 | 1.1 | 1.1 |

TABLE 3

|  |  |  | Example 11 | Example 12 | Example 13 | Example 14 | Example 15 |
|---|---|---|---|---|---|---|---|
| Element configuration | Support substrate | Material | Mono-crystalline Si (P doped) | Mono-crystalline Si (P doped) | Mono-crystalline Si (P doped) | Mono-crystalline Si (P doped) | Mono-crystalline Si (P doped) |
|  |  | Electrical resistivity (m$\Omega$cm) | 1 | 1 | 1 | 1 | 1 |
|  |  | Film thickness (μm) | 250 | 250 | 250 | 250 | 250 |
|  | Low-resistance base metal layer | Material | Ti | Ti | Ti | Ti | Ti |
|  |  | Thickness (nm) | 15 | 15 | 15 | 15 | 15 |
|  | Noble metal layer | Composition | Pd | Pd | Pt | Pd | Pd |
|  |  | Film thickness (nm) | 5 | 100 | 50 | 50 | 50 |
|  | Noble metal oxide layer | Composition | PdO | PdO | PdO | PdO | PdO |
|  |  | Film thickness (nm) | 40 | 40 | 40 | 40 | 40 |
|  |  | Crystal structure | Polycrystalline PdO structure | Polycrystalline PdO structure | Polycrystalline PdO structure | Polycrystalline PdO structure | Polycrystalline PdO structure |
|  |  | Interface roughness (nm) | <3 nm | <3 nm | <3 nm | <2 nm | <2 nm |
|  |  | Specific resistance ($\Omega$cm) | $8 \times 10^{-3}$ | $8 \times 10^{-3}$ | $8 \times 10^{-3}$ | $8 \times 10^{-3}$ | $8 \times 10^{-3}$ |
|  |  | Work function of noble metal oxide (eV) | 5.3 | 5.3 | 5.3 | 5.3 | 5.3 |
|  | Metal oxide semiconductor layer | Metal oxide semiconductor | InGaZnO (1:1:1) | InGaZnO (1:1:1) | InGaZnO (1:1:1) | InGaZnO (1:1:1) | InGaZnO (1:1:1) |
|  |  | Introduced gas during film formation | $H_2O$ 1% | $H_2O$ 1% | $H_2O$ 1% | $H_2O$ 1% | $H_2O$ 1% |
|  |  | Film thickness (nm) | 200 | 200 | 200 | 200 | 200 |
|  |  | Crystal structure | Amorphous | Amorphous | Amorphous | Amorphous | Amorphous |
|  |  | Orientation | Random orientation | Random orientation | Random orientation | Random orientation | Random orientation |
|  |  | Carrier concentration ($cm^{-3}$) | $2.4 \times 10^{13}$ | $2.4 \times 10^{13}$ | $2.4 \times 10^{13}$ | $2.4 \times 10^{13}$ | $2.4 \times 10^{13}$ |
|  |  | Mobility ($cm^2$/Vs) | 9.2 | 9.2 | 9.2 | 9.2 | 9.2 |
|  |  | Specific resistance ($\Omega$cm) | $2.4 \times 10^4$ | $2.4 \times 10^4$ | $2.4 \times 10^4$ | $2.4 \times 10^4$ | $2.4 \times 10^4$ |
|  |  | Bandgap (eV) | 3.3 | 3.3 | 3.3 | 3.3 | 3.3 |
|  | Ohmic electrode layer | Electrode configuration | Mo/Au | Mo/Au | Mo/Au | Ti | Al |
|  |  | Film thickness (nm) | 150/500 | 150/500 | 150/500 | 150 | 150 |

TABLE 3-continued

|  |  | Example 11 | Example 12 | Example 13 | Example 14 | Example 15 |
|---|---|---|---|---|---|---|
| Evaluation | Depth of depletion region (nm) | 202 | 215 | 198 | 180 | 170 |
|  | Carbon concentration in Schottky interface ($cm^{-3}$) | $5 \times 10^{18}$ | $5 \times 10^{18}$ | $5 \times 10^{18}$ | $5 \times 10^{18}$ | $5 \times 10^{18}$ |
|  | Annealing temperature (° C.) | 300 | 300 | 300 | 300 | 300 |
|  | Schottky barrier height (eV) | 1 | 1.25 | 1.1 | 1.2 | 1.2 |
|  | Differential on-resistance (m$\Omega$cm$^2$) | $2 \times 10^{-5}$ | $5 \times 10^{-5}$ | $6 \times 10^{-5}$ | $2 \times 10^{-5}$ | $3 \times 10^{-5}$ |
|  | Withstand voltage (MV/cm) | 0.95 | 1.12 | 1.02 | 0.93 | 0.89 |
|  | Vatiation of withstand voltage (MV/cm) | 0.30 | 0.25 | 0.06 | 0.15 | 0.22 |
|  | Current density during applying reverse bias of 0.2 MV/cm (A/cm$^2$) | $5 \times 10^{-9}$ | $5 \times 10^{-10}$ | $3 \times 10^{-9}$ | $3 \times 10^{-10}$ | $4 \times 10^{-10}$ |
|  | Maximum current density during applying forward bias of 5 V (A/cm$^2$) | 21000 | 11000 | 12000 | 18000 | 17000 |
|  | Ideality factor of diode | 1.3 | 1.2 | 1.3 | 1.2 | 1.2 |

TABLE 4

|  |  |  | Example 16 | Example 17 | Example 18 | Example 19 | Example 20 |
|---|---|---|---|---|---|---|---|
| Element configuration | Support substrate | Material | Monocrystalline Si (P doped) | Monocrystalline Si (P doped) | Monocrystalline Si (P doped) | Monocrystalline Si (P doped) | Monocrystalline Si (P doped) |
|  |  | Electrical resistivity (m$\Omega$cm) | 1 | 1 | 1 | 1 | 1 |
|  |  | Film thickness ($\mu$m) | 250 | 250 | 250 | 250 | 250 |
|  | Low-resistance base metal layer | Material | Ti | Mo | Mo | — | — |
|  |  | Thickness (nm) | 15 | 15 | 150 | — | — |
|  | Noble metal layer | Composition | Pd | Pd | Pd | Pd | — |
|  |  | Film thickness (nm) | 50 | 50 | 50 | 50 | — |
|  | Noble metal oxide layer | Composition | PdO | PdO | PdO | PdO | PdO |
|  |  | Film thickness (nm) | 40 | 40 | 40 | 40 | 15 |
|  |  | Crystal structure | Polycrystalline PdO structure | Polycrystalline PdO structure | Polycrystalline PdO structure | Polycrystalline PdO structure | Polycrystalline PdO structure |
|  |  | Interface roughness (nm) | <2 nm | <1.5 nm | <2 nm | <3 nm | <1 nm |
|  |  | Specific resistance ($\Omega$cm) | $8 \times 10^{-3}$ | $8 \times 10^{-3}$ | $8 \times 10^{-3}$ | $8 \times 10^{-3}$ | $9 \times 10^{-3}$ |
|  |  | Work function of noble metal oxide (eV) | 5.3 | 5.3 | 5.3 | 5.3 | 5.3 |
|  | Metal oxide semiconductor layer | Metal oxide semiconductor | InGaZnO (1:1:1) | InGaZnO (1:1:1) | InGaZnO (1:1:1) | InGaZnO (1:1:1) | InGaZnO (1:1:1) |
|  |  | Introduced gas during film formation | $H_2O$ 1% | $H_2O$ 1% | $H_2O$ 1% | $H_2O$ 1% | $H_2O$ 1% |
|  |  | Film thickness (nm) | 200 | 200 | 200 | 200 | 200 |
|  |  | Crystal structure | Amorphous | Amorphous | Amorphous | Amorphous | Amorphous |
|  |  | Orientation | Random orientation | Random orientation | Random orientation | Random orientation | Random orientation |
|  |  | Carrier concentration ($cm^{-3}$) | $2.4 \times 10^{13}$ | $2.4 \times 10^{13}$ | $2.4 \times 10^{13}$ | $2.4 \times 10^{13}$ | $2.4 \times 10^{13}$ |
|  |  | Mobility (cm$^2$/Vs) | 9.2 | 9.2 | 9.2 | 9.2 | 9.2 |
|  |  | Specific resistance ($\Omega$cm) | $2.4 \times 10^4$ | $2.4 \times 10^4$ | $2.4 \times 10^4$ | $2.4 \times 10^4$ | $2.4 \times 10^4$ |
|  |  | Bandgap (eV) | 3.3 | 3.3 | 3.3 | 3.3 | 3.3 |
|  | Ohmic electrode layer | Electrode configuration | In/Mo | Mo/Au | Mo/Au | Mo/Au | Mo/Au |
|  |  | Film thickness (nm) | 5/150 | 150/500 | 150/500 | 150/500 | 150/500 |
| Evaluation | Depth of depletion region (nm) |  | 198 | 200 | 200 | 188 | 210 |
|  | Carbon concentration in Schottky interface ($cm^{-3}$) |  | $5 \times 10^{18}$ | $5 \times 10^{18}$ | $5 \times 10^{18}$ | $5 \times 10^{18}$ | $5 \times 10^{18}$ |
|  | Annealing temperature (° C.) |  | 300 | 300 | 300 | 300 | 300 |
|  | Schottky barrier height (eV) |  | 1.2 | 1.2 | 1.15 | 1 | 1.2 |
|  | Differential on-resistance (m$\Omega$cm$^2$) |  | $1 \times 10^{-5}$ | $3 \times 10^{-5}$ | $3 \times 10^{-5}$ | $1 \times 10^{-4}$ | $5 \times 10^{-1}$ |
|  | Withstand voltage (MV/cm) |  | 1.05 | 1.05 | 1.02 | 0.85 | 1.50 |
|  | Vatiation of withstand voltage (MV/cm) |  | 0.05 | 0.11 | 0.23 | 0.11 | 0.34 |
|  | Current density during applying reverse bias of 0.2 MV/cm (A/cm$^2$) |  | $2 \times 10^{-10}$ | $1 \times 10^{-10}$ | $5 \times 10^{-10}$ | $1 \times 10^{-8}$ | $2 \times 10^{-10}$ |
|  | Maximum current density during applying forward bias of 5 V (A/cm$^2$) |  | 20000 | 15000 | 15000 | 10000 | 10 |
|  | Ideality factor of diode |  | 1.2 | 1.1 | 1.1 | 1.2 | 1.4 |

TABLE 5

| | | | Example 21 | Example 22 | Example 23 | Example 24 | Example 25 |
|---|---|---|---|---|---|---|---|
| Element configuration | Support substrate | Material | Mono-crystalline Si (P doped) | Mono-crystalline Si (P doped) | Mono-crystalline Si (P doped) | Mono-crystalline Si (P doped) | Mono-crystalline Si (P doped) |
| | | Electrical resistivity (mΩcm) | 1 | 1 | 1 | 1 | 1 |
| | | Film thickness (μm) | 250 | 250 | 250 | 250 | 250 |
| | Low-resistance base metal layer | Material | — | — | — | — | — |
| | | Thickness (nm) | — | — | — | — | — |
| | Noble metal layer | Composition | — | — | — | — | — |
| | | Film thickness (nm) | — | — | — | — | — |
| | Noble metal oxide layer | Composition | PdO | PdO | $RuO_2$ | $PtO_2$ | $IrO_2$ |
| | | Film thickness (nm) | 20 | 40 | 20 | 20 | 20 |
| | | Crystal structure | Polycrystalline PdO structure | Polycrystalline PdO structure | Polycrystalline rutile structure | Polycrystalline α-$PtO_2$ structure | Polycrystalline rutile structure |
| | | Interface roughness (nm) | <1.5 nm | <2 nm | <2 nm | <4 nm | <3 nm |
| | | Specific resistance (Ωcm) | $9 \times 10^{-3}$ | $8 \times 10^{-3}$ | $3 \times 10^{-4}$ | $1 \times 10^{-2}$ | $8 \times 10^{-4}$ |
| | | Work function of noble metal oxide (eV) | 5.3 | 5.3 | 5.2 | 5.1 | 5.2 |
| | Metal oxide semiconductor layer | Metal oxide semiconductor | InGaZnO (1:1:1) | InGaZnO (1:1:1) | InGaZnO (1:1:1) | InGaZnO (1:1:1) | InGaZnO (1:1:1) |
| | | Introduced gas during film formation | $H_2O$ 1% | $H_2O$ 1% | $H_2O$ 1% | $H_2O$ 1% | $H_2O$ 1% |
| | | Film thickness (nm) | 200 | 200 | 200 | 200 | 200 |
| | | Crystal structure | Amorphous | Amorphous | Amorphous | Amorphous | Amorphous |
| | | Orientation | Random orientation | Random orientation | Random orientation | Random orientation | Random orientation |
| | | Carrier concentration ($cm^{-3}$) | $2.4 \times 10^{13}$ | $2.4 \times 10^{13}$ | $2.4 \times 10^{13}$ | $2.4 \times 10^{13}$ | $2.4 \times 10^{13}$ |
| | | Mobility ($cm^2$/Vs) | 9.2 | 9.2 | 9.2 | 9.2 | 9.2 |
| | | Specific resistance (Ωcm) | $2.4 \times 10^4$ | $2.4 \times 10^4$ | $2.4 \times 10^4$ | $2.4 \times 10^4$ | $2.4 \times 10^4$ |
| | | Bandgap (eV) | 3.3 | 3.3 | 3.3 | 3.3 | 3.3 |
| | Ohmic electrode layer | Electrode configuration | Mo/Au | Mo/Au | Mo/Au | Mo/Au | Mo/Au |
| | | Film thickness (nm) | 150/500 | 150/500 | 150/500 | 150/500 | 150/500 |
| | Depth of depletion region (nm) | | 208 | 206 | 202 | 210 | 204 |
| | Carbon concentration in Schottky interface ($cm^{-3}$) | | $5 \times 10^{18}$ | $5 \times 10^{18}$ | $5 \times 10^{18}$ | $5 \times 10^{18}$ | $5 \times 10^{18}$ |
| | Annealing temperature (° C.) | | 300 | 300 | 300 | 300 | 300 |
| | Schottky barrier height (eV) | | 1.2 | 1.2 | 1.1 | 1.1 | 1.1 |
| Evaluation | Differential on-resistance (mΩcm$^2$) | | $3 \times 10^{-1}$ | $1 \times 10^{-1}$ | $1 \times 10^{-1}$ | $3 \times 10^{0}$ | $2 \times 10^{-1}$ |
| | Withstand voltage (MV/cm) | | 1.45 | 1.35 | 1.20 | 1.53 | 1.05 |
| | Vatiation of withstand voltage (MV/cm) | | 0.26 | 0.25 | 0.32 | 0.08 | 0.15 |
| | Current density during applying reverse bias of 0.2 MV/cm (A/cm$^2$) | | $2 \times 10^{-10}$ | $2 \times 10^{-10}$ | $2 \times 10^{-9}$ | $2 \times 10^{-9}$ | $2 \times 10^{-9}$ |
| | Maximum current density during applying forward bias of 5 V (A/cm$^2$) | | 20 | 50 | 50 | 0.1 | 10 |
| | Ideality factor of diode | | 1.3 | 1.3 | 1.3 | 1.3 | 1.4 |

TABLE 6

| | | | Example 26 | Example 27 | Example 28 | Example 29 | Example 30 |
|---|---|---|---|---|---|---|---|
| Element configuration | Support substrate | Material | Mono-crystalline Si (P doped) | Mono-crystalline Si (P doped) | Mono-crystalline Si (P doped) | Mono-crystalline Si (P doped) | Mono-crystalline Si (P doped) |
| | | Electrical resistivity (mΩcm) | 1 | 1 | 1 | 1 | 1 |
| | | Film thickness (μm) | 250 | 250 | 250 | 250 | 250 |
| | Low-resistance base metal layer | Material | — | — | — | — | — |
| | | Thickness (nm) | — | — | — | — | — |
| | Noble metal layer | Composition | — | — | — | — | — |
| | | Film thickness (nm) | — | — | — | — | — |
| | Noble metal oxide layer | Composition | $Ag_2O$ | $ReO_3$ | $OsO_2$ | $Rh_2O_3$ | NiO |
| | | Film thickness (nm) | 20 | 20 | 20 | 20 | 20 |
| | | Crystal structure | Polycrystalline $Cu_2O$ structure | Polycrystalline skutterudite structure | Polycrystalline rutile structure | Polycrystalline corundum structure | Polycrystalline NiO structure |
| | | Interface roughness (nm) | <3 nm | <3 nm | <3 nm | <3 nm | <3 nm |
| | | Specific resistance (Ωcm) | $1 \times 10^{-1}$ | $8 \times 10^{-3}$ | $8 \times 10^{-2}$ | $3 \times 10^{-3}$ | $2 \times 10^{-1}$ |
| | | Work function of noble metal oxide (eV) | 5 | 5.1 | 5 | 5.1 | 5.2 |

TABLE 6-continued

|  |  |  | Example 26 | Example 27 | Example 28 | Example 29 | Example 30 |
|---|---|---|---|---|---|---|---|
|  | Metal oxide semiconductor layer | Metal oxide semiconductor | InGaZnO (1:1:1) | InGaZnO (1:1:1) | InGaZnO (1:1:1) | InGaZnO (1:1:1) | InGaZnO (1:1:1) |
|  |  | Introduced gas during film formation | $H_2O$ 1% | $H_2O$ 1% | $H_2O$ 1% | $H_2O$ 1% | $H_2O$ 1% |
|  |  | Film thickness (nm) | 200 | 200 | 200 | 200 | 200 |
|  |  | Crystal structure | Amorphous | Amorphous | Amorphous | Amorphous | Amorphous |
|  |  | Orientation | Random orientation | Random orientation | Random orientation | Random orientation | Random orientation |
|  |  | Carrier concentration ($cm^{-3}$) | $2.4 \times 10^{13}$ | $2.4 \times 10^{13}$ | $2.4 \times 10^{13}$ | $2.4 \times 10^{13}$ | $2.4 \times 10^{13}$ |
|  |  | Mobility ($cm^2/Vs$) | 9.2 | 9.2 | 9.2 | 9.2 | 9.2 |
|  |  | Specific resistance ($\Omega cm$) | $2.4 \times 10^4$ | $2.4 \times 10^4$ | $2.4 \times 10^4$ | $2.4 \times 10^4$ | $2.4 \times 10^4$ |
|  |  | Bandgap (eV) | 3.3 | 3.3 | 3.3 | 3.3 | 3.3 |
|  | Ohmic electrode layer | Electrode configuration | Mo/Au | Mo/Au | Mo/Au | Mo/Au | Mo/Au |
|  |  | Film thickness (nm) | 150/500 | 150/500 | 150/500 | 150/500 | 150/500 |
|  | Depth of depletion region (nm) |  | 180 | 200 | 190 | 197 | 200 |
|  | Carbon concentration in Schottky interface ($cm^{-3}$) |  | $5 \times 10^{18}$ | $5 \times 10^{18}$ | $5 \times 10^{18}$ | $5 \times 10^{18}$ | $5 \times 10^{18}$ |
|  | Annealing temperature (° C.) |  | 300 | 300 | 300 | 300 | 300 |
|  | Schottky barrier height (eV) |  | 0.9 | 1 | 1 | 1 | 1 |
| Evaluation | Differential on-resistance ($m\Omega cm^2$) |  | $2 \times 10^{-1}$ | $1 \times 10^0$ | $5 \times 10^{-2}$ | $8 \times 10^{-1}$ | $1 \times 10^0$ |
|  | Withstand voltage (MV/cm) |  | 0.68 | 1.33 | 0.83 | 1.33 | 0.91 |
|  | Vatiation of withstand voltage (MV/cm) |  | 0.05 | 0.43 | 0.18 | 0.43 | 0.22 |
|  | Current density during applying reverse bias of 0.2 MV/cm ($A/cm^2$) |  | $2 \times 10^{-7}$ | $2 \times 10^{-9}$ | $5 \times 10^{-7}$ | $2 \times 10^{-9}$ | $2 \times 10^{-8}$ |
|  | Maximum current density during applying forward bias of 5 V ($A/cm^2$) |  | 0.005 | 0.5 | 100 | 1 | 0.01 |
|  | Ideality factor of diode |  | 2 | 1.3 | 1.5 | 1.2 | 1.3 |

TABLE 7

|  |  |  | Example 31 | Example 32 | Example 33 | Example 34 | Example 35 |
|---|---|---|---|---|---|---|---|
| Element configuration | Support substrate | Material | Monocrystalline Si (P doped) | Monocrystalline Si (P doped) | Monocrystalline Si (P doped) | Monocrystalline Si (P doped) | Monocrystalline Si (P doped) |
|  |  | Electrical resistivity ($m\Omega cm$) | 1 | 1 | 1 | 1 | 1 |
|  |  | Film thickness (μm) | 250 | 250 | 250 | 250 | 250 |
|  | Low-resistance base metal layer | Material | — | Ti | Ti | Ti | Ti |
|  |  | Thickness (nm) | — | 15 | 15 | 15 | 15 |
|  | Noble metal layer | Composition | — | Pd | Pd | Pd | Pd |
|  |  | Film thickness (nm) | — | 50 | 50 | 50 | 50 |
|  | Noble metal oxide layer | Composition | $Au_2O_3$ | PdO | PdO | PdO | PdO |
|  |  | Film thickness (nm) | 20 | 40 | 40 | 40 | 40 |
|  |  | Crystal structure | Polycrystalline $Au_2O_3$ structure | Polycrystalline PdO structure | Polycrystalline PdO structure | Polycrystalline PdO structure | Polycrystalline PdO structure |
|  |  | Interface roughness (nm) | <3 nm | <2 nm | <2 nm | <3 nm | <3 nm |
|  |  | Specific resistance ($\Omega cm$) | $5 \times 10^{-2}$ | $8 \times 10^{-3}$ | $8 \times 10^{-3}$ | $8 \times 10^{-3}$ | $8 \times 10^{-3}$ |
|  |  | Work function of noble metal oxide (eV) | 4.9 | 5.3 | 5.3 | 5.3 | 5.3 |
|  | Metal oxide semiconductor layer | Metal oxide semiconductor | InGaZnO (1:1:1) | InGaZnO (5:3:2) | InGaZnO (5:1:4) | InSnZnO (25:15:60) | InSnZnO (48.5:15:36.5) |
|  |  | Introduced gas during filmformation | $H_2O$ 1% | $H_2O$ 1% | $H_2O$ 1% | $H_2O$ 1% | $H_2O$ 1% |
|  |  | Film thickness (nm) | 200 | 200 | 200 | 200 | 200 |
|  |  | Crystal structure | Amorphous | Amorphous | Amorphous | Amorphous | Amorphous |
|  |  | Orientation | Random orientation | Random orientation | Random orientation | Random orientation | Random orientation |
|  |  | Carrier concentration ($cm^{-3}$) | $2.4 \times 10^{13}$ | $5.4 \times 10^{13}$ | $7.8 \times 10^{14}$ | $3.4 \times 10^{15}$ | $5.4 \times 10^{16}$ |
|  |  | Mobility ($cm^2/Vs$) | 9.2 | 12 | 15.3 | 14 | 18 |
|  |  | Specific resistance ($\Omega cm$) | $2.4 \times 10^4$ | $8.9 \times 10^3$ | $6.0 \times 10^2$ | $1.8 \times 10^2$ | $5.0 \times 10^0$ |
|  |  | Bandgap (eV) | 3.3 | 3.2 | 3 | 2.9 | 3 |
|  | Ohmic electrode layer | Electrode configuration | Mo/Au | Mo/Au | Mo/Au | Mo/Au | Mo/Au |
|  |  | Film thickness (nm) | 150/500 | 150/500 | 150/500 | 150/500 | 150/500 |
|  | Depth of depletion region (nm) |  | 130 | 195 | 180 | 150 | 130 |
|  | Carbon concentration in Schottky interface ($cm^{-3}$) |  | $2 \times 10^{19}$ | $5 \times 10^{18}$ | $5 \times 10^{18}$ | $5 \times 10^{18}$ | $5 \times 10^{18}$ |

TABLE 7-continued

|  |  | Example 31 | Example 32 | Example 33 | Example 34 | Example 35 |
|---|---|---|---|---|---|---|
| Evaluation | Annealing temperature (° C.) | 150 | 300 | 300 | 300 | 300 |
|  | Schottky barrier height (eV) | 0.8 | 1.1 | 1 | 0.9 | 0.8 |
|  | Differential on-resistance (mΩcm$^2$) | $5 \times 10^{-2}$ | $1 \times 10^{-5}$ | $8 \times 10^{-6}$ | $6 \times 10^{-6}$ | $3 \times 10^{-6}$ |
|  | Withstand voltage (MV/cm) | 0.55 | 0.85 | 0.75 | 0.56 | 0.47 |
|  | Vatiation of withstand voltage (MV/cm) | 0.20 | 0.15 | 0.16 | 0.05 | 0.03 |
|  | Current density during applying reverse bias of 0.2 MV/cm (A/cm$^2$) | $2 \times 10^{-10}$ | $2 \times 10^{-8}$ | $8 \times 10^{-8}$ | $3 \times 10^{-7}$ | $5 \times 10^{-7}$ |
|  | Maximum current density during applying forward bias of 5 V (A/cm$^2$) | 100 | 23000 | 30000 | 32000 | 47000 |
|  | Ideality factor of diode | 2 | 1.2 | 1.1 | 1.2 | 1.1 |

TABLE 8

|  |  |  | Example 36 | Example 37 | Example 38 | Example 39 | Example 40 |
|---|---|---|---|---|---|---|---|
| Element configuration | Support substrate | Material | Mono-crystalline Si (P doped) | Mono-crystalline Si (P doped) | Mono-crystalline Si (P doped) | Mono-crystalline Si (P doped) | Mono-crystalline Si (P doped) |
|  |  | Electrical resistivity (mΩcm) | 1 | 1 | 1 | 1 | 1 |
|  |  | Film thickness (μm) | 250 | 250 | 250 | 250 | 250 |
|  | Low-resistance base metal layer | Material | Ti | Ti | Ti | Ti | Ti |
|  |  | Thickness (nm) | 15 | 15 | 15 | 15 | 15 |
|  | Noble metal layer | Composition | Pd | Pd | Pd | Pd | Pd |
|  |  | Film thickness (nm) | 50 | 50 | 50 | 50 | 50 |
|  | Noble metal oxide layer | Composition | PdO | PdO | PdO | PdO | PdO |
|  |  | Film thickness (nm) | 40 | 40 | 40 | 40 | 40 |
|  |  | Crystal structure | Polycrystalline PdO structure | Polycrystalline PdO structure | Polycrystalline PdO structure | Polycrystalline PdO structure | Polycrystalline PdO structure |
|  |  | Interface roughness (nm) | <2 nm | <4 nm | <2 nm | <2 nm | <3 nm |
|  |  | Specific resistance (Ωcm) | $8 \times 10^{-3}$ | $8 \times 10^{-3}$ | $8 \times 10^{-3}$ | $8 \times 10^{-3}$ | $8 \times 10^{-3}$ |
|  |  | Work function of noble metal oxide (eV) | 5.3 | 5.3 | 5.3 | 5.3 | 5.3 |
|  | Metal oxide semiconductor layer | Metal oxide semiconductor | InGaO (1:1) | InGaO (93:7) | InGaZnO (1:1:1) | InGaZnO (1:1:1) | InGaZnO (1:1:1) |
|  |  | Introduced gas during film formation | H$_2$O 1% | H$_2$O 1% | O2 10% | O2 10% | H$_2$O 1% |
|  |  | Film thickness (nm) | 200 | 200 | 200 | 50 | 200 |
|  |  | Crystal structure | Amorphous | Polycrystalline | Amorphous | Amorphous | Micro-crystalline |
|  |  | Orientation | Random orientation | Random orientation | Random orientation | Random orientation | C-axis orientation |
|  |  | Carrier concentration (cm$^{-3}$) | $1.4 \times 10^{13}$ | $1.4 \times 10^{17}$ | $1.3 \times 10^{12}$ | $5.4 \times 10^{12}$ | $2.3 \times 10^{14}$ |
|  |  | Mobility (cm$^2$/Vs) | 8.5 | 20 | 5 | 5.7 | 8.4 |
|  |  | Specific resistance (Ωcm) | $5.6 \times 10^4$ | $2.2 \times 10^0$ | $6.2 \times 10^5$ | $1.8 \times 10^5$ | $2.4 \times 10^3$ |
|  |  | Bandgap (eV) | 3.2 | 3.5 | 3.2 | 3.2 | 3.3 |
|  | Ohmic electrode layer | Electrode configuration | Mo/Au | Mo/Au | Mo/Au | Mo/Au | Mo/Au |
|  |  | Film thickness (nm) | 150/500 | 150/500 | 150/500 | 150/500 | 150/500 |
|  | Depth of depletion region (nm) |  | 207 | 50 | 100 | 55 | 188 |
|  | Carbon concentration in Schottky interface (cm$^{-3}$) |  | $5 \times 10^{18}$ | $5 \times 10^{18}$ | $6 \times 10^{18}$ | $6 \times 10^{18}$ | $7 \times 10^{18}$ |
| Evaluation | Annealing temperature (° C.) |  | 300 | 300 | 300 | 300 | 450 |
|  | Schottky barrier height (eV) |  | 1 | 0.7 | 0.8 | 0.8 | 1 |
|  | Differential on-resistance (mΩcm$^2$) |  | $8 \times 10^{-5}$ | $3 \times 10^{-6}$ | $9 \times 10^{-5}$ | $5 \times 10^{-5}$ | $5 \times 10^{-5}$ |
|  | Withstand voltage (MV/cm) |  | 0.93 | 0.25 | 0.53 | 0.92 | 0.75 |
|  | Vatiation of withstand voltage (MV/cm) |  | 0.21 | 0.03 | 0.06 | 0.12 | 0.12 |
|  | Current density during applying reverse bias of 0.2 MV/cm (A/cm$^2$) |  | $4 \times 10^{-9}$ | $1 \times 10^{-6}$ | $2 \times 10^{-7}$ | $5 \times 10^{-7}$ | $3 \times 10^{-9}$ |
|  | Maximum current density during applying forward bias of 5 V (A/cm$^2$) |  | 8000 | 78000 | 8000 | 10000 | 10000 |
|  | Ideality factor of diode |  | 1.3 | 1.2 | 1.5 | 1.5 | 1.4 |

TABLE 9

|  |  |  | Example 41 | Example 42 | Example 43 | Example 44 | Example 45 |
|---|---|---|---|---|---|---|---|
| Element configuration | Support substrate | Material | Mono-crystalline Si (P doped) | Mono-crystalline Si (P doped) | Mono-crystalline Si (P doped) | Aluminum | Polysilicon |
|  |  | Electrical resistivity (mΩcm) | 1 | 1 | 1 | <0.01 | 10 |
|  |  | Film thickness (μm) | 250 | 250 | 250 | 50 | 1000 |
|  | Low-resistance base metal layer | Material | Ti | Ti | Ti | Ti | Ti |
|  |  | Thickness (nm) | 15 | 15 | 15 | 15 | 15 |
|  | Noble metal layer | Composition | Pd | Pd | Pd | Pd | Pd |
|  |  | Film thickness (nm) | 50 | 50 | 50 | 50 | 50 |
|  | Noble metal oxide layer | Composition | PdO | PdO | PdO | PdO | PdO |
|  |  | Film thickness (nm) | 40 | 40 | 40 | 40 | 40 |
|  |  | Crystal structure | Polycrystalline PdO structure | Polycrystalline PdO structure | Polycrystalline PdO structure | Polycrystalline PdO structure | Polycrystalline PdO structure |
|  |  | Interface roughness (nm) | <2 nm | <4 nm | <3 nm | <3 nm | <5 nm |
|  |  | Specific resistance (Ωcm) | $8 \times 10^{-3}$ | $8 \times 10^{-3}$ | $8 \times 10^{-3}$ | $8 \times 10^{-3}$ | $8 \times 10^{-3}$ |
|  |  | Work function of noble metal oxide (eV) | 5.3 | 5.3 | 5.3 | 5.3 | 5.3 |
|  | Metal oxide semiconductor layer | Metal oxide semiconductor | InGaZnO (1:1:1) | InGaZnO (1:1:1) | InGaZnO (1:1:1) | InGaZnO (1:1:1) | InGaZnO (1:1:1) |
|  |  | Introduced gas during film formation | $H_2O$ 1% | $H_2O$ 1% | $H_2O$ 1% | $H_2O$ 1% | $H_2O$ 1% |
|  |  | Film thickness (nm) | 200 | 200 | 200 | 200 | 200 |
|  |  | Crystal structure | Amorphous | Amorphous | Amorphous | Amorphous | Amorphous |
|  |  | Orientation | Random orientation | Random orientation | Random orientation | Random orientation | Random orientation |
|  |  | Carrier concentration ($cm^{-3}$) | $5.0 \times 10^{16}$ | $2.4 \times 10^{11}$ | $2.4 \times 10^{13}$ | $2.4 \times 10^{13}$ | $2.4 \times 10^{13}$ |
|  |  | Mobility ($cm^2/Vs$) | 10.3 | 4 | 9.2 | 9.2 | 9.2 |
|  |  | Specific resistance (Ωcm) | $1.2 \times 10^{1}$ | $5.0 \times 10^{6}$ | $2.4 \times 10^{4}$ | $2.4 \times 10^{4}$ | $2.4 \times 10^{4}$ |
|  |  | Bandgap (eV) | 3.2 | 3.4 | 3.3 | 3.3 | 3.3 |
|  | Ohmic electrode layer | Electrode configuration | Mo/Au | Mo/Au | Mo/Au | Mo/Au | Mo/Au |
|  |  | Film thickness (nm) | 150/500 | 150/500 | 150/500 | 150/500 | 150/500 |
|  | Depth of depletion region (nm) |  | 170 | 195 | 190 | 210 | 210 |
|  | Carbon concentration in Schottky interface ($cm^{-3}$) |  | $5 \times 10^{18}$ | $8 \times 10^{18}$ | $5 \times 10^{19}$ | $5 \times 10^{18}$ | $5 \times 10^{18}$ |
|  | Annealing temperature (° C.) |  | 200 | 550 | 300 | 300 | 300 |
|  | Schottky barrier height (eV) |  | 0.9 | 0.9 | 1 | 1.1 | 1 |
| Evaluation | Differential on-resistance (mΩcm²) |  | $1 \times 10^{-5}$ | $1 \times 10^{-4}$ | $3 \times 10^{-5}$ | $3 \times 10^{-5}$ | $3 \times 10^{-5}$ |
|  | Withstand voltage (MV/cm) |  | 0.69 | 1.10 | 0.82 | 0.91 | 0.80 |
|  | Vatiation of withstand voltage (MV/cm) |  | 0.13 | 0.26 | 0.40 | 0.26 | 0.33 |
|  | Current density during applying reverse bias of 0.2 MV/cm (A/cm²) |  | $2 \times 10^{-7}$ | $8 \times 10^{-8}$ | $2 \times 10^{-8}$ | $5 \times 10^{-9}$ | $5 \times 10^{-8}$ |
|  | Maximum current density during applying forward bias of 5 V (A/cm²) |  | 25000 | 5000 | 14000 | 15000 | 15000 |
|  | Ideality factor of diode |  | 1.1 | 1.3 | 1.2 | 1.2 | 1.2 |

TABLE 10

|  |  |  | Example 46 | Example 47 |
|---|---|---|---|---|
| Element configuration | Support substrate | Material | Non-alkali glass (EagleXG) | Polyimide |
|  |  | Electrical resistivity (mΩcm) | ∞ | ∞ |
|  |  | Film thickness (μm) | 700 | 50 |
|  | Low-resistance base metal layer | Material | Ti | Ti |
|  |  | Thickness (nm) | 15 | 15 |
|  | Noble metal layer | Composition | Pd | Pd |
|  |  | Film thickness (nm) | 50 | 50 |
|  | Noble metal oxide layer | Composition | PdO | PdO |
|  |  | Film thickness (nm) | 40 | 40 |
|  |  | Crystal structure | Polycrystalline PdO structure | Polycrystalline PdO structure |
|  |  | Interface roughness (nm) | <2 nm | <3 nm |
|  |  | Specific resistance (Ωcm) | $8 \times 10^{-3}$ | $8 \times 10^{-3}$ |
|  |  | Work function of noble metal oxide (eV) | 5.3 | 5.3 |

TABLE 10-continued

|  |  |  | Example 46 | Example 47 |
|---|---|---|---|---|
|  | Metal oxide semiconductor layer | Metal oxide semiconductor | InGaZnO(1:1:1) | InGaZnO(1:1:1) |
|  |  | Introduced gas during film formation | $H_2O$ 1% | $H_2O$ 1% |
|  |  | Film thickness (nm) | 200 | 200 |
|  |  | Crystal structure | Amorphous | Amorphous |
|  |  | Orientation | Random orientation | Random orientation |
|  |  | Carrier concentration ($cm^{-3}$) | $2.4 \times 10^{13}$ | $2.4 \times 10^{13}$ |
|  |  | Mobility ($cm^2/Vs$) | 9.2 | 9.2 |
|  |  | Specific resistance ($\Omega cm$) | $2.4 \times 10^4$ | $2.4 \times 10^4$ |
|  |  | Bandgap (eV) | 3.3 | 3.3 |
|  | Ohmic electrode layer | Electrode configuration | Mo/Au | Mo/Au |
|  |  | Film thickness (nm) | 150/500 | 150/500 |
|  | Depth of depletion region (nm) |  | 210 | 210 |
|  | Carbon concentration in Schottky interface ($cm^{-3}$) |  | $5 \times 10^{18}$ | $5 \times 10^{18}$ |
|  | Annealing temperature (° C.) |  | 300 | 300 |
|  | Schottky barrier height (eV) |  | 1.2 | 1.1 |
| Evaluation | Differential on-resistance ($m\Omega cm^2$) |  | $3 \times 10^{-5}$ | $3 \times 10^{-5}$ |
|  | Withstand voltage (MV/cm) |  | 0.98 | 0.95 |
|  | Vatiation of withstand voltage (MV/cm) |  | 0.15 | 0.21 |
|  | Current density during applying reverse bias of 0.2 MV/cm ($A/cm^2$) |  | $1 \times 10^{-10}$ | $2 \times 10^{-9}$ |
|  | Maximum current density during applying forward bias of 5 V ($A/cm^2$) |  | 15000 | 15000 |
|  | Ideality factor of diode |  | 1.2 | 1.2 |

TABLE 11

|  |  |  | Comparative Example 1 | Comparative Example 2 | Comparative Example 3 |
|---|---|---|---|---|---|
| Element configuration | Support substrate | Material | Mono-crystalline Si (P doped) | Mono-crystalline Si (P doped) | Mono-crystalline Si (P doped) |
|  |  | Electrical resistivity ($m\Omega cm$) | 1 | 1 | 1 |
|  |  | Film thickness (μm) | 250 | 250 | 250 |
|  | Low-resistance base metal layer | Material | — | Ti | Ti |
|  |  | Thickness (nm) | — | 15 | 15 |
|  | Noble metal layer | Composition | — | — | Pd |
|  |  | Film thickness (nm) | — | — | 10 |
|  | Noble metal oxide layer | Composition | — | — | — |
|  |  | Film thickness (nm) | — | — | — |
|  |  | Crystal structure | — | — | — |
|  |  | Interface roughness (nm) | — | — | — |
|  |  | Specific resistance ($\Omega cm$) | — | — | — |
|  |  | Work function of noble metal oxide (eV) | — | — | — |
|  | Metal oxide semiconductor layer | Metal oxide semiconductor | InGaZnO (1:1:1) | InGaZnO (1:1:1) | InGaZnO (1:1:1) |
|  |  | Introduced gas during film formation | $H_2O$ 1% | $H_2O$ 1% | $H_2O$ 1% |
|  |  | Film thickness (nm) | 200 | 200 | 200 |
|  |  | Crystal structure | Amorphous | Amorphous | Amorphous |
|  |  | Orientation | Random orientation | Random orientation | Random orientation |
|  |  | Carrier concentration ($cm^{-3}$) | $2.4 \times 10^{13}$ | $2.4 \times 10^{13}$ | $2.4 \times 10^{13}$ |
|  |  | Mobility ($cm^2/Vs$) | 9.2 | 9.2 | 9.2 |
|  |  | Specific resistance ($\Omega cm$) | $2.4 \times 10^4$ | $2.4 \times 10^4$ | $2.4 \times 10^4$ |
|  |  | Bandgap (eV) | 3.8 | 3.8 | 3.8 |
|  | Ohmic electrode layer | Electrode configuration | Mo/Au | Mo/Au | Mo/Au |
|  |  | Film thickness (nm) | 150/500 | 150/500 | 150/500 |
|  | Depth of depletion region (nm) |  | 10 | 10 | 50 |
|  | Carbon concentration in Schottky interface ($cm^{-3}$) |  | $1 \times 10^{20}$ | $1 \times 10^{21}$ | $2 \times 10^{18}$ |
|  | Annealing temperature (° C.) |  | 300 | 300 | 300 |
|  | Schottky barrier height (eV) |  | 0.4 | 0.45 | 0.6 |
| Evaluation | Differential on-resistance ($m\Omega cm^2$) |  | $1 \times 10^{-4}$ | $1 \times 10^{-5}$ | $8 \times 10^{-6}$ |
|  | Withstand voltage (MV/cm) |  | 0.15 | 0.21 | 0.25 |
|  | Vatiation of withstand voltage (MV/cm) |  | 0.02 | 0.06 | 0.03 |
|  | Current density during applying reverse bias of |  | $5 \times 10^{+2}$ | $5 \times 10^{+1}$ | $2 \times 10^{+1}$ |

TABLE 11-continued

|  |  |  |  |  |  |
|---|---|---|---|---|---|
|  | 0.2 MV/cm (A/cm$^2$) |  |  |  |  |
|  | Maximum current density applying forward bias of 5 V (A/cm$^2$) | 1000 | 50000 | 60000 |  |
|  | Ideality factor of diode | 3 | 1.8 | 1.3 |  |

|  |  |  | Comparative Example 4 | Comparative Example 5 | Comparative Example 6 |
|---|---|---|---|---|---|
| Element configuration | Support substrate | Material | Mono-crystalline Si (P doped) | Mono-crystalline Si (P doped) | Mono-crystalline Si (P doped) |
|  |  | Electrical resistivity (mΩcm) | 1 | 1 | 1 |
|  |  | Film thickness (μm) | 250 | 250 | 250 |
|  | Low-resistance base metal layer | Material | Ti | — | — |
|  |  | Thickness (nm) | 15 | — | — |
|  | Noble metal layer | Composition | Pd | — | — |
|  |  | Film thickness (nm) | 10 | — | — |
|  | Noble metal oxide layer | Composition | PdO | PdO | RuO$_2$ |
|  |  | Film thickness (nm) | 5 | 5 | 5 |
|  |  | Crystal structure | Poly-crystalline PdO structure | Poly-crystalline PdO structure | Poly-crystalline rutile structure |
|  |  | Interface roughness (nm) | <2 nm | <2 nm | <4 nm |
|  |  | Specific resistance (Ωcm) | $1 \times 10^{-2}$ | $5 \times 10^{-4}$ | $2 \times 10^{-2}$ |
|  |  | Work function of noble metal oxide (eV) | 4.9 | 4.9 | 4.9 |
|  | Metal oxide semiconductor layer | Metal oxide semiconductor | InGaZnO (1:1:1) | InGaZnO (1:1:1) | InGaZnO (1:1:1) |
|  |  | Introduced gas during film formation | H$_2$O 1% | H$_2$O 1% | H$_2$O 1% |
|  |  | Film thickness (nm) | 200 | 200 | 200 |
|  |  | Crystal structure Orientation | Amorphous Random orientation | Amorphous Random orientation | Amorphous Random orientation |
|  |  | Carrier concentration (cm$^{-3}$) | $2.4 \times 10^{13}$ | $2.4 \times 10^{13}$ | $2.4 \times 10^{13}$ |
|  |  | Mobility (cm$^2$/Vs) | 9.2 | 9.2 | 9.2 |
|  |  | Specific resistance (Ωcm) | $2.4 \times 10^4$ | $2.4 \times 10^4$ | $2.4 \times 10^4$ |
|  |  | Bandgap (eV) | 3.8 | 3.8 | 3.8 |
|  | Ohmic electrode layer | Electrode configuration | Mo/Au | Mo/Au | Mo/Au |
|  |  | Film thickness (nm) | 150/500 | 150/500 | 150/500 |
|  | Depth of depletion region (nm) |  | 50 | 50 | 50 |
|  | Carbon concentration in Schottky interface (cm$^{-3}$) |  | $2 \times 10^{18}$ | $2 \times 10^{18}$ | $2 \times 10^{18}$ |
|  | Annealing temperature (° C.) |  | 300 | 300 | 300 |
|  | Schottky barrier height (eV) |  | 0.65 | 0.65 | 0.65 |
| Evaluation | Differential on-resistance (mΩcm$^2$) |  | $9 \times 10^{-6}$ | $9 \times 10^{-6}$ | $9 \times 10^{-6}$ |
|  | Withstand voltage (MV/cm) |  | 0.30 | 0.30 | 0.30 |
|  | Vatiation of withstand voltage (MV/cm) |  | 0.10 | 0.10 | 0.10 |
|  | Current density during applying reverse bias of 0.2 MV/cm (A/cm$^2$) |  | $1 \times 10^{+1}$ | $1 \times 10^{+1}$ | $1 \times 10^{+1}$ |
|  | Maximum current density applying forward bias of 5 V (A/cm$^2$) |  | 50000 | 50000 | 50000 |
|  | Ideality factor of diode |  | 1.3 | 1.3 | 1.3 |

TABLE 12

|  |  |  | Comparative Example 7 | Comparative Example 8 | Comparative Example 9 |
|---|---|---|---|---|---|
| Element configuration | Support substrate | Material | Mono-crystalline Si (P doped) | Mono-crystalline Si (P doped) | Mono-crystalline Si (P doped) |
|  |  | Electrical resistivity (mΩcm) | 1 | 1 | 1 |
|  |  | Film thickness (μm) | 250 | 250 | 250 |
|  | Low-resistance base metal layer | Material | — | — | — |
|  |  | Thickness (nm) | — | — | — |
|  | Noble metal | Composition | — | — | — |

TABLE 12-continued

|  |  |  |  |  |  |
|---|---|---|---|---|---|
|  | layer | Film thickness (nm) | — | — | — |
|  | Noble metal oxide layer | Composition | $PtO_2$ | $IrO_2$ | $Ag_2O$ |
|  |  | Film thickness (nm) | 5 | 5 | 5 |
|  |  | Crystal structure | Poly-crystalline α-$PtO_2$ structure | Poly-crystalline rutile structure | Poly-crystalline $Cu_2O$ structure |
|  |  | Interface roughness (nm) | <3 nm | <3 nm | <3 nm |
|  |  | Specific resistance (Ωcm) | $2 \times 10^{-3}$ | $2 \times 10^{-1}$ | $2 \times 10^{-2}$ |
|  |  | Work function of noble metal oxide (eV) | 4.8 | 4.9 | 4.8 |
|  | Metal oxide semiconductor layer | Metal oxide semiconductor | InGaZnO (1:1:1) | InGaZnO (1:1:1) | InGaZnO (1:1:1) |
|  |  | Introduced gas during film formation | $H_2O$ 1% | $H_2O$ 1% | $H_2O$ 1% |
|  |  | Film thickness (nm) | 200 | 200 | 200 |
|  |  | Crystal structure | Amorphous | Amorphous | Amorphous |
|  |  | Orientation | Random orientation | Random orientation | Random orientation |
|  |  | Carrier concentration ($cm^{-3}$) | $2.4 \times 10^{13}$ | $2.4 \times 10^{13}$ | $2.4 \times 10^{13}$ |
|  |  | Mobility ($cm^2/Vs$) | 9.2 | 9.2 | 9.2 |
|  |  | Specific resistance (Ωcm) | $2.4 \times 10^4$ | $2.4 \times 10^4$ | $2.4 \times 10^4$ |
|  |  | Bandgap (eV) | 3.8 | 3.8 | 3.8 |
|  | Ohmic electrode layer | Electrode configuration | Mo/Au | Mo/Au | Mo/Au |
|  |  | Film thickness (nm) | 150/500 | 150/500 | 150/500 |
|  | Depth of depletion region (nm) |  | 50 | 50 | 50 |
|  | Carbon concentration in Schottky interface ($cm^{-3}$) |  | $2 \times 10^{18}$ | $2 \times 10^{18}$ | $2 \times 10^{18}$ |
|  | Annealing temperature (° C.) |  | 300 | 300 | 300 |
|  | Schottky barrier height (eV) |  | 0.65 | 0.65 | 0.65 |
| Evaluation | Differential on-resistance (mΩcm²) |  | $9 \times 10^{-6}$ | $9 \times 10^{-6}$ | $9 \times 10^{-6}$ |
|  | Withstand voltage (MV/cm) |  | 0.30 | 0.30 | 0.30 |
|  | Vatiation of withstand voltage (MV/cm) |  | 0.10 | 0.10 | 0.10 |
|  | Current density during applying reverse bias of 0.2 MV/cm (A/cm²) |  | $1 \times 10^{+1}$ | $1 \times 10^{+1}$ | $1 \times 10^{+1}$ |
|  | Maximum current density during applying forward bias of 5 V (A/cm²) |  | 50000 | 50000 | 50000 |
|  | Ideality factor of diode |  | 1.3 | 1.3 | 1.3 |

|  |  |  | Comparative Example 10 | Comparative Example 11 | Comparative Example 12 |
|---|---|---|---|---|---|
| Element configuration | Support substrate | Material | Mono-crystalline Si (P doped) | Mono-crystalline Si (P doped) | Mono-crystalline Si (P doped) |
|  |  | Electrical resistivity (mΩcm) | 1 | 1 | 1 |
|  |  | Film thickness (μm) | 250 | 250 | 250 |
|  | Low-resistance base metal layer | Material | — | — | — |
|  |  | Thickness (nm) | — | — | — |
|  | Noble metal layer | Composition | — | — | — |
|  |  | Film thickness (nm) | — | — | — |
|  | Noble metal oxide layer | Composition | $ReO_3$ | $OsO_2$ | $Rh_2O_3$ |
|  |  | Film thickness (nm) | 5 | 5 | 5 |
|  |  | Crystal structure | Poly-crystalline skutterudite structure | Poly-crystalline rutile structure | Poly-crystalline corundum structure |
|  |  | Interface roughness (nm) | <3 nm | <3 nm | <3 nm |
|  |  | Specific resistance (Ωcm) | $2 \times 10^{-1}$ | $5 \times 10^{-3}$ | $4 \times 10^{-1}$ |
|  |  | Work function of noble metal oxide (eV) | 4.9 | 4.8 | 4.9 |
|  | Metal oxide semiconductor layer | Metal oxide semiconductor | InGaZnO (1:1:1) | InGaZnO (1:1:1) | InGaZnO (1:1:1) |
|  |  | Introduced gas during film formation | $H_2O$ 1% | $H_2O$ 1% | $H_2O$ 1% |
|  |  | Film thickness (nm) | 200 | 200 | 200 |
|  |  | Crystal structure | Amorphous | Amorphous | Amorphous |
|  |  | Orientation | Random orientation | Random orientation | Random orientation |

TABLE 12-continued

|  |  |  |  |  |  |
|---|---|---|---|---|---|
|  |  | Carrier concentration (cm$^{-3}$) | $2.4 \times 10^{13}$ | $2.4 \times 10^{13}$ | $2.4 \times 10^{13}$ |
|  |  | Mobility (cm$^2$/Vs) | 9.2 | 9.2 | 9.2 |
|  |  | Specific resistance (Ωcm) | $2.4 \times 10^4$ | $2.4 \times 10^4$ | $2.4 \times 10^4$ |
|  |  | Bandgap (eV) | 3.8 | 3.8 | 3.8 |
|  | Ohmic electrode layer | Electrode configuration | Mo/Au | Mo/Au | Mo/Au |
|  |  | Film thickness (nm) | 150/500 | 150/500 | 150/500 |
|  | Depth of depletion region (nm) |  | 50 | 50 | 50 |
|  | Carbon concentration in Schottky interface (cm$^{-3}$) |  | $2 \times 10^{18}$ | $2 \times 10^{18}$ | $2 \times 10^{18}$ |
|  | Annealing temperature (° C.) |  | 300 | 300 | 300 |
|  | Schottky barrier height (eV) |  | 0.65 | 0.65 | 0.65 |
| Evaluation | Differential on-resistance (mΩcm$^2$) |  | $9 \times 10^{-6}$ | $9 \times 10^{-6}$ | $9 \times 10^{-6}$ |
|  | Withstand voltage (MV/cm) |  | 0.30 | 0.30 | 0.30 |
|  | Vatiation of withstand voltage (MV/cm) |  | 0.10 | 0.10 | 0.10 |
|  | Current density during applying reverse bias of 0.2 MV/cm (A/cm$^2$) |  | $1 \times 10^{+1}$ | $1 \times 10^{+1}$ | $1 \times 10^{+1}$ |
|  | Maximum current density during applying forward bias of 5 V (A/cm$^2$) |  | 50000 | 50000 | 50000 |
|  | Ideality factor of diode |  | 1.3 | 1.3 | 1.3 |

TABLE 13

|  |  |  | Comparative Example 13 | Comparative Example 14 |
|---|---|---|---|---|
| Element configuration | Support substrate | Material | Monocrystalline Si (P doped) | Monocrystalline Si (P doped) |
|  |  | Electrical resistivity (mΩcm) | 1 | 1 |
|  |  | Film thickness (μm) | 250 | 250 |
|  | Low-resistance base metal layer | Material | — | — |
|  |  | Thickness (nm) | — | — |
|  | Noble metal layer | Composition | — | — |
|  |  | Film thickness (nm) | — | — |
|  | Noble metal oxide layer | Composition | NiO | Au$_2$O$_3$ |
|  |  | Film thickness (nm) | 5 | 5 |
|  |  | Crystal structure | Polycrystalline NiO structure | Polycrystalline Au$_2$O$_3$ structure |
|  |  | Interface roughness (nm) | <3 nm | <1 nm |
|  |  | Specific resistance (Ωcm) | $1 \times 10^{-1}$ | $2 \times 10^{-4}$ |
|  |  | Work function of noble metal oxide (eV) | 4.8 | 4.8 |
|  | Metal oxide semiconductor layer | Metal oxide semiconductor | InGaZnO(1:1:1) | InGaZnO(1:1:1) |
|  |  | Introduced gas during film formation | H$_2$O 1% | H$_2$O 1% |
|  |  | Film thickness (nm) | 200 | 200 |
|  |  | Crystal structure | Amorphous | Amorphous |
|  |  | Orientation | Random orientation | Random orientation |
|  |  | Carrier concentration (cm$^{-3}$) | $2.4 \times 10^{13}$ | $2.4 \times 10^{13}$ |
|  |  | Mobility (cm$^2$/Vs) | 9.2 | 9.2 |
|  |  | Specific resistance (Ωcm) | $2.4 \times 10^4$ | $2.4 \times 10^4$ |
|  |  | Bandgap (eV) | 3.8 | 3.8 |
|  | Ohmic electrode layer | Electrode configuration | Mo/Au | Mo/Au |
|  |  | Film thickness (nm) | 150/500 | 150/500 |
|  | Depth of depletion region (nm) |  | 50 | 50 |
|  | Carbon concentration in Schottky interface (cm$^{-3}$) |  | $2 \times 10^{18}$ | $2 \times 10^{18}$ |
|  | Annealing temperature (° C.) |  | 300 | 150 |
|  | Schottky barrier height (eV) |  | 0.65 | 0.65 |
| Evaluation | Differential on-resistance (mΩcm$^2$) |  | $9 \times 10^{-6}$ | $9 \times 10^{-6}$ |
|  | Withstand voltage (MV/cm) |  | 0.30 | 0.30 |
|  | Vatiation of withstand voltage (MV/cm) |  | 0.10 | 0.10 |
|  | Current density during applying reverse bias of 0.2 MV/cm (A/cm$^2$) |  | $1 \times 10^{+1}$ | $1 \times 10^{+1}$ |
|  | Maximum current density during applying forward bias of 5 V (A/cm$^2$) |  | 50000 | 50000 |
|  | Ideality factor of diode |  | 1.3 | 1.3 |

Example 48

An n-type Si substrate having resistivity of 1 mΩ·cm (diameter: 4 inches, P doped) was mounted onto CS-200, and an atmosphere was vacuumed. It should be noted that a film of Ti was formed at a thickness of 100 nm as an extraction electrode for measurement on a rear surface thereof. Film forming conditions were set to: DC 300 W, 0.5 Pa, for 700 seconds under an Ar atmosphere by using CS-200.

A film of Mo was formed at a thickness of 15 nm as an ohmic electrode layer. Film forming conditions were set to: DC 100 W, and 0.5 Pa under an Ar atmosphere.

Subsequently, as a metal oxide semiconductor layer, a film of metal oxide semiconductor InGaZnO(1:1:1) was formed at a thickness of 200 nm. Film forming conditions were set to: DC 300 W, 0.5 Pa, for 780 seconds under a mixed gas atmosphere of Ar 99% and $H_2O$ 1%.

Film formation from the ohmic electrode layer to the metal oxide semiconductor layer was performed by using 4 inch targets set to CS-200, mounting the n-type Si substrate thereonto, and vacuuming the atmosphere, and then a film was consistently formed without extracting the substrate.

Next, the substrate was mounted thereonto so as to be patterned into an electrode size having a diameter of 500 μm by using a metal mask, an atmosphere was vacuumed, and then films of a noble metal oxide layer, a noble metal layer, and a low-resistance base metal layer were formed consistently without extracting the substrate.

A film of PdO was formed at a thickness of 40 nm as the noble metal oxide layer. Film forming conditions were set to: DC 300 W, 0.5 Pa, for 270 seconds under an $O_2$ atmosphere.

Subsequently, a film of Pd was formed at a thickness of 50 nm as the noble metal layer. Film forming conditions were set to: DC 300 W, 0.5 Pa, for 60 seconds under an Ar atmosphere.

A film of Al was formed at a thickness of 1000 nm as the low-resistance base metal layer. Film forming conditions were set to: DC 300 W, 0.5 Pa, for 6000 seconds under an Ar atmosphere.

After the film formation, the substrate was extracted, and the substrate was annealed for one hour under conditions of 300° C. in air in an electric furnace to obtain an element (structure).

The element obtained was evaluated in the same manner as in Example 1. The results are shown in Table 14.

Examples 49 to 51

An element was prepared and evaluated in the same manner as in Example 48 by applying conditions shown in Table 14. The results are shown in Table 14.

In Tables, a layer having no film thickness description represents that the layer was not laminated.

In Tables, for an electrode configuration of the ohmic electrode layer, "In/Mo" indicates that Mo was formed as a first ohmic electrode layer, and In was formed as a second ohmic electrode layer, and two layers were laminated. Film forming conditions were set to: DC 100 W, and 0.5 Pa under an Ar atmosphere for both In and Mo. The film of In was formed to be an upper layer so as to be brought into contact with the metal oxide semiconductor.

In Tables, non-alkali glass is an EagleXG substrate (diameter: 4 inches) (made by Corning Incorporated) having electrical resistivity of ∞ mΩ·cm.

It was confirmed on the elements in Examples 48 to 51 that an average crystalline particle diameter of the noble metal oxide layer is equal to or less than a film thickness of the noble metal oxide layer upon measuring the film thickness of each layer on the cross sectional TEM.

Moreover, the effective area A ($cm^2$) of the electrode in the CV measurement represents, when viewed from the direction perpendicular to the laminated surface of the element, an area of the overlapped part of the noble metal oxide layer, the metal oxide semiconductor layer, and the ohmic electrode layer. An area of the noble metal oxide layer having a diameter of 500 μm was taken as A.

TABLE 14

| | | | Example 48 | Example 49 | Example 50 | Example 51 |
|---|---|---|---|---|---|---|
| Element configuration | Support substrate | Material | Mono-crystalline Si (P doped) | Mono-crystalline Si (P doped) | Mono-crystalline Si (P doped) | Non-alkali glass (EagleXG) |
| | | Electrical resistivity (mΩcm) | 1 | 1 | 1 | ∞ |
| | | Film thickness (μm) | 250 | 250 | 250 | 700 |
| | Ohmic electrode layer | Electrode configuration | Mo | In/Mo | — | In/Mo |
| | | Film thickness (nm) | 15 | 5/15 | — | 5/150 |
| | Metal oxide semiconductor layer | Metal oxide semiconductor | InGaZnO (1:1:1) | InGaZnO (1:1:1) | InGaZnO (1:1:1) | InGaZnO (1:1:1) |
| | | Introduced gas during film formation | $H_2O$ 1% | $H_2O$ 1% | $H_2O$ 1% | $H_2O$ 1% |
| | | Film thickness (nm) | 200 | 200 | 200 | 200 |
| | | Crystal structure | Amorphous | Amorphous | Amorphous | Amorphous |
| | | Orientation | Random orientation | Random orientation | Random orientation | Random orientation |
| | | Carrier concentration ($cm^{-3}$) | $2.4 \times 10^{13}$ | $2.4 \times 10^{13}$ | $2.4 \times 10^{13}$ | $2.4 \times 10^{13}$ |
| | | Mobility ($cm^2$/Vs) | 9.2 | 9.2 | 9.2 | 9.2 |
| | | Specific resistance (Ωcm) | $2.4 \times 10^4$ | $2.4 \times 10^4$ | $2.4 \times 10^4$ | $2.4 \times 10^4$ |
| | | Bandgap (eV) | 3.3 | 3.3 | 3.3 | 3.3 |
| | Noble metal oxide layer | Composition | PdO | PdO | PdO | PdO |
| | | Film thickness (nm) | 40 | 40 | 40 | 40 |
| | | Crystal structure | Polycrystalline PdO structure | Polycrystalline PdO structure | Polycrystalline PdO structure | Polycrystalline PdO structure |
| | | Interface roughness (nm) | <2 nm | <2 nm | <2 nm | <2 nm |

TABLE 14-continued

| | | Example 48 | Example 49 | Example 50 | Example 51 |
|---|---|---|---|---|---|
| | Specific resistance (Ωcm) | $8 \times 10^{-3}$ | $8 \times 10^{-3}$ | $8 \times 10^{-3}$ | $8 \times 10^{-3}$ |
| | Work function of noble metal oxide (eV) | 5.3 | 5.3 | 5.3 | 5.3 |
| Noble metal layer | Composition | Pd | Pd | Pd | Pd |
| | Film thickness (nm) | 50 | 50 | 50 | 50 |
| Low-resistance base metal layer | Material | Al | Al | Al | Au |
| | Thickness (nm) | 1000 | 1000 | 1000 | 500 |
| | Depth of depletion region (nm) | 210 | 210 | 210 | 210 |
| | Carbon concentration in Schottky interface (cm$^{-3}$) | $5 \times 10^{19}$ | $5 \times 10^{19}$ | $5 \times 10^{19}$ | $1 \times 10^{20}$ |
| | Annealing temperature (° C.) | 300 | 300 | 300 | 300 |
| | Schottky barrier height (eV) | 0.9 | 0.8 | 1 | 0.8 |
| Evaluation | Differential on-resistance (mΩcm$^2$) | $1 \times 10^{-3}$ | $1 \times 10^{-4}$ | $3 \times 10^{-5}$ | $1 \times 10^{-4}$ |
| | Withstand voltage (MV/cm) | 1.10 | 0.95 | 1.20 | 0.90 |
| | Variation of withstand voltage (MV/cm) | 0.30 | 0.15 | 0.35 | 0.11 |
| | Current density during applying reverse bias of 0.2 MV/cm (A/cm$^2$) | $2 \times 10^{-7}$ | $3 \times 10^{-7}$ | $5 \times 10^{-8}$ | $2 \times 10^{-7}$ |
| | Maximum current density during applying forward bias of 5 V (A/cm$^2$) | 300 | 4000 | 1 | 3500 |
| | Ideality factor of diode | 1.5 | 1.4 | 1.7 | 1.4 |

Example 52

An element was formed on a glass substrate (4 inch Eagle XG substrate) using a photomask. Film forming conditions of each layer were the same as the conditions in Example 1.

First, on one surface of the glass substrate, Mo as a low-resistance base metal layer and Pd as a noble metal layer were sputtered at thicknesses of 150 nm and 50 nm, respectively. Next, a Mo/Pd laminated film was subjected to patterning by using a photomask 1. The surface was exposed through the photomask 1 by using AZ1500 (made by AZ Electronic Materials plc) as a photoresist, and then was developed with tetramethylammonium hydroxide (TMAH), Pd was subjected to first patterning with AURUM-302 (made by Kanto Kagaku Co., Ltd), and when Mo was exposed, Mo was subjected to second patterning with a PAN (mixed acid of phosphoric acid-acetic acid-nitric acid) etchant to form a lower layer electrode.

Subsequently, PdO as a noble metal oxide layer and InGaZnO(1:1:1) as a metal oxide semiconductor layer were subjected to patterning by using an image reversal resist AZ5214 (made by AZ Electronic Materials plc) and a photomask 2 according to a lift-off process. AZ5214 was exposed through the photomask 2, and wholly exposed after a reverse bake process, and developed with TMAH. A 40 nm-thick film of PdO and a 200 nm-thick film of InGaZnO (1:1:1) were consistently formed on the substrate with the resist subjected to patterning. Then, PdO as the noble metal oxide layer and InGaZnO(1:1:1) as the metal oxide semiconductor layer were subjected to patterning by the lift-off process performed in acetone.

Next, an interlayer insulating film was subjected to patterning by using thermosetting non-photosensitive polyimide and a photomask 3.

First, a thermosetting non-photosensitive polyimide solution was coated on a whole surface of the substrate at a thickness of approximately 8 μm by using a spin coater, and subsequently subjected to patterning by using AZ5214 and the photomask 3. AZ5214 was exposed through the photomask 3, and wholly exposed after the reverse bake process, and was developed with TMAH. Subsequently, the thermosetting non-photosensitive polyimide was etched with TMAH, and subjected to patterning. After the patterning, the thermosetting non-photosensitive polyimide was heated in air at 200° C. for one hour and cured.

Subsequently, an ohmic electrode layer was subjected to patterning by using an image reversal resist AZ5214 and a photomask 4 according to the lift-off process. AZ5214 was exposed through the photomask 4, and wholly exposed after the reverse bake process, and developed with TMAH. On the substrate with the resist subjected to patterning, a 150 nm-thick film of Mo as a first ohmic electrode layer and a 500 nm-thick film of Au as a second ohmic electrode layer were consistently formed. Then, the film was subjected to the lift-off process in acetone to cause patterning of the ohmic electrode layer.

Elements having the structures shown in FIGS. 10A and 10B were obtained. Evaluation was performed in the same manner as in Example 1. The results are shown in Table 15.

Example 53

An element was prepared in the same manner as in Example 52 except that photomasks 5 to 8 having patterns different from the patterns in the photomasks 1 to 4 used in Example 52 were used to obtain elements having the structures shown in FIGS. 10C and 10D. Evaluation was performed in the same manner as in Example 1. The results are shown in Table 15.

Example 54

An element was prepared in the same manner as in Example 52 except that photomasks 9 to 12 having patterns different from the patterns in the photomasks 1 to 4 used in Example 52 were used to obtain elements having the structures shown in FIGS. 10E and 10F. Evaluation was performed in the same manner as in Example 1. The results are shown in Table 15.

It was confirmed on the elements in Examples 52 to 54 that an average crystalline particle diameter in the noble metal oxide layer is equal to or less than a film thickness of the noble metal oxide layer upon measuring the film thickness of each layer.

TABLE 15

|  |  |  | Example 52 | Example 53 | Example 54 |
|---|---|---|---|---|---|
| Element configuration | Support substrate | Material | Non-alkali glass (EagleXG) | Non-alkali glass (EagleXG) | Non-alkali glass (EagleXG) |
|  |  | Electrical resistivity (mΩcm) | ∞ | ∞ | ∞ |
|  |  | Film thickness (μm) | 700 | 700 | 700 |
|  | Low-resistance base metal layer | Material | Mo | Mo | Mo |
|  |  | Thickness (nm) | 150 | 150 | 150 |
|  | Noble metal layer | Composition | Pd | Pd | Pd |
|  |  | Film thickness (nm) | 50 | 50 | 50 |
|  | Noble metal oxide layer | Composition | PdO | PdO | PdO |
|  |  | Film thickness (nm) | 40 | 40 | 40 |
|  |  | Crystal structure | Polycrystalline PdO structure | Polycrystalline PdO structure | Polycrystalline PdO structure |
|  |  | Interface roughness (nm) | <2 nm | <2 nm | <2 nm |
|  |  | Specific resistance (Ωcm) | $8 \times 10^{-3}$ | $8 \times 10^{-3}$ | $8 \times 10^{-3}$ |
|  |  | Work function of noble metal oxide (eV) | 5.3 | 5.3 | 5.3 |
|  | Metal oxide semiconductor layer | Metal oxide semiconductor | InGaZnO(1:1:1) | InGaZnO(1:1:1) | InGaZnO(1:1:1) |
|  |  | Introduced gas during film formation | $H_2O$ 1% | $H_2O$ 1% | $H_2O$ 1% |
|  |  | Film thickness (nm) | 200 | 200 | 200 |
|  |  | Crystal structure | Amorphous | Amorphous | Amorphous |
|  |  | Orientation | Random orientation | Random orientation | Random orientation |
|  |  | Carrier concentration ($cm^{-3}$) | $2.4 \times 10^{13}$ | $2.4 \times 10^{13}$ | $2.4 \times 10^{13}$ |
|  |  | Mobility ($cm^2/Vs$) | 9.2 | 9.2 | 9.2 |
|  |  | Specific resistance (Ωcm) | $2.4 \times 10^4$ | $2.4 \times 10^4$ | $2.4 \times 10^4$ |
|  |  | Bandgap (eV) | 3.3 | 3.3 | 3.3 |
|  | Ohmic electrode layer | Electrode configuration | Mo/Au | Mo/Au | Mo/Au |
|  |  | Film thickness (nm) | 150/500 | 150/500 | 150/500 |
|  | Depth of depletion region (nm) |  | 210 | 210 | 210 |
|  | Carbon concentration in Schottky interface ($cm^{-3}$) |  | $5 \times 10^{18}$ | $5 \times 10^{18}$ | $5 \times 10^{18}$ |
|  | Annealing temperature (° C.) |  | 300 | 300 | 300 |
|  | Schottky barrier height (eV) |  | 1.2 | 1.2 | 1.2 |
| Evaluation | Differential on-resistance ($mΩcm^2$) |  | $3 \times 10^{-5}$ | $3 \times 10^{-5}$ | $3 \times 10^{-5}$ |
|  | Withstand voltage (MV/cm) |  | 1.15 | 0.98 | 0.94 |
|  | Vatiation of withstand voltage (MV/cm) |  | 0.15 | 0.11 | 0.15 |
|  | Current density during applying reverse bias of 0.2 MV/cm ($A/cm^2$) |  | $2 \times 10^{-10}$ | $2 \times 10^{-10}$ | $2 \times 10^{-10}$ |
|  | Maximum current density during applying forward bias of 5 V ($A/cm^2$) |  | 15000 | 15000 | 15000 |
|  | Ideality factor of diode |  | 1.2 | 1.2 | 1.2 |

INDUSTRIAL APPLICABILITY

A structure according to the invention can be utilized for a semiconductor element or the like. The semiconductor element according to the invention can be utilized for an electronic circuit, an electrical apparatus, an electronic apparatus, a vehicle, a power engine or the like.

Several embodiments and/or Examples of the invention have been described in detail above, but those skilled in the art will readily make a great number of modifications to the exemplary embodiments and/or Examples without substantially departing from new teachings and advantageous effects of the present invention. Accordingly, all such modifications are included within the scope of the invention.

The entire contents of the description of the Japanese application serving as a basis of claiming the priority concerning the present application to the Paris Convention are incorporated by reference herein.

The invention claimed is:

1. A structure, comprising:
a metal oxide semiconductor layer; and
a noble metal oxide layer,
wherein the metal oxide semiconductor layer and the noble metal oxide layer are adjacent to each other;
wherein the metal oxide in the metal oxide semiconductor layer comprises an oxide of one or more metal elements selected from the group consisting of In, Sn, Cd, Zn, Ga, and Ge, provided that the metal oxide is not a zinc oxide; and
a film thickness of the noble metal oxide layer is more than 10 nm.

2. The structure according to claim 1, comprising a depletion region.

3. The structure according to claim 1, wherein the noble metal oxide layer comprises a polycrystalline structure.

4. The structure according to claim 1, further comprising a noble metal layer adjacent to the noble metal oxide layer and on a side opposite to the metal oxide semiconductor layer.

5. The structure according to claim 4, further comprising a low-resistance base metal layer adjacent to the noble metal layer and on a side opposite to the noble metal oxide layer.

6. The structure according to claim 1, wherein noble metal oxide in the noble metal oxide layer is one or more selected from the group consisting of palladium oxide, ruthenium oxide, platinum oxide, iridium oxide, silver oxide, rhenium oxide, osmium oxide, rhodium oxide, nickel oxide, and gold oxide.

7. The structure according to claim 1, wherein noble metal oxide in the noble metal oxide layer is one or more selected from the group consisting of PdO having a PdO structure, $RuO_2$ having a rutile structure, $PtO_2$ having an $\alpha$-$PtO_2$ structure, $IrO_2$ having a rutile structure, $Ag_2O$ having a $Cu_2O$ structure, $ReO_3$ having a skutterudite structure, $OsO_2$ having a rutile structure, $Rh_2O_3$ having a corundum structure, NiO having a NiO structure, and $Au_2O_3$ having a $Au_2O_3$ structure.

8. The structure according to claim 1, wherein an average crystalline particle diameter of noble metal oxide in the noble metal oxide layer is equal to or less than a film thickness of the noble metal oxide layer.

9. The structure according to claim 1, wherein interface roughness of the noble metal oxide layer is 5 nm or less.

10. The structure according to claim 1, wherein a carbon concentration in a Schottky interface between the metal oxide semiconductor layer and the noble metal oxide layer is $2\times10^{19}$ cm$^{-3}$ or less.

11. The structure according to claim 1, wherein resistivity of the noble metal oxide layer is $1\times10^{-2}$ Ω·cm or less.

12. The structure according to claim 1, wherein a work function of noble metal oxide in the noble metal oxide layer is 4.8 eV or more.

13. The structure according to claim 1, wherein the metal oxide semiconductor layer is amorphous or polycrystalline.

14. The structure according to claim 1, wherein a content ratio of Ga or In in the metal oxide semiconductor layer is 45 atomic % or more based on total metal elements in the metal oxide semiconductor layer.

15. The structure according to claim 1, wherein the metal oxide semiconductor layer is randomly oriented.

16. The structure according to claim 1, wherein a Schottky barrier height between the noble metal oxide layer and the metal oxide semiconductor layer is 0.7 eV or more.

17. The structure according to claim 1, further comprising a substrate on a side of the noble metal oxide layer and opposite to the metal oxide semiconductor layer.

18. The structure according to claim 1, further comprising an ohmic electrode layer, wherein the ohmic electrode layer and the noble metal oxide layer are not in contact with each other.

19. The structure according to claim 1, wherein the metal oxide semiconductor layer is formed in one layer, or two or more layers, and any one layer of the metal oxide semiconductor layer is adjacent to the noble metal oxide layer when the metal oxide semiconductor layer is formed in two or more layers.

20. The structure according to claim 1, wherein withstand voltage when reverse voltage is applied is 0.5 MV/cm or more.

21. The structure according to claim 1, wherein current density is $1\times10^{-6}$ A/cm$^2$ or less when reverse bias of 0.2 MV/cm is applied.

22. The structure according to claim 1, wherein an ideality factor of a diode when forward bias is applied is 1.5 or less.

23. The structure according to claim 1, wherein current density reaches 1000 A/cm$^2$ at forward bias of 5 V or less.

24. A method for manufacturing a structure, wherein the metal oxide semiconductor layer is formed by sputtering in an atmosphere into which hydrogen or water is introduced to obtain the structure according to claim 1.

25. A method for manufacturing the structure, wherein a film of the noble metal oxide layer is formed by sputtering in an atmosphere in which 50% or more of a flow rate of an introduced gas is oxygen to obtain the structure according to claim 1.

26. The method for manufacturing the structure according to claim 24, wherein annealing is performed at 220 to 500° C. after the noble metal oxide layer and the metal oxide semiconductor layer are formed.

27. The method for manufacturing the structure according to claim 24,
wherein the noble metal oxide layer and the metal oxide semiconductor layer are continuously formed by sputtering, or
wherein vacuum or an inert atmosphere is provided between formation of the noble metal oxide layer and formation of the metal oxide semiconductor layer.

28. A semiconductor element comprising the structure according to claim 1.

29. The semiconductor element according to claim 28, which is a power semiconductor element, a diode element, a Schottky barrier diode element, an electrostatic discharge protection diode, a transient voltage protection diode, a light-emitting diode, a metal-semiconductor field-effect transistor, a junction field-effect transistor, a metal-oxide semiconductor field-effect transistor, a Schottky source/drain metal-oxide semiconductor field-effect transistor, an avalanche multiplication photoelectric conversion element, a solid state imaging element, or a solar cell element, an optical sensor element, a touch-sensor element, a display element, or resistive random access memory.

30. An electronic circuit comprising the semiconductor element according to claim 28.

31. An electrical apparatus, an electronic apparatus, a vehicle, or a power engine, comprising the electronic circuit according to claim 30.

\* \* \* \* \*